(12) United States Patent
Wang

(10) Patent No.: US 9,373,676 B2
(45) Date of Patent: Jun. 21, 2016

(54) SEMICONDUCTOR DEVICE AND METHOD FOR MANUFACTURING THE SAME

(71) Applicant: FUJITSU LIMITED FUJITSU SEMICONDUCTOR LIMITED, Yokohama-shi, Kanagawa (JP)

(72) Inventor: Wensheng Wang, Kawasaki (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 231 days.

(21) Appl. No.: 13/734,279

(22) Filed: Jan. 4, 2013

(65) Prior Publication Data
US 2013/0122679 A1    May 16, 2013

Related U.S. Application Data

(62) Division of application No. 11/898,374, filed on Sep. 11, 2007, now Pat. No. 8,373,212.

(30) Foreign Application Priority Data

Sep. 11, 2006  (JP) .................................. 2006-245496

(51) Int. Cl.
| H01L 21/20 | (2006.01) |
| H01L 49/02 | (2006.01) |
| H01L 27/115 | (2006.01) |

(52) U.S. Cl.
CPC .......... *H01L 28/40* (2013.01); *H01L 27/11502* (2013.01); *H01L 27/11507* (2013.01); *H01L 28/55* (2013.01)

(58) Field of Classification Search
CPC ................. H01L 27/11502; H01L 27/11507; H01L 28/40; H01L 28/55

USPC .......................................................... 438/381
See application file for complete search history.

(56) References Cited

U.S. PATENT DOCUMENTS

| 6,713,808 B2 | 3/2004 | Wang et al. |
| 6,803,617 B2 | 10/2004 | Baniecki et al. |

(Continued)

FOREIGN PATENT DOCUMENTS

| JP | 2001-345432 | 12/2001 |
| JP | 2003-92391 | 3/2003 |

(Continued)

OTHER PUBLICATIONS

Japanese Office Action for related Japanese Patent Application No. 2006-245496, mailed on May 10, 2011.

(Continued)

*Primary Examiner* — Vongsavanh Sengdara
(74) *Attorney, Agent, or Firm* — Staas & Halsey LLP

(57) ABSTRACT

The semiconductor device has an insulation layer formed over a semiconductor substrate, a conductor plug 46 buried in the insulation layer, a capacitor formed above the insulation layer and the conductor plug and including a lower electrode formed of the first conduction film and the second conduction film formed over the first conduction film and formed of Pt, Pt alloy, Pd or Pd alloy, a capacitor dielectric film formed of a ferroelectric or a high dielectric formed over the lower electrode and an upper electrode formed over the capacitor dielectric film, the capacitor dielectric film contains a first element of Pb or Bi, and the concentration peak of the first element diffused in the lower electrode from the capacitor dielectric film positioning in the interface between the first conduction film and the second conduction film.

11 Claims, 31 Drawing Sheets

(56) References Cited

U.S. PATENT DOCUMENTS

| | | |
|---|---|---|
| 6,933,156 B2 | 8/2005 | Wang et al. |
| 7,560,815 B1 | 7/2009 | Vaartstra et al. |
| 2003/0022454 A1* | 1/2003 | Wang .................. H01L 28/75 438/381 |
| 2003/0143853 A1 | 7/2003 | Celii et al. |
| 2004/0184218 A1* | 9/2004 | Wang .................. H01L 28/75 361/306.3 |

FOREIGN PATENT DOCUMENTS

| | | |
|---|---|---|
| JP | 2003-209179 | 7/2003 |
| JP | 2003-318371 | 11/2003 |
| JP | 2004-153006 | 5/2004 |
| JP | 2005-203591 | 7/2005 |

OTHER PUBLICATIONS

Notice of Allowance for U.S. Appl. No. 11/898,374, mailed on Oct. 4, 2012.

Office Action for U.S. Appl. No. 11/898,374, mailed on Apr. 16, 2009.

Office Action for U.S. Appl. No. 11/898,374, mailed on Jun. 22, 2009.

Office Action for U.S. Appl. No. 11/898,374, mailed on Dec. 17, 2009.

Office Action for U.S. Appl. No. 11/898,374, mailed on Apr. 25, 2012.

* cited by examiner

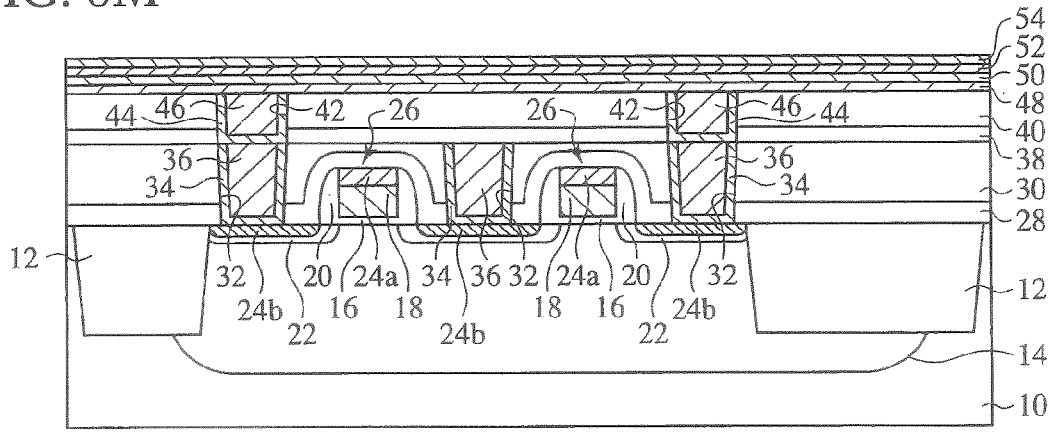

SEMICONDUCTOR DEVICE AND METHOD FOR MANUFACTURING THE SAME

CROSS REFERENCE TO RELATED APPLICATIONS

This application is a Divisional of U.S. patent application Ser. No. 11/898,374 filed on Sep. 11, 2007, which is based on and hereby claims priority to Japanese Application No. 2006-245496 filed on Sep. 11, 2006, the contents of which are hereby incorporated by reference.

BACKGROUND

The present invention relates to a semiconductor device and a method for manufacturing the same, more specifically, a semiconductor device including capacitors and a method for manufacturing the same.

Recently, it is noted to use a ferroelectric film as the dielectric film of capacitors. A FeRAM (Ferroelectric Random Access Memory) using such ferroelectric capacitors is a non-volatile memory having characteristics of high-speed operation, low power consumption, and good endurance of write/read operation, etc. FeRAM is expected to develop more.

In addition to FeRAM, it is proposed that a ferroelectric film or a high dielectric film be used for the dielectric film of DRAM capacitors for higher integration.

A proposed semiconductor device is explained with reference to FIG. 1. FIG. 1 is a cross-section diagram of the proposed semiconductor device.

As illustrated in FIG. 1, conductor plugs 146 are buried in an inter-layer insulation film 140. An adhesion layer 148 of, e.g., TiN is formed on the conductor plugs 146 and the inter-layer insulation film 140. An oxygen barrier film 150 of, e.g., TiAlN is formed on the adhesion layer 148. The oxygen barrier film 150 is for preventing the surfaces of the conductor plugs 146 from being oxidized. Lower electrodes 156 are formed on the oxygen barrier film 150. A capacitor dielectric film 162 of a ferroelectric or high dielectric is formed on the lower electrodes 156. Upper electrodes 170 are formed on the capacitor dielectric film 162. The lower electrodes 156, the capacitor dielectric film 162 and the upper electrodes 170 form capacitors 172.

The use of Pt as a material of the lower electrodes 156 is proposed. On the lower electrodes 156 of Pt, the capacitor dielectric film 162 of good crystallinity can be formed.

However, when the lower electrodes 156 are formed of Pt, the Pb or Bi contained in the capacitor dielectric film 162 passes through the lower electrodes 156 and arrives at the oxygen barrier film 150, because a Pt film does not have a function of barriering Pb or Bi. When the Pb or Bi contained in the capacitor dielectric film 162 arrives at the oxygen barrier film 150, the oxygen barrier film 150 reacts with the Pb or Bi, and the adhesion between the oxygen barrier film 150 and the lower electrodes 156 is impaired. Then, as shown in FIG. 2, the lower electrodes 156 are released from the oxygen barrier film 150, and the semiconductor device cannot have high reliability. FIG. 2 is a view of a microscopic picture of the lower electrodes released from the barrier film.

FIG. 2 was obtained by using an SEM (Scanning Electron Microscopy). Thus, when the lower electrodes 156 are formed of Pt, the lower electrodes 156 are released from the oxygen barrier film 150, and the semiconductor device cannot have capacitors of high reliability.

On the other hand, the use of Ir as a material of the lower electrodes 156 is proposed. Ir film, which has the function of barriering Pb or Bi, can prevent the arrival of the Pb or Bi contained in the capacitor dielectric film 162 at the oxygen barrier film 150 and can prevent the release of the lower electrodes 156 from the oxygen barrier film 150.

However, when the lower electrodes are formed of Ir film, it is difficult for the capacitor dielectric film can have good crystallinity.

SUMMARY

The present invention is directed to various embodiments of a semiconductor device and a method for manufacturing the semiconductor device having a lower electrode including a layer which barriers Pb or Bi.

BRIEF DESCRIPTION OF THE DRAWINGS

These and other objects and advantages will become more apparent and more readily appreciated from the following description of the preferred embodiments, taken in conjunction with the accompanying drawings of which.

DETAILED DESCRIPTION OF THE PREFERRED EMBODIMENT

Figure 1:
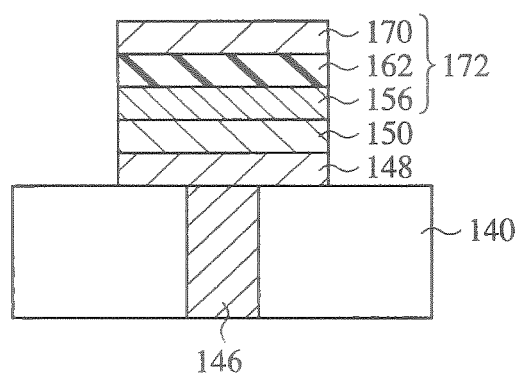
FIG. 1 is a cross-section diagram of the proposed semiconductor device.

Reference will now be made in detail to the preferred embodiments, examples of which are illustrated in the accompanying drawings, wherein like reference numerals refer to like elements throughout.

The use of Pt as a material of the lower electrodes 156 is proposed. On the lower electrodes 156 of Pt, the capacitor dielectric film 162 of good crystallinity can be formed.

Figure 2:
FIG. 2 is a view of a microscopic picture of the lower electrodes released from the barrier film.

However, when the lower electrodes 156 are formed of Pt, the Pb or Bi contained in the capacitor dielectric film 162 passes through the lower electrodes 156 and arrives at the oxygen barrier film 150, because a Pt film is not a barrier for Pb or Bi. When the Pb or Bi contained in the capacitor dielectric film 162 arrives at the oxygen barrier film 150, the oxygen barrier film 150 reacts with the Pb or Bi, and the adhesion between the oxygen barrier film 150 and the lower electrodes 156 is impaired. Then, as shown in FIG. 2, the lower electrodes 156 are released from the oxygen barrier film 150, and the semiconductor device cannot have high reliability. FIG. 2 is a view of a microscopic picture of the lower electrodes released from the barrier film.

FIG. 2 was obtained by using an SEM (Scanning Electron Microscopy). Thus, when the lower electrodes 156 are formed of Pt, the lower electrodes 156 are released from the oxygen barrier film 150, and the semiconductor device cannot have capacitors of high reliability.

On the other hand, the use of Ir as a material of the lower electrodes 156 is proposed. Ir film, which has the function of barriering Pb or Bi, can prevent the arrival of the Pb or Bi contained in the capacitor dielectric film 162 at the oxygen barrier film 150 and can prevent the release of the lower electrodes 156 from the oxygen barrier film 150.

Figure 3:
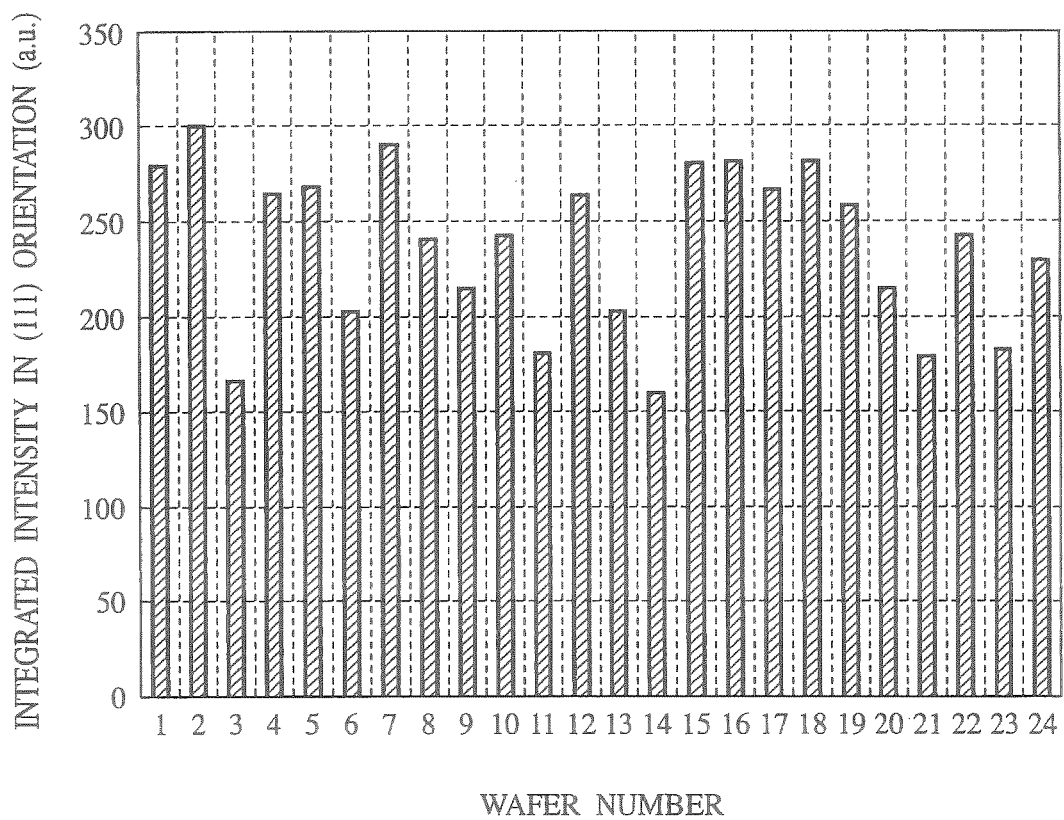
FIG. 3 is a graph of the integrated intensity of the (111) orientation of the capacitor dielectric film which is formed of PZT on the lower electrodes of Ir.

FIG. 3 is a graph of the integrated intensity of the (111) orientation of the capacitor dielectric film which is formed of PZT on the lower electrodes of Ir. The wafer numbers for 24 different wafers are taken on the horizontal axis, and on the vertical axis, the integrated intensity of the (111) orientation. As shown in FIG. 3, the integrated intensity of the (111) orientation largely varies for the wafers.

Figure 4:
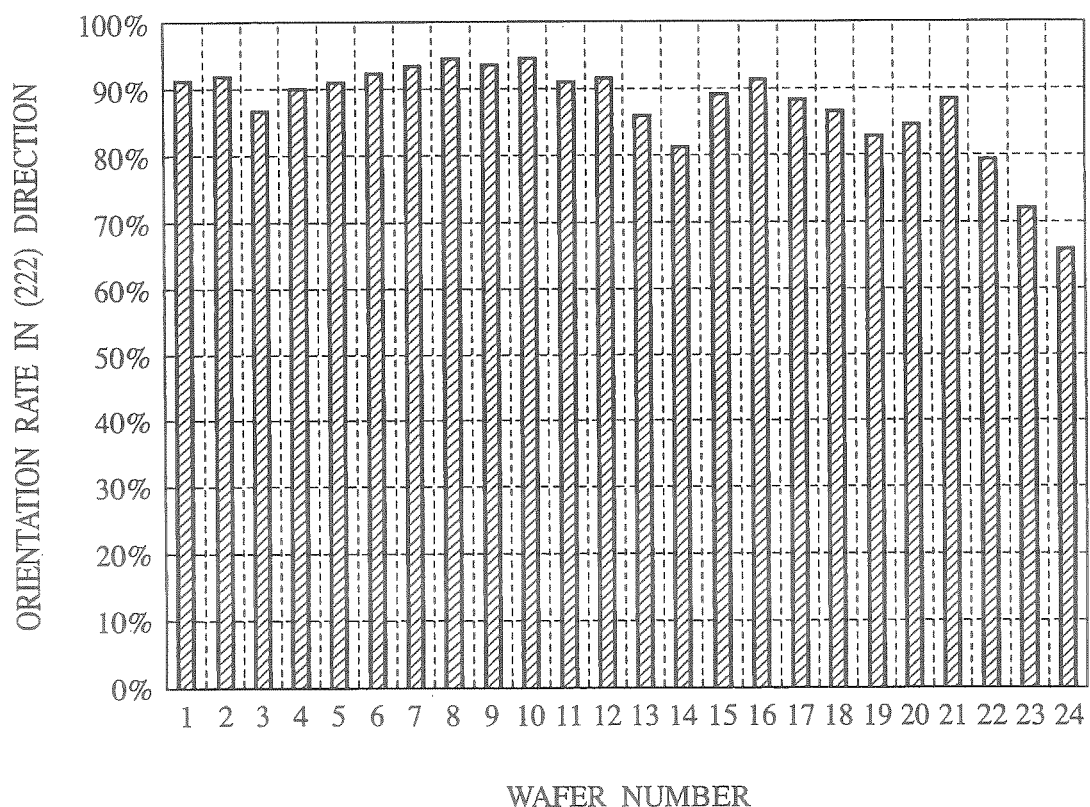
FIG. 4 is a graph of the orientation rate in (222) direction of the capacitor dielectric film which is formed of PZT on the lower electrodes of Ir.

FIG. 4 is a graph of the orientation rate in (222) direction of the capacitor dielectric film which is formed of PZT on the lower electrodes of Ir. The wafer numbers are taken on the horizontal axis, and on the vertical axis, the orientation rate in (222) direction is taken. The orientation rate in (222) direction is a ratio of (222) orientation to the total of the (100) orientation, the (101) orientation and the (222) orientation. As shown in FIG. 4, the orientation rate in (222) direction varies greatly for the wafers.

Figure 5:
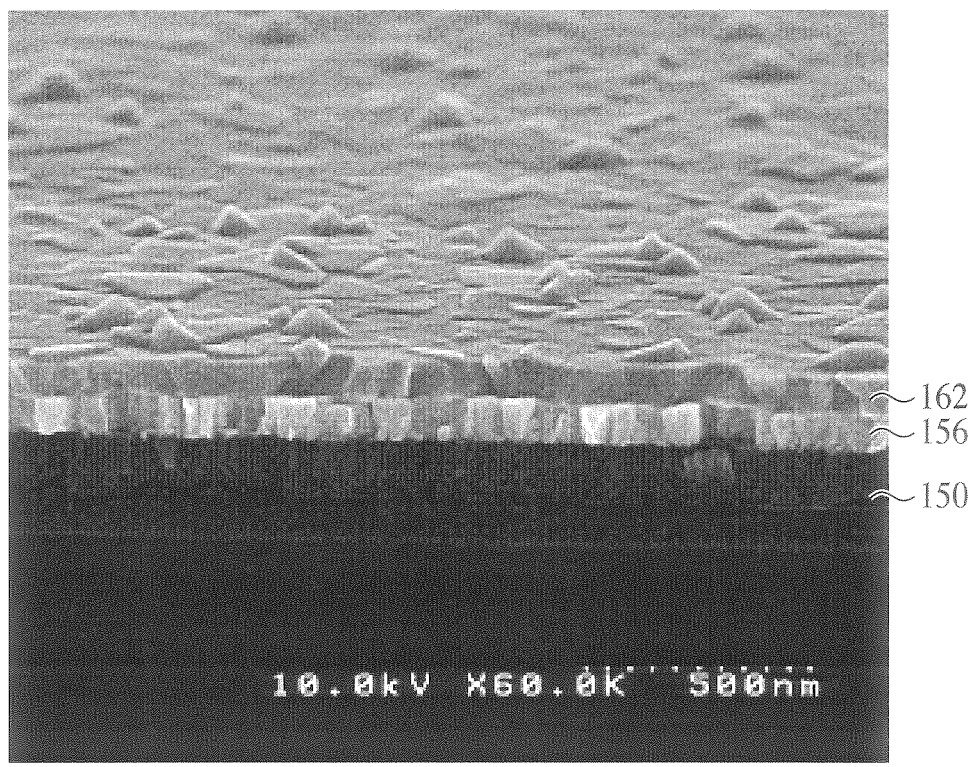
FIG. 5 is a view of a microscopic picture of the capacitor dielectric film formed of PZT on the lower electrodes of Ir by MOCVD.

FIG. 5 is a view of a microscopic picture of the capacitor dielectric film formed of PZT on the lower electrodes of Ir by MOCVD. As shown in FIG. 5, the morphology of the surface of the capacitor dielectric film 162 is not so good. When the capacitor dielectric film 162 of such surface morphology is used, the leakage current of the capacitor 172 is large, and the capacitors 172 cannot have good electric characteristics. The reason why good surface morphology cannot be obtained when the capacitor dielectric film 162 is formed on the lower electrodes 156 of Ir by MOCVD is abnormal oxidation, etc. taking place on the surfaces of the lower electrodes 156.

Figure 6:
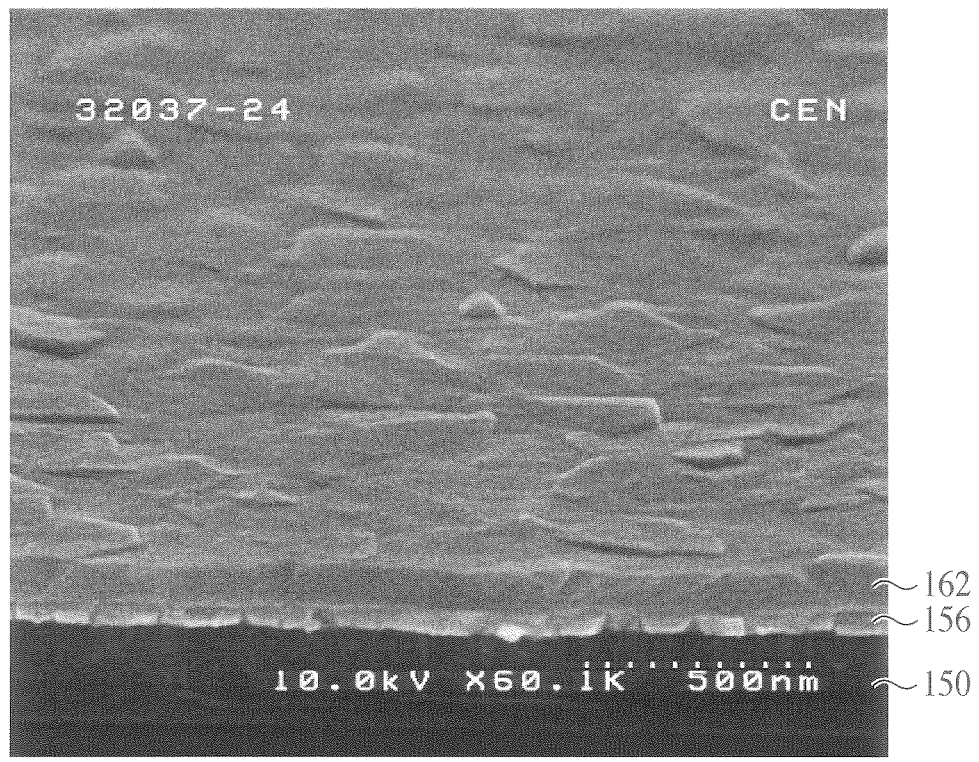
FIG. 6 is a view of a microscopic picture of the first PZT film formed on the lower electrodes of Ir by sputtering or sol-gel process and the second PZT film formed on the first PZT film by MOCVD.

FIG. 6 is a view of a microscopic picture of the first PZT film formed on the lower electrodes of Ir by sputtering or sol-gel process and the second PZT film formed on the first PZT film by MOCVD. As shown in FIG. 6, the surface of the capacitor dielectric film 162, i.e., the surface of the second PZT film is very flat.

However, the crystallinity of the first PZT film formed on the lower electrodes of Ir by sputtering or sol-gel process is very poor.

Thus, when the lower electrodes are formed of Ir as well, the semiconductor device cannot have the capacitors 172 of good electric characteristics.

According to the present embodiment, the lower electrodes are formed of the first conduction film of platinum oxide or palladium oxide and the second conduction film of Pt, Pt alloy, Pd or Pd alloy formed on the first conduction film, and the first conduction film of platinum oxide or palladium oxide has the function of preventing the diffusion of Pb and Bi. Thus, according to the present invention, even when Pb or Bi contained in the capacitor dielectric film is diffused in the lower electrodes, the arrival of Pb or Bi at the interface between the lower electrodes and the oxygen barrier film can be prevented. Accordingly, the present invention can prevent the reaction of the oxygen barrier film with Pb or Bi, and the impairment of the adhesion between the lower electrodes and oxygen barrier film can be prevented. Consequently, the release of the lower electrodes from the oxygen barrier film can be prevented. On the second conduction film of Pt, Pt alloy, Pd or Pd alloy, the capacitor dielectric film of good crystallinity can be formed. That is, on the second conduction film of Pt, Pt alloy, Pd or Pd alloy, the capacitor dielectric film of homogeneous in-plane crystallinity and good surface morphology can be formed. Thus, the present invention can provide a semiconductor device including capacitors of good electric characteristics and high reliability.

According to the present invention, the lower electrodes are formed of the first conduction film of iridium oxide or ruthenium oxide, the second conduction film of iridium oxide or ruthenium oxide and the third conduction film of Pt, Pt alloy, Pd, Pd alloy, and the layer film of the first conduction film of iridium oxide or ruthenium oxide and the second conduction film of iridium oxide or ruthenium oxide has the function of preventing the diffusion of Pb and Bi. Thus, according to the present invention, the arrival of Pb or Bi contained in the capacitor dielectric film can be prevented from arriving at the interface between the lower electrodes and the oxygen barrier film, and the reaction of the oxygen barrier film with Pb or Bi can be prevented. Accordingly, the present invention can prevent the impairment of the adhesion strength of the interface between the lower electrodes and the oxygen barrier film, and the release of the lower electrodes from the oxygen barrier film can be prevented. On the third conduction film of Pt, Pt alloy, Pd or Pd alloy, the capacitor dielectric film of homogeneous in-plane crystallinity and good surface morphology can be can be formed. Accordingly, the present invention can provide a semiconductor device of good electric characteristics and high reliability.

[A First Embodiment]

Figure 7:
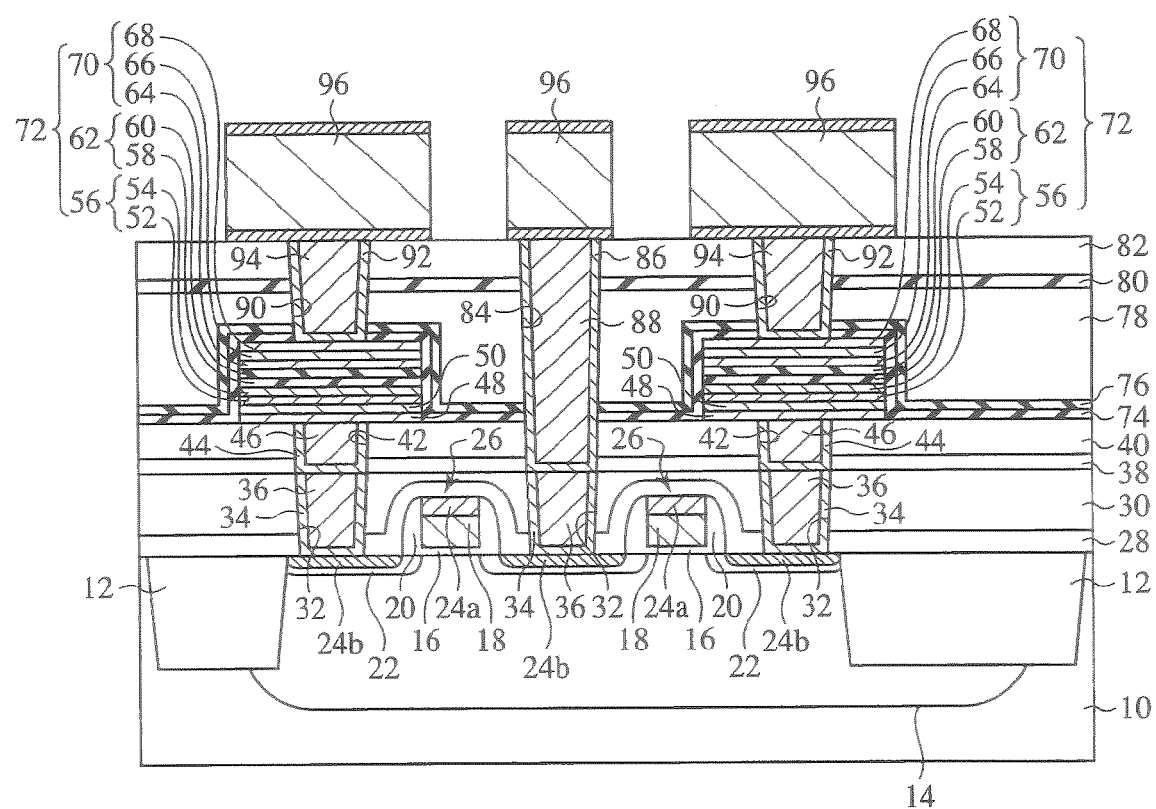
FIG. 7 is a cross-section diagram of the semiconductor device according to the present embodiment.

The semiconductor device according to a first embodiment of the present invention and the method for manufacturing the semiconductor device will be explained with reference to FIGS. 7 to 9B. FIG. 7 is a cross-section diagram of the semiconductor device according to the present embodiment.

(The Semiconductor Device)

First, the semiconductor device according to the present embodiment will be explained with reference to FIG. 7.

As illustrated in FIG. 7, device isolation regions 12 for defining device regions are formed in a semiconductor substrate 10 of, e.g., N-type or P-type silicon. P-type wells 14 are formed in the semiconductor substrate 10 with the device isolation regions 12 formed in.

On the semiconductor substrate 10 with the wells 14 formed in, gate electrodes (gate interconnections) 18 are formed with a gate insulation film 16 formed therebetween. A sidewall insulation film 20 is formed on the side walls of the gate electrodes 18.

A source/drain diffused layer 22 is formed on both sides of the gate electrodes 18 with the sidewall insulation film 20 formed on.

On the tops of the gate electrodes 18 and on the source/drain diffused layer 22, a silicide layer 24a, 24b is formed. The silicide layer 24b on the source/drain diffused layer 22 functions as the source/drain electrodes.

Thus, transistors 26 each including the gate electrodes 18 and the source/drain diffused layer 22 are formed.

On the semiconductor substrate 10 with the transistors 26 formed on, an insulation film (cover film) 28 of SiON of, e.g., a 200 nm-thickness is formed.

On the semiconductor substrate 10 with the insulation film 28 formed on, an inter-layer insulation film 30 of a silicon oxide film of, e.g., a 700 nm-thickness is formed. The surface of the inter-layer insulation film 30 is planarized.

In the inter-layer insulation film 30 and the insulation film 28, contact holes 32 are formed down to the source/drain electrodes 24b.

A Ti film of, e.g., a 30 nm-thickness is formed in the contact holes 32. In the contact holes 32 with the Ti film formed in, a TiN film of, e.g., a 20 nm-thickness is formed. The Ti film and the TiN film form an adhesion layer 34.

In the contact holes 32 with the adhesion layer 34 formed in, conductor plugs 36 of tungsten (W) are buried in.

On the inter-layer insulation film 30 with the conductor plugs 36 buried in an oxidation preventing film 38 of, e.g., a 130 nm-thickness SiON film is formed. The oxidation preventing film 38 is for preventing the oxidation of the upper surfaces of the conductor plugs 36 which have been buried in the inter-layer insulation film 36.

The oxidation preventing film 38 is formed of SiON film here but may not be formed essentially of SiON film. The oxidation preventing film 38 may be formed of, e.g., silicon nitride film or aluminum oxide film.

On the oxidation preventing film 38, an inter-layer insulation film 40 of a silicon oxide film of, e.g., a 200 nm-thickness is formed.

In the inter-layer insulation film 40 and the oxidation preventing film 38, contact holes 42 are formed down to the conductor plugs 36.

In the contact holes 42, a 30 nm-thickness Ti film, for example, is formed. In the contact holes 42 with the Ti film formed in, a 20 nm-thickness TiN film, for example, is formed. The Ti film and the TiN film form adhesion layer 44.

In the contact holes 42 with the adhesion layer 44 formed in, conductor plugs 46 of tungsten are buried in.

On the inter-layer insulation film 40 with the conductor plugs 46 buried in, an adhesion layer 48 of TiN film of, e.g., a 20 nm-thickness is formed. Such adhesion layer 48 is for improving the crystallinity of the oxygen barrier film 50 which will be described later and improving the adhesion between the oxygen barrier film 50 and the inter-layer insulation film 40.

The adhesion layer 48 is formed of TiN here, but the material of the adhesion layer 48 is not limited to TiN. The adhesion layer 48 may be formed suitably of a material which improves the crystallinity of the oxygen barrier film 50 and the adhesion between the oxygen barrier film 50 and the inter-layer insulation film 40. To give an example, the adhesion layer 48 may be formed of Ti, Ti alloy, Al, Al alloy, Pt, Pt alloy, Ir, Ir alloy, Re, Re alloy, Ru, Ru alloy, Pd, Pd alloy, Os, Os alloy, Rh, Rh alloy, platinum oxide, iridium oxide, ruthenium oxide, palladium oxide or others.

On the adhesion layer 48, a conductive oxygen barrier film (oxygen diffusion preventing film) 50 of, e.g., a 100 nm-thickness TiAlN film is formed. The oxygen barrier film 50 is for preventing the oxidation of the upper surfaces of the conductor plugs 46 which have been buried in the inter-layer insulation film 40.

The material of the oxygen barrier film 50 is TiAlN here but is not limited to TiAlN. The oxygen barrier film 50 may be formed suitably of TiAlON, TaAlN, TaAlON or others.

On the oxygen barrier film 50, lower electrodes 56 of capacitors 72 are formed. The lower electrodes 56 are formed by sequentially laying the first conduction film 52 of a platinum oxide ($PtO_x$) film, of, e.g., a 20-100 nm-thickness and the second conduction film 54 of a Pt film of, e.g., a 100 nm-thickness.

In the present embodiment, the first conduction film 52 forming the lower electrodes 56 is formed of platinum oxide, because platinum oxide has the function of preventing the diffusion of Pb and Bi. When the Pb or Bi contained in the capacitor dielectric film 62 arrives at the interface between the lower electrodes 56 and the oxygen barrier film 50, the oxygen barrier film 50 reacts with the Pb or Bi, and the adhesion strength of the interface between the lower electrodes 56 and the oxygen barrier film 50 is impaired, which leads to the release of the lower electrodes 56 from the oxygen barrier film 50. However, in the present embodiment, the first conduction film 52 forming the lower electrodes 56 is platinum oxide, whereby the arrival of the Pb or Bi contained in the capacitor dielectric film 62 at the interface between the lower electrodes 56 and the oxygen barrier film 50 can be prevented, and resultantly, the reaction of the oxygen barrier film 50 with the Pb or Bi can be prevented. Thus, according to the present embodiment, the impairment of the adhesion strength of the interface between the lower electrodes 56 and the oxygen barrier film 50 can be prevented, and the release of the lower electrodes 56 form the oxygen barrier film 50 can be prevented.

In the present embodiment, the second conduction film 54 forming the lower electrodes 56 is formed of Pt, because the second conduction film 54 of Pt permits the capacitor dielectric film 62 of good crystallinity to be formed.

Often, the lower electrodes 56 are partially reduced by thermal processing after the lower electrode 56 have been formed. That is, thermal processing after the lower electrodes 56 have been formed often reduces the platinum oxide forming the first conduction film 52 of the lower electrodes 56. Even when the first conduction film 52 of the lower electrodes 56 is reduced, oxygen remains to some extent in the first conduction film 52. Accordingly, when the platinum oxide film forming the first conduction film 52 is reduced, the platinum oxide film 52 becomes platinum film containing oxygen. Even when the platinum oxide film forming the first conduction film 52 is reduced, oxygen remains in the first conduction film 52, and the oxygen concentration of the lower electrode 56 on the side of the oxygen barrier film 50 is higher than the oxygen concentration of the lower electrode 56 on the side of the capacitor dielectric film 62.

The first conduction film 52 of the lower electrode 56 is formed of platinum oxide here, but the material of the first conduction film 52 of the lower electrode 56 is not limited to platinum oxide. Palladium oxide as well as platinum oxide has the function of preventing the diffusion of Pb and Bi. The first conduction film 52 of the lower electrodes 56 may be formed of palladium oxide. When the palladium oxide film forming the first conduction film 52 is reduced, the palladium oxide film 52 becomes palladium film containing oxygen.

The second conduction film 54 of the lower electrodes 56 is formed of Pt here, but the material of the second conduction film 54 is not limited to Pt. On Pt alloy film, for example, as well, a capacitor dielectric film 62 of good crystallinity can be formed. On Pd film as well, the capacitor dielectric film 62 of good crystallinity can be formed. On Pd alloy film as well, the capacitor dielectric film 62 of good crystallinity can be formed. Thus, the second conduction film 54 of the lower electrodes 56 may be formed of Pt alloy film, Pd film, Pd alloy film or others.

The capacitor dielectric film 62 is formed on the lower electrodes 56. The capacitor dielectric film 62 is formed of the first dielectric film 58 formed by sputtering and sol-gel process and the second dielectric film 60 formed by MOCVD (Metal Organic Chemical Vapor Deposition). The film thickness of the second dielectric film 60 is set large than the film thickness of the first dielectric film 58. The second dielectric film 60 is formed thicker than the first dielectric film 58, because the second dielectric film 60 has better film quality than the first dielectric film 58. The material of the capacitor dielectric film 62 is a ferroelectric containing Pb or Bi, or a high dielectric containing Pb or Bi. The high dielectric is a dielectric whose relative dielectric constant higher than the relative dielectric constant (3.8) of silicon dioxide. The capacitor dielectric film 62 may be formed of, e.g., $PbZr_xTi_{1-x}O_3$ film (PZT film). The PZT film is a ferroelectric film of the perovskite structure containing Pb. The capacitor dielectric film 62 may be formed of, e.g., $SrBi_2Ta_2O_9$ film (SBT film). The SBT film is a dielectric film of bismuth layer structure containing Bi.

The capacitor dielectric film 62 is not limited to PZT film and SBT film. The principle of the present invention is applicable widely to cases that the capacitor dielectric film 62 is formed of a ferroelectric containing Pb or Bi and a high dielectric containing Pb or Bi.

The capacitor dielectric film 62 may be formed of, e.g., $PbLa(Zr,Ti)O_3$ film (PLZT film), which is PZT with La added to. The capacitor dielectric film 62 may be formed of a material which is PZT with at least one of La, Ca, Sr and Si added to. These are ferroelectric film containing Pb.

The capacitor dielectric film 62 may be formed of $BiLaO_3$ film (BLT film), $SrBi_2(Ta,Nb)_2O_9$ film (SBTN film), $Bi_4Ti_3O_9$ film, $(Bi,La)_4Ti_3O_{12}$ film, $BiFeO_3$ film, $SrBi_4Ti_4O_{15}$ film, $(Bi_{1-x}R_x)Ti_3O_{12}$ film (R: a rare earth element) or others. These are ferroelectric film containing Bi.

The capacitor dielectric film 62 may be formed of $(Pb,Ba,Sr)TiO_3$ or others. These are high dielectric films containing Pb.

The capacitor dielectric film 62 may be formed of $(Bi,Sr)TiO_3$ or others. These are high dielectric film containing Bi.

In the present embodiment, the capacitor dielectric film 62 is formed of a dielectric containing Pb or Bi or a high dielectric containing Pb or Bi, and the Pb or Bi diffused from the capacitor dielectric film 62 is present in the lower electrodes 56. As described above, in the present embodiment, the first conduction film 52 of the lower electrodes 56 is formed of platinum oxide or palladium oxide, which has the function of preventing the diffusion of Pb and Bi. Accordingly, the Pb or Bi diffused from the capacitor dielectric film 62 does not arrive at the interface between the lower electrodes 56 and the oxygen barrier film 50. That is, in the interface between the lower electrodes 56 and the oxygen barrier film 50, Pb and Bi are not substantially present. The concentration peak of the Pb or Bi diffused from the capacitor dielectric film 62 into the lower electrodes 56 positions in the interface between the first conduction film 52 and the second conduction film 54, which form the lower electrodes 56. That is, the concentration peak of the Pb or Bi diffused from the capacitor dielectric film 62 into the lower electrodes 56 is remote from the interface between the lower electrodes 56 and the oxygen barrier film 50. In the present embodiment, the Pb or Bi diffused from the capacitor dielectric film 62 does not arrive at the interface between the lower electrodes 56 and the oxygen barrier film 50, whereby the reaction of the oxygen barrier film 50 with the Pb or Bi can be prevented. Thus, according to the present embodiment, the impairment of the adhesion between the oxygen barrier film 50 and the lower electrodes 56 can be prevented, and resultantly the release of the lower electrodes 56 from the oxygen barrier film 50 can be prevented.

A trace of Pb or Bi may arrive at the interface between the lower electrodes 56 and the oxygen barrier film 50, because a trace of Pb or Bi arriving at the interface between the lower electrodes 56 and the oxygen barrier film 50 does not substantially impair the adhesion of the interface between the lower electrodes 56 and the oxygen barrier film 50, and the lower electrodes 56 are never released from the oxygen barrier film 50. In the case that the capacitor dielectric film 62 is formed of a ferroelectric or a high dielectric containing Pb, the adhesion between the oxygen barrier film 50 and the lower electrodes 56 is sufficiently ensured when the concentration of the Pb in the interface between the lower electrodes 56 and the oxygen barrier film 50 is 1/50 or below of the peak value of Pb in the lower electrodes 56, and the lower electrodes 56 are never released from the oxygen barrier film 50. In the case that the capacitor dielectric film 62 is formed of a ferroelectric or a high dielectric containing Bi, the adhesion between the oxygen barrier film 50 and the lower electrodes 56 is sufficiently ensured when the concentration of the Bi in the interface between the lower electrodes 56 and the oxygen barrier film 50 is 1/50 or below of the peak value of Bi in the lower electrodes 56, and the lower electrodes 56 are never released from the oxygen barrier film 50. However, in view of ensuring high adhesion between the lower electrodes 56 and the oxygen barrier film 50, it is preferable that neither Pb or Bi is present in the interface between the lower electrodes 56 and the oxygen barrier film 50.

The capacitor dielectric film 62 has the two-layer structure here, i.e., is formed of the first dielectric film 58 formed by sputtering or sol-gel process, and the second dielectric film 60 is formed by MOCVD. However, the capacitor dielectric film 62 does not have essentially the two-layer structure and may have a single-layer structure. That is, the capacitor dielectric film 62 of the single-layer structure may be formed by sputtering or sol-gel process. However, the capacitor dielectric film 62 including the second dielectric film 60 formed by MOCVD is superior in the electric characteristics to the capacitor dielectric film 62 of the single-layer structure formed by sputtering or sol-gel process. Accordingly, in terms of forming dielectric capacitors of good electric characteristics, it is preferable that the first dielectric film 58 is formed by sputtering or sol-gel process, and the second dielectric film 60 is formed by MOCVD to form the capacitor dielectric film 62 of the first dielectric film 58 and the second dielectric film 60.

On the capacitor dielectric film 62, the upper electrodes 70 of the capacitors 72 are formed. The upper electrodes 70 are formed by sequentially laying, e.g., the first conduction film 64 of a 50 nm-thickness $IrO_X$ film, the second conduction film 66 of a 100-300 nm-thickness $IrO_Y$ film and the third conduction film 68 of a 50-150 nm-thickness Ir film. The third conduction film 68 of Ir film functions as a hydrogen barrier film (hydrogen diffusion preventing film) which prevents the reduction of the capacitor dielectric film 62 with hydrogen. The third conduction film 68 of Ir film functions as a conduction improving film which ensures good electric connection between the upper electrodes 70 and conductor plugs 94 which will be described later.

Thus, the capacitors 72 comprising the lower electrodes 56, the capacitor dielectric film 62 and the upper electrodes 70 are formed.

On the inter-layer insulation film 40 with the capacitors 72 formed on, a hydrogen barrier film (hydrogen diffusion preventing film) 74 of, e.g., a 2-20 nm-thickness is formed, covering the capacitors 72. The material of the hydrogen barrier film 74 is, e.g., aluminum oxide ($Al_2O_3$). Such hydrogen barrier film 74 is for preventing the reduction of the capacitor dielectric film 62 with hydrogen.

On the hydrogen barrier film 74, a hydrogen barrier film (hydrogen diffusion preventing film) 76 of, e.g., a 20-50 nm-thickness is further formed. The material of the hydrogen barrier film 76 as well as the hydrogen barrier film 74 is, e.g., aluminum oxide. Such hydrogen barrier film 74 is for preventing, in cooperation with the hydrogen barrier film 76, the reduction of the capacitor dielectric film 62 with hydrogen.

On the hydrogen barrier film 76, an inter-layer insulation film 78 of a 1400 nm-thickness silicon oxide film. The surface of the inter-layer insulation film 78 is planarized.

On the inter-layer insulation film 78, a hydrogen barrier film (hydrogen diffusion preventing film) 80 of, e.g., a 20-100 nm-thickness is formed. The material of the hydrogen barrier film 80 as well as the hydrogen barrier films 74, 76 is, e.g., aluminum oxide. Such hydrogen barrier film 80 is for preventing the reduction of the capacitor dielectric film 62 with hydrogen as well as the hydrogen barrier films 74, 76. The hydrogen barrier film 80 formed on the planarized inter-layer insulation film 78 is flat.

On the hydrogen barrier film 80, an inter-layer insulation film 82 of silicon oxide film is formed. The film thickness of the inter-layer insulation film 82 is, e.g., 100-300 nm. The surface of the inter-layer insulation film 82 is planarized.

Contact holes 84 are formed down to the conductor plugs 36 in the inter-layer insulation film 82, the hydrogen barrier film 80, the inter-layer insulation film 78, the hydrogen barrier film 76, the hydrogen barrier film 74, the inter-layer insulation film 40 and the oxidation preventing film 38.

In the contact holes 84, a Ti film of, e.g., a 30 nm-thickness is formed. A TiN film of, e.g., a 20 nm-thickness is formed in the contact holes 84 with the Ti film formed in. The Ti film and the TiN film form an adhesion layer 86.

In the contact holes 84 with the adhesion layer 86 formed in, conductor plugs 88 of tungsten are buried.

Contact holes 90 are formed down to the upper electrodes 70 in the inter-layer insulation film 82, the hydrogen barrier film 80, the inter-layer insulation film 78, the hydrogen barrier film 76 and the hydrogen barrier film 74.

A Ti film of, e.g., a 30 nm-thickness is formed in the contact holes 90. A TiN film of, e.g., a 20 nm-thickness is formed in the contact holes 90 with the Ti film formed in. The Ti film and the TiN film form an adhesion layer 92.

Conductor plugs 94 of tungsten are buried in the contact holes 90 with the adhesion layer 92 formed in.

On the inter-layer insulation film 82 with the conductor plugs 88, 94 buried in, interconnections 96 are formed. The interconnections 96 are formed of the layer film of, e.g., a Ti film of a 60 nm-thickness, a TiN film of a 30 nm-thickness, an AlCu alloy film of a 360 nm-thickness, a Ti film of a 5 nm-thickness and a TiN film of a 70 nm-thickness.

On the inter-layer insulation film 82 with the interconnections 96 formed on, inter-layer insulation film (not illustrated), conductor plug (not illustrated), interconnections (not illustrated), etc. are further formed respectively in a plurality of layers. On the uppermost layer, a cover film of silicon oxide film and SiN film is formed.

Thus, the semiconductor device according to the present embodiment is constituted.

The semiconductor device according to the present embodiment is characterized mainly in that the lower electrodes 56 are formed of the first conduction film 52 of platinum oxide or palladium oxide and the second conduction film 54 of Pt, Pt alloy, Pd or Pd alloy formed on the first conduction film 52. The first conduction film 52 of platinum oxide or others has the function of preventing the diffusion of Pb or Bi. Thus, according to the present embodiment, even when the Pb or Bi contained in the capacitor dielectric film 62 into the lower electrodes 56, the arrival of the Pb or Bi at the interface between the lower electrodes 56 and the oxygen barrier film 50 can be prevented, and the reaction of the oxygen barrier film 50 with the Pb or Bi can be prevented. Consequently, according to the present embodiment, the impairment of the adhesion between the lower electrodes 56 and the oxygen barrier film 50 can be prevented, and resultantly, the release of the lower electrodes 56 form the oxygen barrier film 50 can be prevented. The capacitor dielectric film 62 of good crystallinity can be formed on the second conduction film 54 of Pt or others. To be more specific, the capacitor dielectric film 62 having in-wafer plane homogeneous crystallinity can be formed on the second conduction film 54 of Pt or others. The capacitor dielectric film 62 of good surface morphology can be formed. Thus, the semiconductor device according to the present embodiment can include capacitors of good electric characteristics and high reliability.

(The Method for Manufacturing the Semiconductor Device)

Figure 8A:
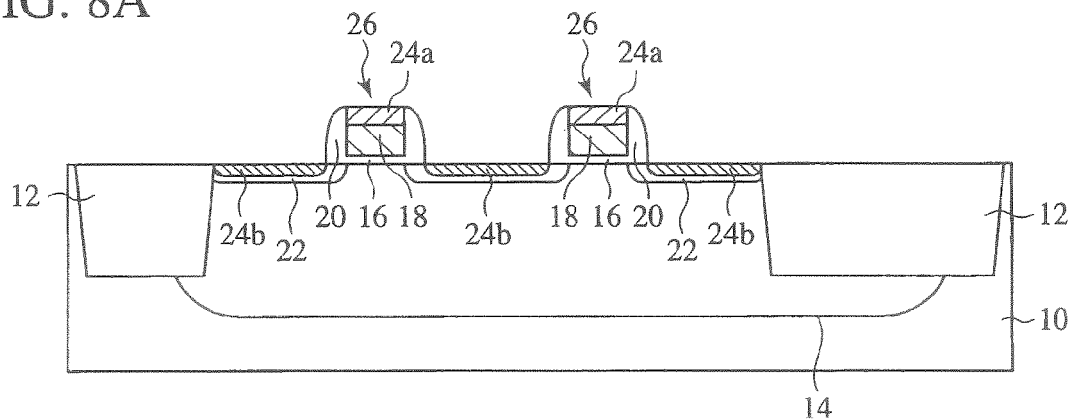
FIGS. 8A to 8AB are cross-section diagrams of the semiconductor device according to the present embodiment in the steps of the method for manufacturing the semiconductor device, which illustrate the method.
Figure 8B:
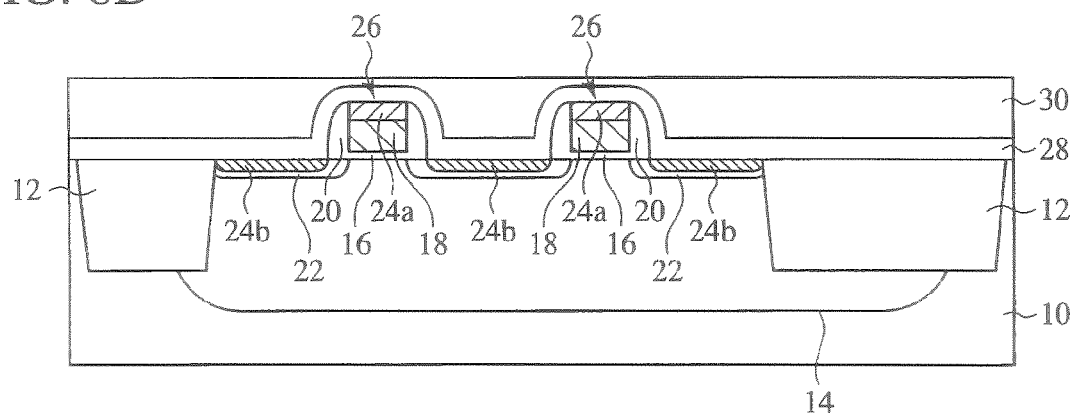

Next, the method for manufacturing the semiconductor device according to the present embodiment will be explained with reference to FIGS. 8A to 8AB. FIGS. 8A to 8AB are cross-section diagrams of the semiconductor device according to the present embodiment in the steps of the method for manufacturing the semiconductor device, which illustrate the method.

First, as illustrated in FIG. 8A, the device isolation regions 12 for defining device regions are formed in the semiconductor substrate 10 of, e.g., N-type or P-type type silicon by, e.g., STI (Shallow Trench Isolation). The device isolation regions 12 are not be formed essentially by STI and may be formed by, e.g., LOCOS (LOCal Oxidation of Silicon).

Then, a P-type dopant impurity is implanted by ion implantation to form the P-wells 14.

Next, the gate insulation film 16 of a 10 nm-thickness is formed on the device regions by, e.g., thermal oxidation.

Next, a 180 nm-thickness polysilicon film 18 is formed by, e.g., CVD. The polysilicon film 18 is to be the gate electrodes, etc.

Next, the polysilicon film 18 is patterned by photolithography. Thus, the gate electrodes (gate interconnections) 18 of the polysilicon film are formed.

Then, with the gate electrodes 18 as the mask, an N-dopant impurity is implanted into the semiconductor substrate 10 on both sides of each gate electrode 18 by ion implantation. Thus, extension regions (not illustrated) forming the shallow regions of the extension source/drain are formed.

Next, a 300 nm-thickness silicon oxide film is formed on the entire surface by, e.g., CVD.

Next, the silicon oxide film is anisotropically etched. Thus, the sidewall insulation film 20 of the silicon oxide film is formed on the side walls of the gate electrodes 18.

Next, with the gate electrodes 18 with the sidewall insulation film 20 formed on as a mask, an N-type dopant impurity is implanted in the semiconductor substrate 10 on both sides of the gate electrode 18. Thus, the impurity diffused layer (not illustrated) forming the deep regions of the extension sources/ drains are formed. The extension regions and the deep impurity diffused layer form the source/drain diffused layer 22.

Next, a high melting point metal layer (not illustrated) of cobalt or others is formed on the entire surface by, e.g., sputtering.

Next, the surface layer of the semiconductor substrate 10 and the high melting point metal layer are reacted with each other while the tops of the gate electrodes 18 and the high melting point metal layer are reacted with each other.

Then, that of the high melting point metal layer which has not reacted is removed by, e.g., wet etching.

Thus, the source/drain electrodes 24b of cobalt silicide are formed on the source/drain diffused layer 22. The silicide layer 24a of cobalt silicide is formed on the tops of the gate electrodes 18.

Thus, as illustrated in FIG. 8A, the transistors 26 including the gate electrodes 18 and the source/drain diffused layer 22 are formed.

Next, the insulation film (cover film) 28 of an SiON film of, e.g., a 200 nm-thickness is formed on the entire surface by, e.g., plasma CVD.

Next, the inter-layer insulation film 30 of a silicon oxide film of, e.g., a 1 μm-thickness is formed on the entire surface by, e.g., plasma TEOSCVD.

Next, the surface of the inter-layer insulation film 30 is planarized by, e.g., CMP (Chemical Mechanical Polishing). Thus, the inter-layer insulation film 30 of, e.g., a 700 nm-thickness is formed (see FIG. 8B).

Figure 8C:
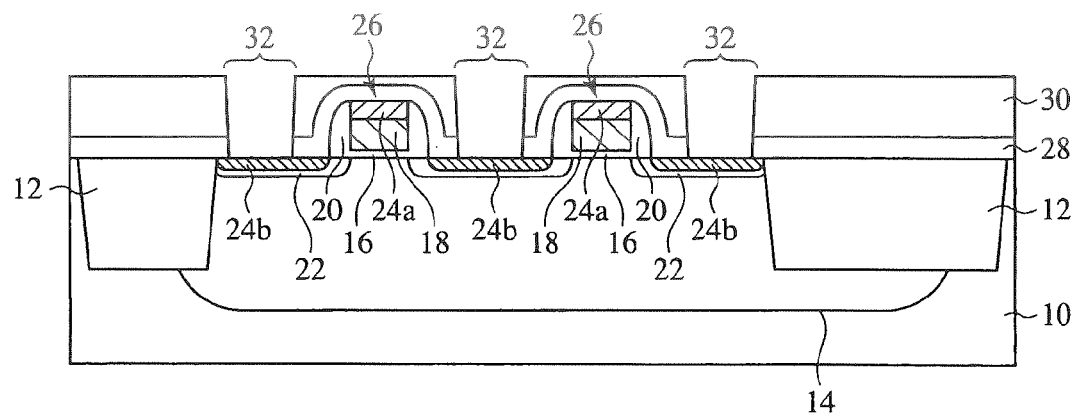
Figure 8D:
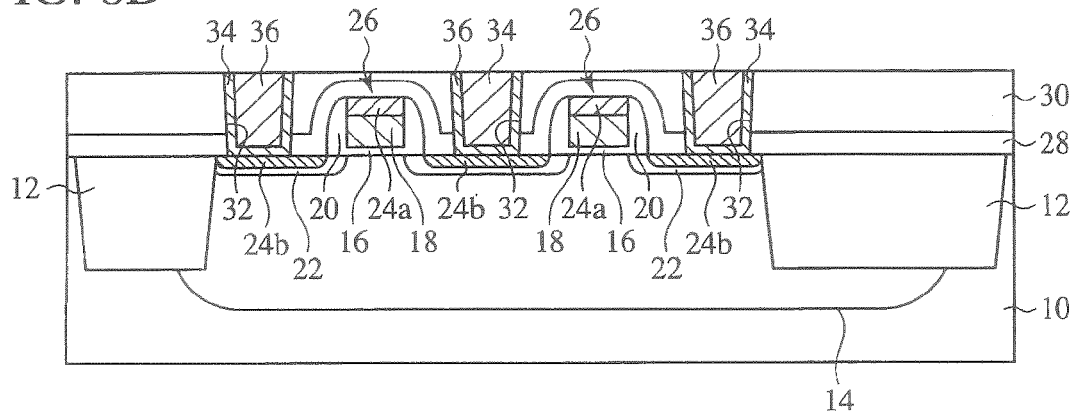

Next, as illustrated in FIG. 8C, the contact holes 32 are formed down to the source/drain electrodes 24b by photolithography. The diameter of the contact holes 32 is, e.g., 0.25 μm.

Next, a Ti film of, e.g., a 30 nm-thickness is formed on the entire surface by, e.g., sputtering.

Next, a TiN film of, e.g., a 20 nm-thickness is formed on the entire surface by, e.g., sputtering. The Ti film and the TiN film form the adhesion layer 34.

Next, the tungsten film 36 of, e.g., a 300 nm-thickness is formed on the entire surface by, e.g., CVD.

Next, the tungsten film 36 and the adhesion layer 34 are polished by, e.g., CMP until the surface of the inter-layer insulation film 30 is exposed. Thus, the conductor plugs 36 of the tungsten film are buried in the contact holes 32 (see FIG. 8D).

Figure 8E:
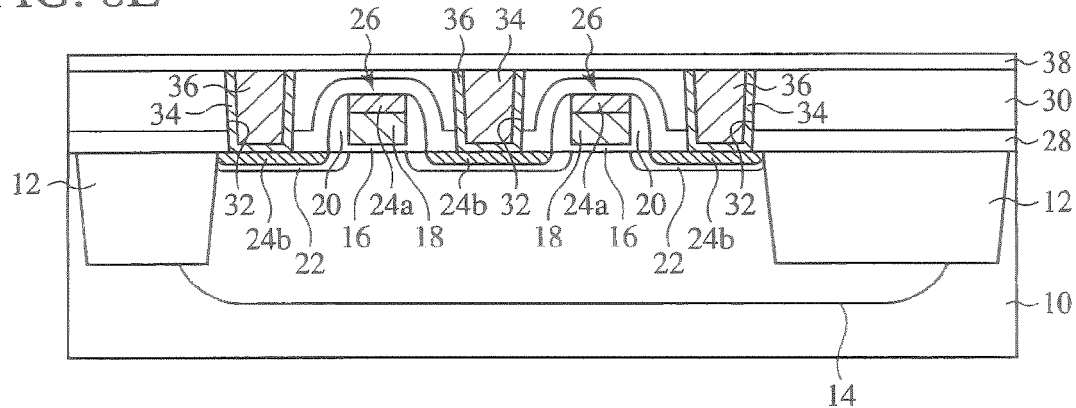

Then, as illustrated in FIG. 3B, the oxidation preventing film 38 of, e.g. a 130 nm-thickness is formed on the entire surface by, e.g., plasma CVD (see FIG. 8E). The oxidation preventing film 38 is for preventing the oxidation of the surfaces of the conductor plugs 36 buried in the inter-layer insulation film 30.

The material of the oxidation preventing film 38 is SiON film here but is not limited to SiON. The material of the oxidation preventing film 38 may be, e.g., SiN or aluminum oxide.

Figure 8F:
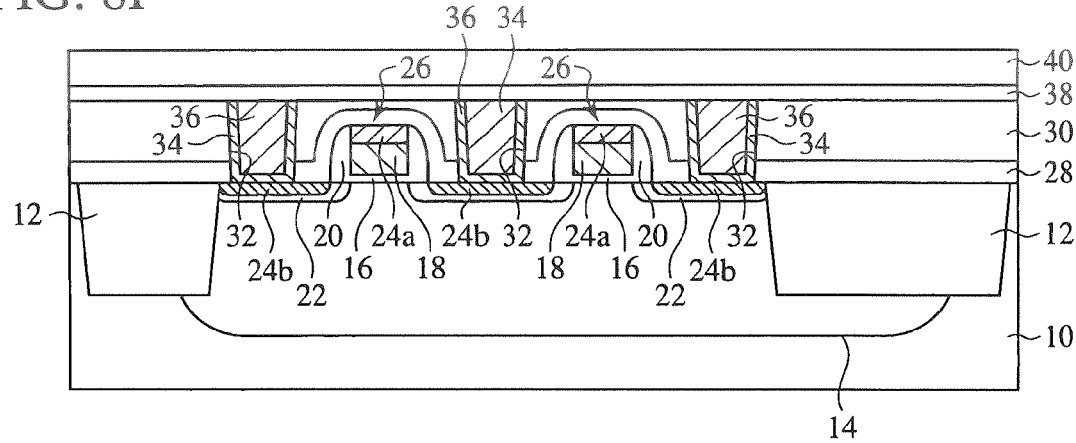

Then, as illustrated in FIG. 8F, the inter-layer insulation film 40 of a silicon oxide film of, e.g., a 300 nm-thickness is formed on the entire surface by, e.g., plasma TEOSCVD.

Figure 8G:
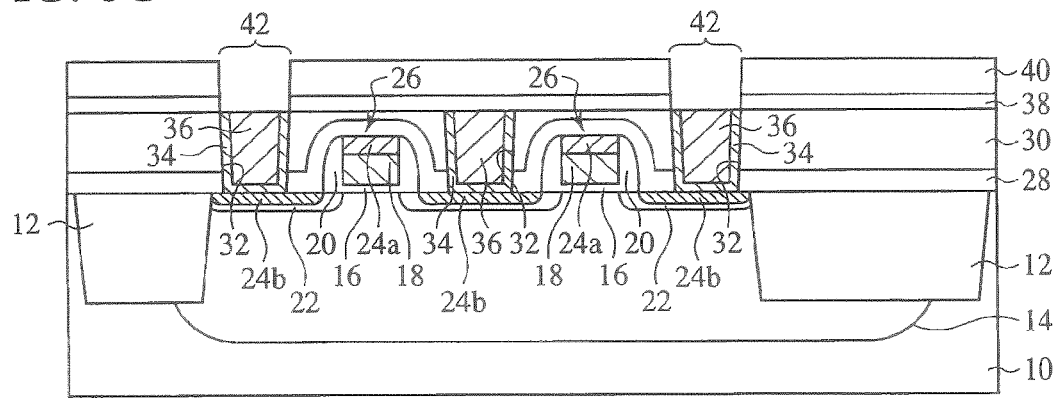
Figure 8H:
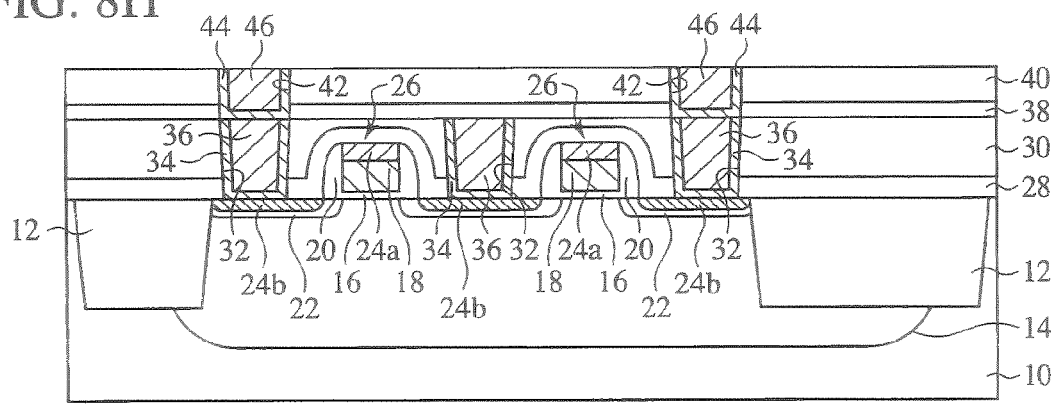

Next, as illustrated in FIG. 8G, the contact holes 42 are formed in the inter-layer insulation film 40 and the oxidation preventing film 38 down to the conductor plugs 36 by photolithography.

Next, a Ti film of, e.g., a 30 nm-thickness is formed on the entire surface by, e.g., sputtering.

Next, a TiN film of, e.g., a 20 nm-thickness is formed on the entire surface by, e.g., sputtering. The Ti film and the TiN film form the adhesion layer 44.

Next, the tungsten film 46 of, e.g., a 300 nm-thickness is formed on the entire surface by, e.g., CVD.

Next, the tungsten film 46 and the adhesion layer 44 are polished by, e.g., CMP until the surface of the inter-layer insulation film 40 is exposed. In polishing the tungsten film 46 and the adhesion layer 44 by CMP, a slurry which makes the polish rate of the tungsten film 46 and the adhesion layer 44 higher than the polish rate of the inter-layer insulation film 40. Such slurry may be, e.g., a slurry (type: SSW2000) by Cabot Microelectronics Corporation. Thus, the conductor plugs 46 of tungsten film are buried in the contact holes 42 (see FIG. 8H).

Then, the surface of the inter-layer insulation film 40 is exposed to a plasma atmosphere ($NH_3$ plasma) generated by using $NH_3$ gas to process the surface of the inter-layer insulation film 40 (plasma processing). In the present embodiment, the surface of the inter-layer insulation film 40 is exposed to the plasma atmosphere generated by using $NH_3$ gas, because the oxygen atoms of the inter-layer insulation film 40 are combined with the NH groups to thereby prevent the Ti atoms from being captured by the oxygen atoms of the surface of the inter-layer insulation film 40, in a later step, when the Ti film 47 is formed on the inter-layer insulation film 40.

The conditions for the plasma processing are as follows. A parallel plate plasma processing system is used as the plasma processing system. The opposed electrodes are positioned spaced by about 9 mm (350 mils) from the semiconductor substrate 10. The pressure in the chamber for the plasma processing is, e.g., about 266 Pa (2 Torr). The substrate temperature is, e.g., 400° C. The flow rate of $NH_3$ gas to be fed into the chamber is, e.g., 350 sccm. The high-frequency electric power to be applied to the semiconductor substrate 10 is, e.g., 13.56 MHz, 100 W. The high-frequency electric power to be applied to the opposed electrodes is, e.g., 350 kHz, 55 W. The application period of time of the high-frequency electric power is, e.g., 60 seconds.

The surface of the inter-layer insulation film 40 is processed here by exposing the surface of the inter-layer insulation film 40 to the plasma atmosphere generated by using $NH_3$ gas. The plasma atmosphere is not limited to the plasma atmosphere generated by using $NH_3$ gas. The surface of the inter-layer insulation film 40 may be exposed to the plasma atmosphere containing nitrogen. For example, the surface of the inter-layer insulation film 40 may be processing by exposing the surface of the inter-layer insulation film 40 to the plasma atmosphere ($N_2$ plasma) generated by using $N_2$ gas.

Figure 8I:
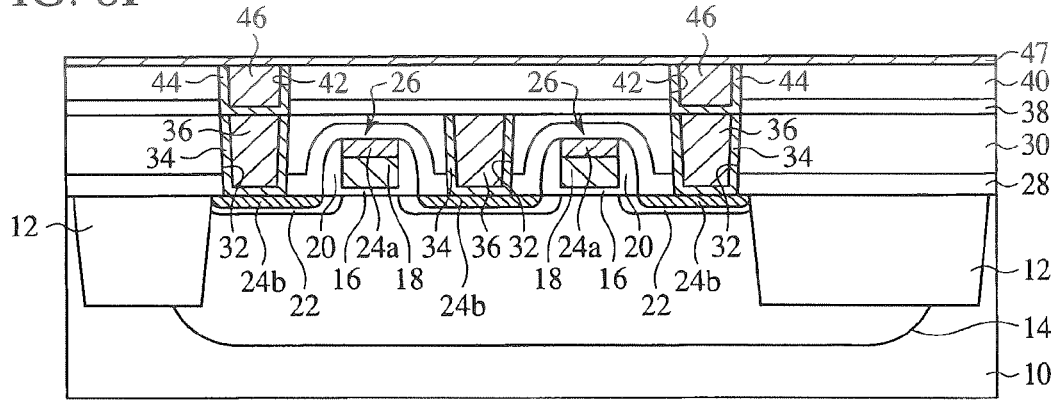
Figure 8J:
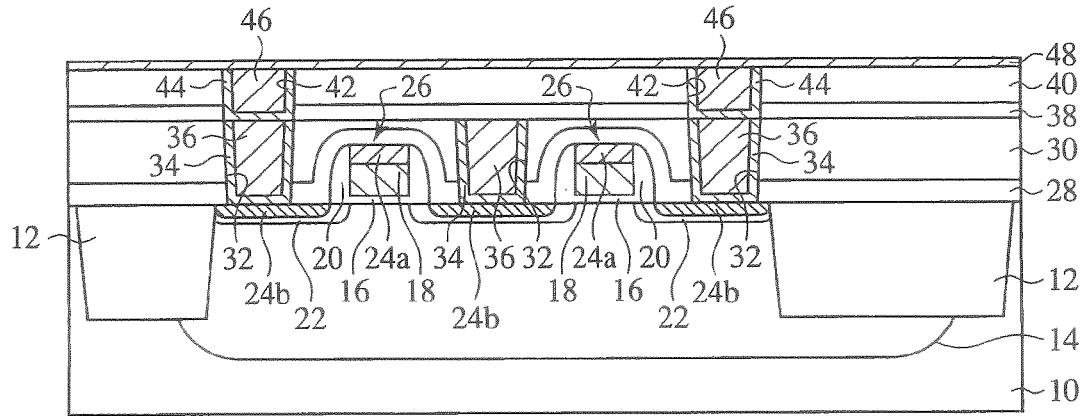

Then, as illustrated in FIG. 8I, the Ti film 47 of a 20 nm-thickness is formed on the entire surface by, e.g., sputtering. The Ti atoms deposited on the inter-layer insulation film 40 having the surface processed as described above can freely move in the surface of the inter-layer insulation film 40 without being captured by oxygen atoms. Accordingly, the Ti film 47 of good quality is formed on the inter-layer insulation film 40, self-oriented in (002) direction.

The conditions for forming the Ti film 47 are as exemplified below. That is, the distance between the semiconductor substrate 10 and the target is, e.g., 60 mm. The pressure in the film forming chamber is 0.15 Pa. The atmosphere in the film forming chamber is, e.g., Ar atmosphere. The substrate temperature is, e.g., the room temperature. The DC power to be applied is, e.g., 2.6 kW. The feed period of time of the DC power is, e.g., 5 seconds.

Then, thermal processing is made in a nitrogen atmosphere by, e.g., RTA (Rapid Thermal Annealing). The thermal processing temperature is, e.g., 650° C. The thermal processing period of time is, e.g., 60 seconds. This thermal processing makes the above-described Ti film 47 the TiN film 48 (see FIG. 8J). Thus, the adhesion layer 48 of TiN film of (111) orientation is obtained. Such adhesion layer 48 is for improving the crystallinity of the oxygen barrier film 50 to be formed in a later step and improving the adhesion between the oxygen barrier film 50 and the inter-layer insulation film 40.

The adhesion layer 48 is formed of TiN film here but is not essentially formed of TiN film. A material which improves the crystallinity of the oxygen barrier film 50 and the adhesion between the oxygen barrier film 50 and the inter-layer insulation film 40 can be suitably used as the material of the adhesion layer 48. For example, the adhesion layer 48 may be formed of Ti, Ti alloy, Al, Al alloy, Pt, Pt alloy, Ir, Ir alloy, Re, Re alloy, Ru, Ru alloy, Pd, Pd alloy, Os, Os alloy, Rh, Rh alloy, platinum oxide, iridium oxide, ruthenium oxide, palladium oxide or others.

Figure 8K:
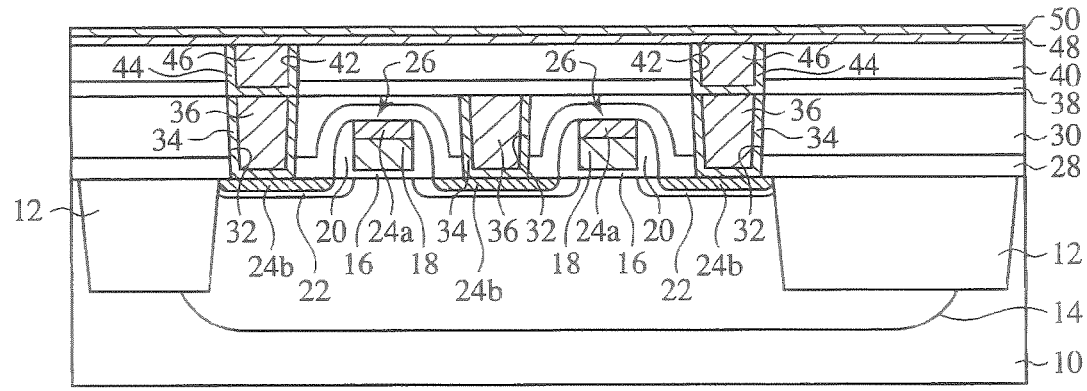

Then, as illustrated in FIG. 8K, the conductive oxygen barrier film (oxygen diffusion preventing film) 50 of, e.g., a 100 nm-thickness TiAlN film is formed on the entire surface by reactive sputtering. The oxygen barrier film 50 is for preventing the oxidation of the conductor plugs 46, after the conductor plugs 46 are buried in the inter-layer insulation film 40.

The conditions for forming the oxygen barrier film 50 are as exemplified below. That is, the target is a TiAl alloy. The atmosphere in the chamber is a mixed gas of Ar gas an nitrogen gas. The flow rate of the Ar gas to be fed into the chamber is, e.g., 40 sccm. The flow rate of the nitrogen gas to be fed into the chamber is, e.g., 10 sccm. The pressure in the chamber is, e.g., 253.3 Pa. The substrate temperature is, e.g., 400° C. The sputtering power is, e.g., 1 kW.

The material of the oxygen barrier film 50 is TiAlN here but is not limited to TiAlN. A conductor which can prevent the diffusion of oxygen can be suitably used as the material of the oxygen barrier film 50. For example, TiAlON, TaAlN, TaAlON or others may be used as the material of the oxygen barrier film 50.

Figure 8L:
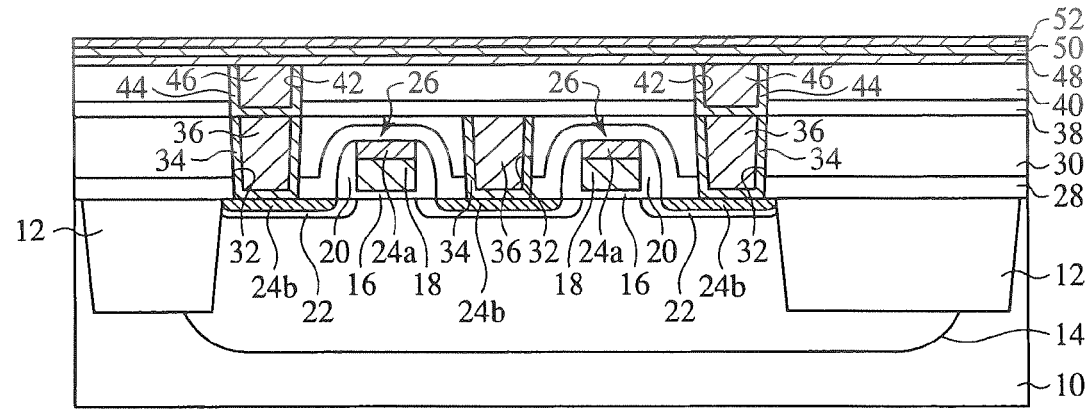

Next, as illustrated in FIG. 8L, the first conduction film 52 to be parts of the lower electrodes 56 is formed by, e.g., sputtering. As the first conduction film 52, an amorphous platinum oxide film, for example, is formed.

The conditions for forming the first conduction film 52 of platinum oxide are as exemplified below. That is, the flow rate of Ar gas to be fed into the chamber is, e.g., 40 sccm. The flow rate of $O_2$ gas to be fed into the chamber is, e.g., 160 sccm. That is, the oxygen concentration of the atmosphere in the chamber is about 80%. The pressure in the chamber is, e.g., 0.3 Pa. The sputtering power is, e.g., 1 kW.

The film forming temperature for forming the first conduction film 52 of platinum oxide is preferably 150-400° C. For the following reason, the film forming temperature for forming the first conduction film 52 is 150-400° C.

That is, platinum oxide film formed at a temperature lower than 150° C. has very low conductivity and electrically is substantially insulator. Furthermore, platinum oxide film formed at a temperature lower than 150° C. is hard to be reduced even by thermal processing in a later step, and the conductivity is not substantially improved. Thus, when the first conduction film 52 of platinum oxide is formed at a temperature lower than 150° C., it is difficult to form electrically good capacitors 72. Accordingly, the film forming temperature for forming the first conduction film 52 of platinum oxide is preferably 150° C. or above.

On the other hand, when platinum oxide film is formed at a temperature higher than 400° C., oxygen is dissociated in forming the platinum oxide film, and Pt film is formed. When the first conduction film 52 is formed of Pt film, the Pb or Bi diffused from the capacitor dielectric film 62 cannot be barriered by the first conduction film 52. When the first conduction film 52 cannot barrier the Pb or Bi, the Pb or Bi arrives at the interfaces between the lower electrodes 56 and the oxygen barrier film 50, and the oxygen barrier film 50 reacts with the Pb or Bi. Then, the adhesion between the lower electrodes 56 and the oxygen barrier film 50 is impaired, which leads to the release of the lower electrodes 56 from the oxygen barrier film 50. Thus, the film forming temperature for forming the first conduction film 52 of platinum oxide is preferably 400° C. or below.

In view of this, it is preferable that the film forming temperature for forming the first conduction film 52 of platinum oxide is 150-400° C.

The conductivity of platinum oxide film tends to be lower as the film forming temperature is higher. Accordingly, in order to form the lower electrodes 56 of good conductivity, it is preferable to set the film forming temperature high. The firm forming temperature for forming the first conduction film 52 of the lower electrodes 56 is about 350° C. here.

The film thickness of the first conduction film 52 of the lower electrodes 56 is preferably set at 20-100 nm. The film thickness of the first conduction film 52 is set at 20-100 nm for the following reason.

That is, when the first conduction film 52 is formed thinner than 20 nm, when the lower electrodes 56 are subjected to thermal processing in a later step, almost all the platinum oxide film is reduced and becomes Pt film. Pt film does not have the function of preventing the diffusion of Pb and Bi. Accordingly, when the first conduction film 52 of platinum oxide becomes all Pt, it is difficult to barrier the Pb or Bi to be diffused from the capacitor dielectric film 62 which is to be formed in a later step. When Pb or Bi cannot barriered by the first conduction film 52, the Pb or Bi arrives at the interfaces between the lower electrodes 56 and the oxygen barrier film 50, and the oxygen barrier film 50 reacts with the Pb or Bi. Then, the adhesion between the lower electrodes 56 and the oxygen barrier film 50 is impaired, which leads to the release of the lower electrodes 56 from the oxygen barrier film 50.

The first conduction film 52 of platinum oxide formed in a film thickness of 20 nm or above at least partially remains platinum oxide, when the lower electrodes 56 are subjected to the thermal processing. Accordingly, in order to barrier the Pb or Bi diffused from the capacitor dielectric film 62, it is preferable to set the film thickness of the first conduction film 52 at 20 nm or above.

On the other hand, when the first conduction film 52 is formed in a film thickness of 100 nm or above, the platinum oxide film of a considerable thickness remains in the first conduction film 52, even when the part of the first conduction film 52 is reduced in the thermal processing in the later step. The sheet resistance of platinum oxide film is relatively high, and when the platinum oxide film remains in a considerable thickness in the first conduction film 52, it is difficult to make the capacitors of good electric characteristics. Accordingly, it is preferable to set the film thickness of the first conduction film 52 at 100 nm or below.

The film thickness of the first conduction film 52 is, e.g., 50 nm here.

As the first conduction film 52 forming the lower electrodes 56, platinum oxide film is formed here, but the material of the first conduction film 52 is not limited to platinum oxide. For example, palladium oxide as well as platinum oxide has the function of preventing the diffusion of Pb and Bi. Accordingly, as the first conduction film 52, palladium oxide film may be formed.

Then, as illustrated in FIG. 8M, the second conduction film 54 forming parts of the lower electrodes 56 is formed on the entire surface by, e.g., sputtering. As the second conduction film 54, a 100 nm-thickness Pt film, for example, is formed. The second conduction film 54 forms the lower electrodes 56 in cooperation with the first conduction film 52 described above.

The conditions for forming the second conduction film 54 are as exemplified below. That is, the atmosphere in the chamber is Ar atmosphere. The pressure int he chamber is, e.g., 0.2 Pa. The substrate temperature is 400° C. The sputtering power is 0.5 kW.

The material of the second conduction film 54 is Pt here but is not limited to Pt. For example, a Pt alloy film, a Pd film, a Pd alloy film or others may be used.

Next, the thermal processing by, e.g., RTA is subjected in an atmosphere of inert gas. As the inert gas, Ar gas, $N_2$ gas or $N_2O$ gas may be used. The thermal processing temperature is 650° C. or above. The thermal processing period of time is, e.g., about 60 seconds. The thermal processing is for improving the adhesion between the respective layers and the crystallinity of the lower electrodes 56. This thermal processing partially reduces the platinum oxide film forming the first conduction film 54 and improves the crystallinity of the lower electrodes 56.

Next, as illustrated in FIG. 8N, the first dielectric film 58 which is to be a part of the capacitor dielectric film 62 is formed on the entire surface by, e.g., sputtering.

In the present embodiment, the first dielectric film 58 is formed by sputtering, because when the dielectric film is formed directly on the lower electrodes 56 by MOCVD, abnormal oxidation takes place on the surfaces of the lower electrodes 56, and the dielectric film cannot have good quality. In the present embodiment, the first dielectric film 58 is formed by sputtering, and then, the second dielectric film 60 is formed by MOCVD to thereby form the capacitor dielectric film 62 of the first dielectric film 58 and the second dielectric film 60, whereby the occurrence of abnormal oxidation of the surfaces of the lower electrodes 56, and the capacitor dielectric film 62 of good quality can be formed.

The first dielectric film 58 can be, e.g. a $PbZr_xTi_{1-x}O_3$ film (PZT film). The PZT film is a ferroelectric film of perovskite crystal structure containing Pb. In order to improve the fatigue resistance characteristics of the capacitors, in order to improve the imprint characteristics, in order to decrease the leak current, and in order to move under the low voltage, etc., it is preferable to add additives, such as La, Ca, Sr, Nb, etc., to PZT. The addition amounts of these additives influence the switching charge of the capacitors, and preferably, the addition amounts of these additives are about 1-5 mol %. The first dielectric film 58 is formed here of PZT with Ca, La and Sr added to. The addition amount of Ca is, e.g., 5%, the addition amount of La is, e.g., 2% and the addition amount of Sr is, e.g., 2%.

The first dielectric film 58 is not essentially the PZT film. The principle of the present invention is applicably widely to the cases that a ferroelectric containing Pb or Bi or a high dielectric containing Pb or Bi is used as the material of the capacitor dielectric 62. For example, as the first dielectric film 58, $SrBi_2Ta_2O_9$ film (SBT film), for example, may be formed as the first dielectric film 58. An SBT film is a ferroelectric film of bismuth layer structure containing Bi.

A $PbLa(Zr,Ti)O_3$ film (PLZT film), which is a material with La added to PZT, may be formed as the first dielectric film 58. A material with at least one of La, Ca, Sr and Si added to PZT may be used as the material of the first dielectric film 58.

A $BiLaO_3$ film (BLT film), a $SrBi_2(Ta,Nb)_2O_9$ film (SBTN film), a $Bi_4Ti_3O_9$ film, a $(Bi,La)_4Ti_3O_{12}$ film, a $BiFeO_3$ film, a $SrBi_4Ti_4O_{15}$ film, a $(Bi_{1-x}R_x)Ti_3O_{12}$ film (R: rare earth element) or others may be formed as the first dielectric film 58.

A $(Pb,Ba,Sr)TiO_3$ or others may be used as the first dielectric film 58. These are high dielectric film containing Pb.

A $(Bi,Sr)TiO_3$ or others may be used as the first dielectric film 58. These are high dielectric film containing Bi.

The film thickness of the first dielectric film 58 is, e.g., 1-50 nm. The film thickness of the first dielectric film 58 is 20-30 nm here.

Then, the first dielectric film 58 is subjected to thermal processing by, e.g., RTA in an atmosphere containing oxygen. More specifically, the first dielectric film 58 is thermally processed in the atmosphere of the mixed gas of an inert gas and oxygen gas.

The thermal processing conditions are as follows. The thermal processing temperature is, e.g., 550-800° C. The thermal processing temperature is about 580° C. here. The flow rate of the oxygen gas is, e.g., 25 sccm or below. The flow rate of the Ar gas is, e.g., 2000 sccm. The thermal processing period of time is, e.g., 30-120 seconds. The thermal processing period of time is about 90 seconds here.

The suitable thermal processing temperature is different, depending on the kinds of the first dielectric film 58. For example, when the first dielectric film 58 is PZT or PZT with an additive added to, preferably the thermal processing temperature is 600° C. or below. When the first dielectric film 58 is formed of, e.g., BST, preferably the thermal processing temperature is 800° C. or below. When the first dielectric film 58 is formed of BLT, preferably the thermal processing temperature is 700° C. or below.

The first dielectric film 58 is formed by sputtering here but may be formed by sol-gel process. When the first dielectric film 58 is formed by sol-gel process as well, the second dielectric film of good quality can be formed on the first dielectric film 58 by MOCVD while the occurrence of abnormal oxidation of the surfaces of the lower electrodes 56 is being prevented.

Then, as illustrated in FIG. 8O, the second dielectric film 60 is formed on the entire surface by, e.g., MOCVD. As the second dielectric film 60, PZT film, for example, is formed.

When PZT film is formed by MOCVD, liquid raw materials of Pb, Zr and Ti are respectively vaporized to generate raw material gases, and by using these raw material gases, PZT film is formed.

The respective liquid raw materials of Pb, Zr and Ti are formed as follows. The liquid raw material of Pb is made by dissolving a 0.3 mol/l concentration, for example, of $Pb(DPM)_2$ in the solvent of THF (tetrahydrofuran). The liquid raw material of Zr is made by dissolving a 0.3 mol/l concentration, for example, of $Zr(dmhd)_4$ in the solvent of THE The liquid raw material of Ti is made by dissolving a 0.3 mol/l concentration, for example, of $[Ti(O\text{-}iOr)_2(DPM)_2]$ in the solvent of THF.

The raw material gases of PZT are generated by feeding the liquid raw material of Pb, the liquid raw material of Zr and the liquid raw material of Ti into an evaporator together with the solvent of THF and are evaporated by the evaporator. The feed amount of the solvent of THF is, e.g., 0.474 ml/min. The feed amount of the liquid raw material of Pb is, e.g., 0.326 ml/min. The feed amount of the liquid raw material of Zr is, e.g., 0.200 ml/min. The feed amount of the liquid raw material of Ti is, e.g., 0.200 nm/min.

The conditions for forming the second dielectric film 60 by MOCVD are as follows. That is, the pressure in the film forming chamber is, e.g., 665 Pa (5 Torr). The substrate temperature is, e.g., 620° C. The film forming period of time is, e.g., 620 seconds.

Under these conditions, the second dielectric film 60 of, e.g., a 80 nm-thickness PZT film is formed.

The second dielectric film 60 is not essentially PZT film. As described above, the principle of the present invention is applicable widely to cases that the capacitor dielectric film 62 is formed of a ferroelectric containing Pb or Bi, or a high dielectric containing Pb or Bi. For example, the second dielectric film 60 may be, e.g., $SrBi_2Ta_2O_9$ film (SBT film). As described above, SBT film is a ferroelectric film of bismuth layer structure containing Bi.

The second dielectric film 60 may be formed of $PbLa(Zr,Ti)O_3$ film (PLZT film) formed of PZT with La added to. The second dielectric film 60 may be formed of PZT with at least one of La, Ca, Sr and Si added to.

The second dielectric film 60 may be a $BiLaO_3$ film (BLT film), a $SrBi_2(Ta,Nb)_2O_9$ film (SBTN film), a $Bi_4Ti_3O_9$ film, a $(Bi,La)_4Ti_3O_{12}$ film, a $BiFeO_3$ film, a $SrBi_4Ti_4O_{15}$ film, a $(Bi_{1-x}R_x)Ti_3O_{12}$ film (R: rare earth element) or others.

A $(Pb,Ba,Sr)TiO_3$ or others may be used as the second dielectric film 60. These are high dielectric film containing Pb.

A $(Bi,Sr)TiO_3$ or others may be used as the second dielectric film 60. These are high dielectric films containing Bi.

The capacitor dielectric film 62 of the two-layer structure is formed here, i.e., the first dielectric film 58 is formed by sputtering or sol-gel process, and the second dielectric film 60 is formed by MOCVD to thereby form the capacitor dielectric film 62. However, the capacitor dielectric film 62 is not essentially has the two-layer structure and may have a single-layer structure. That is, the capacitor dielectric film 62 may be formed of the single-layer structure by sputtering or sol-gel process. However, the capacitor dielectric film 62 containing the second dielectric film 60 formed by MOCVD is superior in the electric characteristics to the capacitor dielectric film 62 of the single-layer structure formed by sputtering or sol-gel process. Accordingly, in view of forming the dielectric capacitors 72 of good electric characteristics, it is preferable to form the first dielectric film 58 by sputtering or sol-gel process, and the second dielectric film 60 is formed by MOCVD to thereby form the capacitor dielectric film 62 of the first dielectric film 58 and the second dielectric film 60.

Figure 8P:
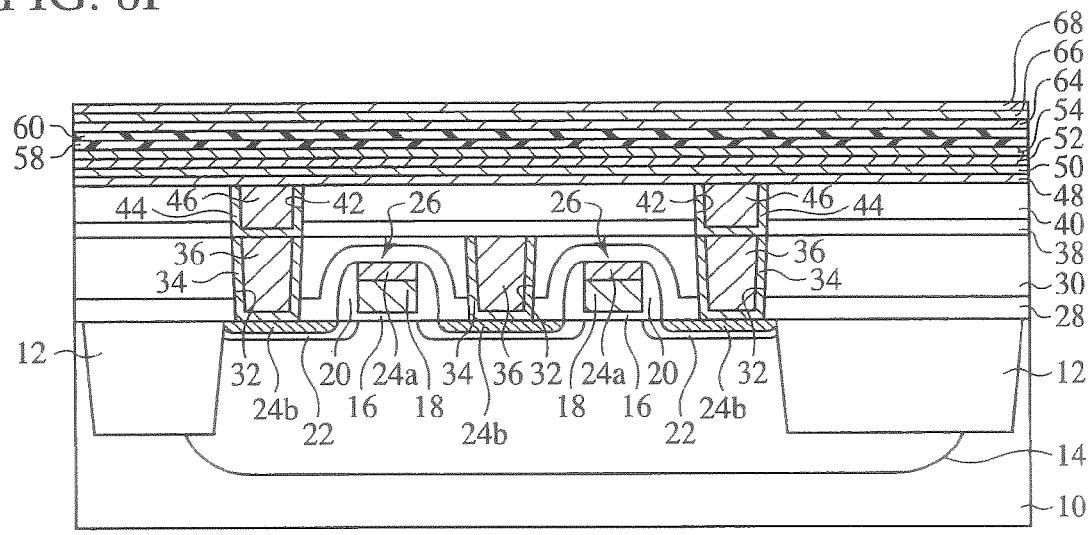

Then, as illustrated in FIG. 8P, the first conduction film 64 which is to be parts of the upper electrodes 70 is formed on the entire surface by, e.g., sputtering. As the first conduction film 64, crystalline $IrO_X$ film, for example, is formed. The film thickness of the $IrO_X$ film is, e.g., about 50 nm. The oxygen composition ratio X of the $IrO_X$ film is, e.g., about 1.3-1.9.

The conditions for forming the first conduction film 64 of $IrO_X$ film are as exemplified below. The film forming temperature is, e.g., 300° C. The atmosphere in the chamber is the atmosphere of the mixed gas of Ar gas and $O_2$ gas. The flow rate of the Ar gas is, e.g., 140 sccm. The flow rate of the $O_2$ gas is, e.g., 60 sccm. The sputtering power is, e.g., 1-2 kW.

Next, thermal processing is made in an atmosphere containing oxygen by, e.g., RTA. This thermal processing is for sufficiently crystallizing the capacitor dielectric film 62, improving the film quality of the first conduction film 64 of $IrO_X$ film and compensating oxygen losses of the capacitor dielectric film 62.

The conditions for the thermal processing are as exemplified below. The thermal processing temperature is, e.g., about 725° C. The atmosphere in the chamber is the mixed atmosphere of Ar gas and $O_2$ gas. The flow rate of the Ar gas is 2000 sccm. The flow rate of the $O_2$ gas is, e.g., 20 sccm. The thermal processing period of time is, e.g., 60 seconds.

This thermal processing reduces the platinum oxide forming the first conduction film 52 of the lower electrodes 56 to make the platinum oxide film a Pt film (Pt film containing oxygen). Even when the platinum oxide film forming the first conduction film 52 is reduced and changed into Pt film (Pt film containing oxygen), the Pb or Bi in the first conduction film 52 remains in the first conduction film 52. The Pb or Bi in the first conduction film 52 never arrives at the interface between the lower electrodes 56 and the oxygen barrier film 50.

Then, the second conduction film 66 to be parts of the upper electrodes 70 is formed on the entire surface by, e.g., sputtering. As the second conduction film 66, a 100-300 nm-thickness $IrO_Y$ film is formed. It is preferable that the second conduction film 66 of such $IrO_Y$ film has a stoichiometric composition. That is, it is preferable that the composition ratio Y of oxygen of the $IrO_Y$ film is 2. The $IrO_Y$ film has the stoichiometric composition, because the $IrO_Y$ film is prohibited from causing the catalytic reaction to hydrogen, whereby the capacitor dielectric film 62 is prevented from being reduced with hydrogen radicals. The conditions for forming the $IrO_Y$ film are as exemplified below. The atmosphere in the chamber is the mixed atmosphere of Ar gas and $O_2$ gas. The flow rate of the Ar gas is, e.g., 100 sccm. The flow rate of the $O_2$ gas is, e.g., 100 sccm. The pressure in the chamber is, e.g., 0.8 Pa. The sputtering power is, e.g., 1.0 kW. When the $IrO_Y$ film is formed for, e.g., 79 seconds under these film forming conditions, the $IrO_Y$ film has, e.g., 200 nm-thickness.

The second conduction film 66 forming the upper electrodes 70 is $IrO_Y$ film here but is not limited to $IrO_Y$ film. For example, Ir, Ru, Ru oxide, Rh, Rh oxide, Re, Re oxide Os, Os oxide, Pd, Pd oxide or others may be formed as the material of the second conduction film 66 forming the upper electrodes 70. A conductive oxide, such as $SrRuO_3$ or others, may be used as the material of the second conduction film 66 forming the upper electrodes 70. The layer film of these materials may be used as the second conduction film 66 forming the upper electrodes 70.

Then, the third conduction film 68 to be parts of the upper electrodes 70 is formed on the entire surface by, e.g., sputtering. As the third conduction film 68, a 50-100 nm-thickness Ir film, for example is formed. The third conduction film 68 functions as the hydrogen barrier film (hydrogen diffusion preventing film) which prevents the reduction of the capacitor dielectric film 62 with hydrogen. The third conduction film 68 functions also as the conduction improving film for ensuring the good contact between the upper electrodes 70 and the conductor plugs 94.

The conditions for forming the third conduction film 68 are as exemplified below. The atmosphere in the chamber is Ar gas atmosphere. The pressure in the chamber is, e.g., 1 Pa. The sputtering power is, e.g., 1 kW.

The third conduction film 68 forming the upper electrodes 70 is the Ir film here but is not limited to the Ir film. As the third conduction film 68, a Ru film, a Rh film, a Pd film or others may be formed.

Next, the underside (back surface) of the semiconductor substrate 10 is cleaned.

Figure 8Q:
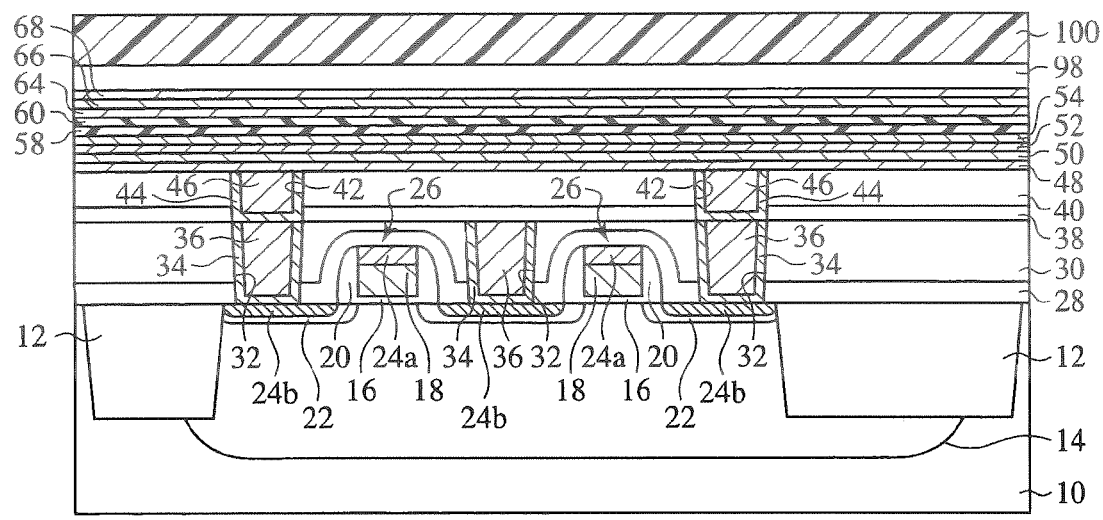

Then, as illustrated in FIG. 8Q, the TiN film 98 is formed on the entire surface by sputtering. The TiN film 98 forms a part of the hard mask to be used in patterning the upper electrodes 70, the capacitor dielectric film 62, the lower electrodes 56, the oxygen barrier film 50 and the adhesion layer 48.

Then, the 700 nm-thickness silicon oxide film 100 is formed on the entire surface by CVD using TEOS gas. The silicon oxide film 100 is a part of the hard mask to be used in patterning the upper electrodes 70, the capacitor dielectric film 62, the lower electrodes 56, the oxygen barrier film 50 and the adhesion layer 48 and forms the hard mask in cooperation with the TiN film 98.

Figure 8R:
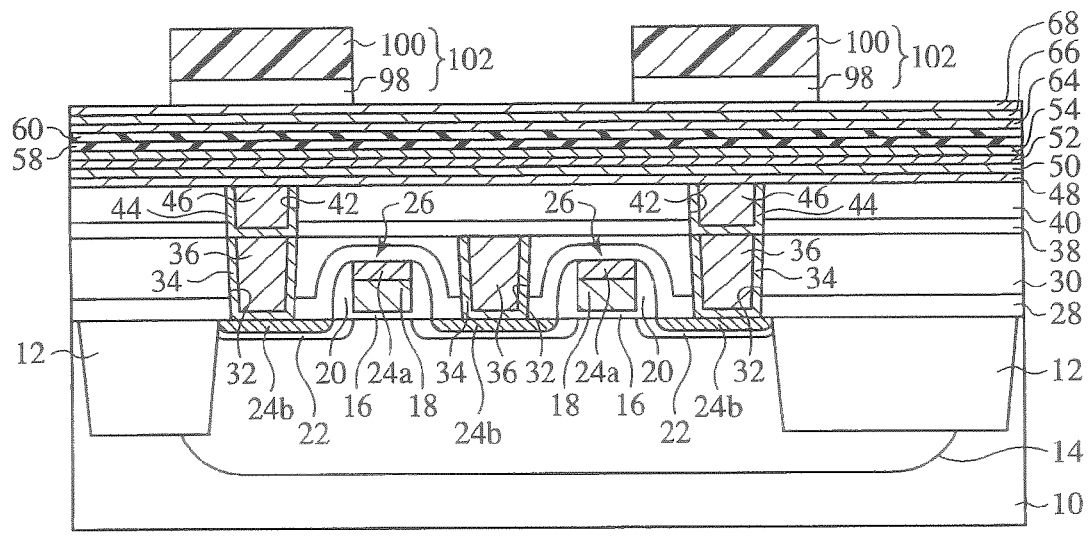
Figure 8S:
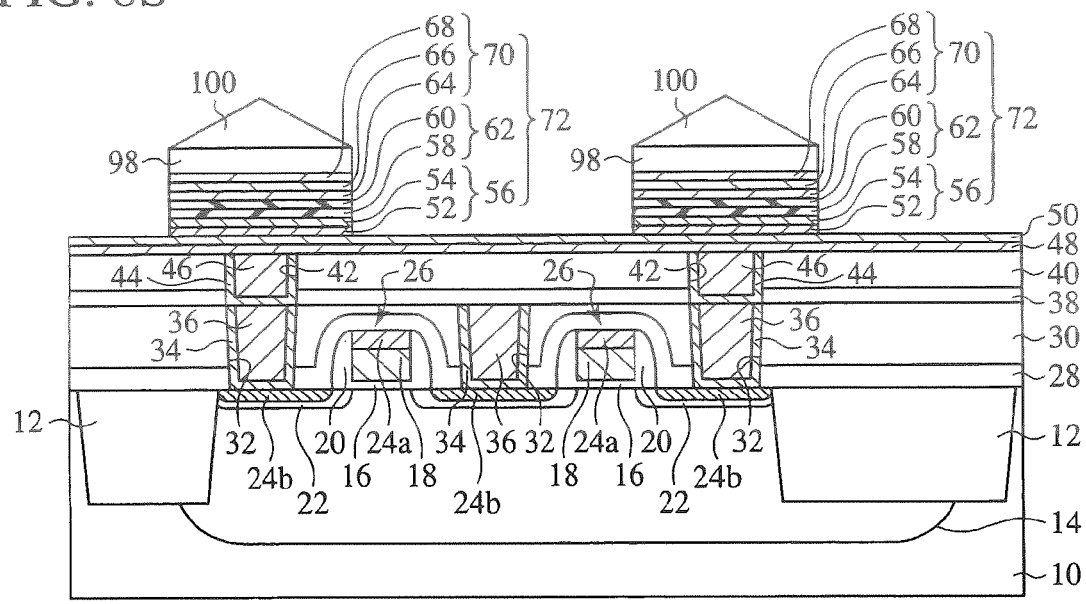

Then, as illustrated in FIG. 8R, the silicon oxide film 100 is patterned into the plane shape of the capacitors 72 by photolithography.

Next, with the silicon oxide film 100 as the mask, the TiN film 98 is patterned. Thus, a hard mask 102 of the TiN film 98 and the silicon oxide film 100 is formed.

Next, with the hard mask 102 as the mask, the third conduction film 68, the second conduction film 66, the first conduction film 64, the second dielectric film 60, the first dielectric film 58, the second conduction film 54 and the first conduction film 52 are patterned by plasma etching. Thus, the lower electrodes 56 of the first conduction film 52 and the second conduction film 54 are formed. The capacitor dielectric film 62 of the first dielectric film 58 and the second dielectric film 60 is formed. The upper electrodes 70 of the first conduction film 64, the second conduction film 66 and the third conduction film 68 are formed. The capacitors 72 are formed of the lower electrodes 56, the capacitor dielectric film 62 and the upper electrodes 70 (see FIG. 8S).

Figure 8T:
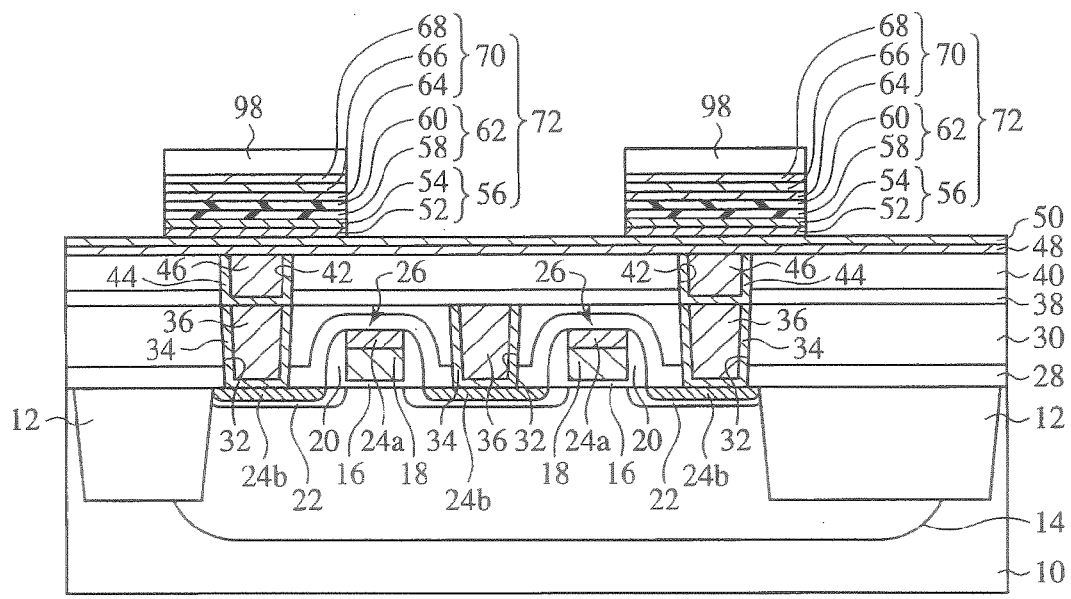
Figure 8U:
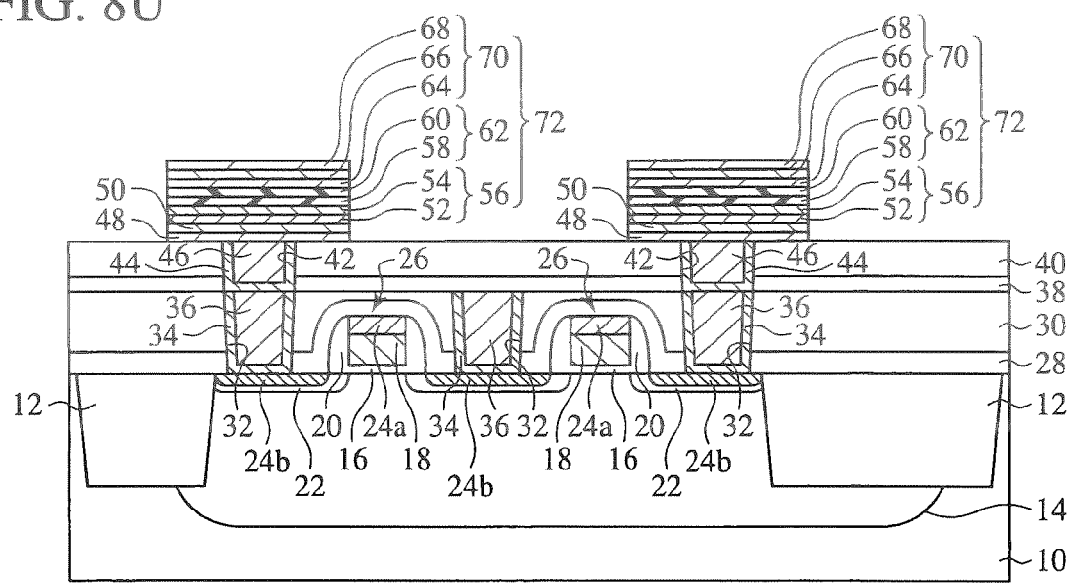

Next, as illustrated in FIG. 8T, the silicon oxide film 100 of the hard mask 102 is etched off by dry etching or wet etching.

Next, with the TiN film 98 as the mask, the oxygen barrier film 50 and the adhesion layer 48 are etched by dry etching. At this time, the TiN film 98 on the capacitors 72 is also etched off (see FIG. 8U).

Figure 8V:
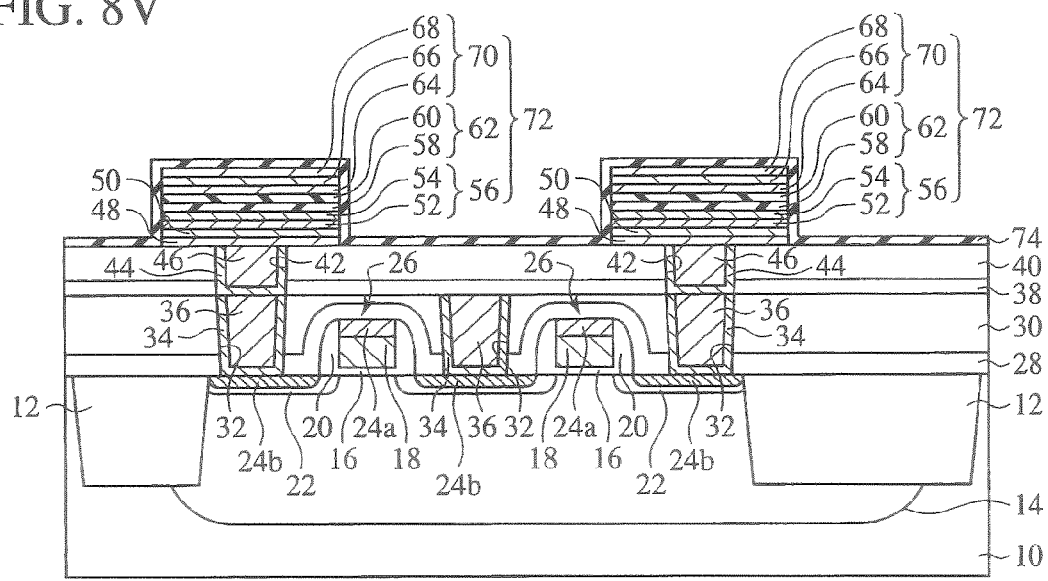

Then, as illustrated in FIG. 8V, the hydrogen barrier film 74 is formed on the entire surface by, e.g., sputtering. As the hydrogen barrier film 74, a 20 nm-thickness aluminum oxide film, for example, is formed.

Then, thermal processing is made in a atmosphere containing oxygen. This thermal processing is for feeding oxygen to the capacitor dielectric film 62, improving the film quality of the capacitor dielectric film 62 to thereby form the capacitors 72 of good electric characteristics.

The substrate temperature for the thermal processing is, e.g., 550-700° C. When the capacitor dielectric film 62 is PZT film, the substrate temperature is, e.g., 650° C., and the thermal processing period of time is, e.g., 60 minutes. The thermal processing conditions are not limited to them and can be suitably set.

Figure 8W:
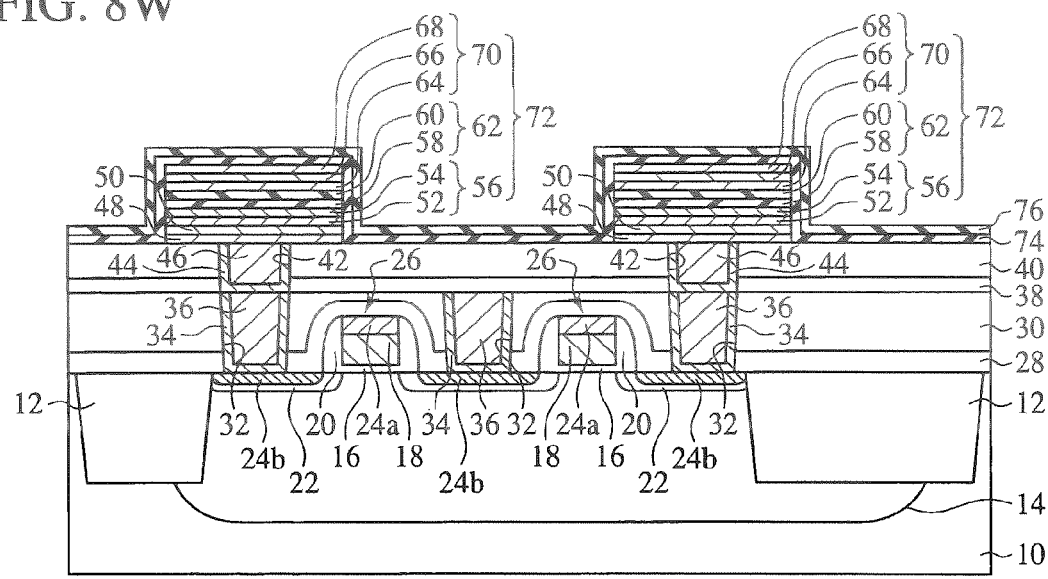

Then, as illustrated in FIG. 8W, the hydrogen barrier film 76 is formed on the entire surface by, e.g., CVD. As the hydrogen barrier film 76, a 20 nm-thickness aluminum oxide film, for example, is formed.

Next, the inter-layer insulation film 78 of, e.g., a 1500 nm-thickness silicon oxide film is formed on the entire surface by, e.g., plasma TEOSCVD. The raw material gases for forming the inter-layer insulation film 78 are, e.g., the mixed gas of TEOS gas, oxygen gas and helium gas.

The inter-layer insulation film 78 is silicon oxide film here but is not limited to silicon oxide film. An insulating organic film can be suitably used as the inter-layer insulation film 78.

Figure 8X:
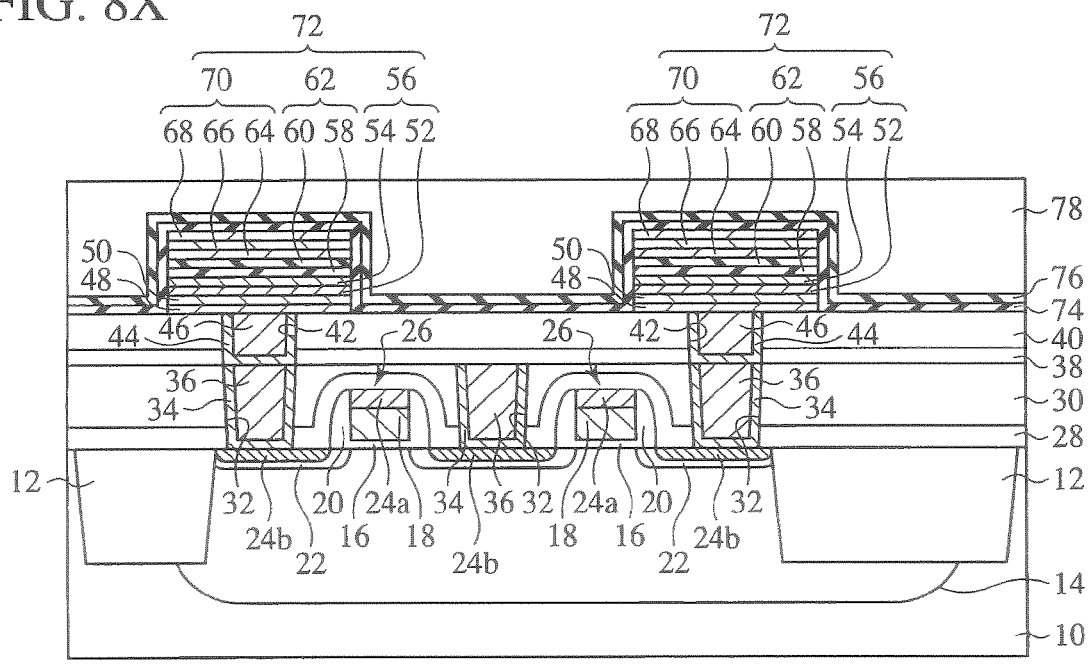

Next, the surface of the inter-layer insulation film 78 is planarized by, e.g., CMP (see FIG. 8X).

Next, thermal processing is made in a plasma atmosphere generated by using $N_2O$ gas or $N_2$ gas. This thermal processing is for removing water in the inter-layer insulation film 78, modifying the film quality of the inter-layer insulation film 78 to thereby make it difficult for water to intrude into the inter-layer insulation film 78.

Figure 8Y:
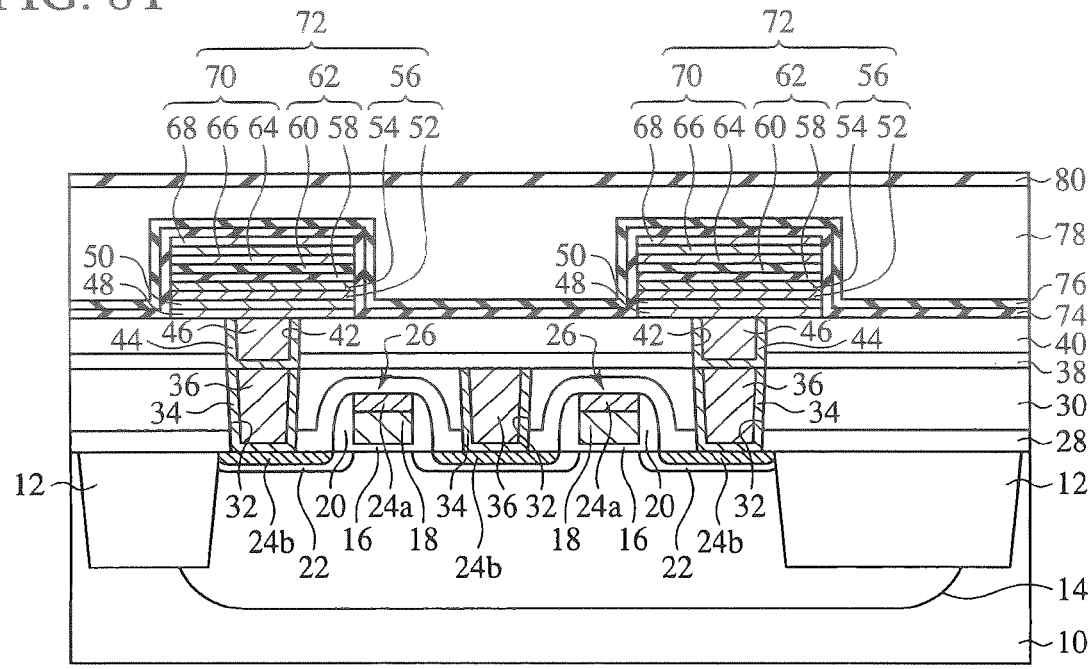

Then, as illustrated in FIG. 8Y, the hydrogen barrier film 80 is formed on the entire surface by, e.g., sputtering or CVD. As the hydrogen barrier film 80, a 20-100 nm-thickness aluminum oxide film is formed. Since the hydrogen barrier film 80 is formed on the planarized inter-layer insulation film 78, the inter-layer insulation film 78 becomes flat.

Then, the inter-layer insulation film 82 is formed on the entire surface by, e.g., plasma TEOSCVD. As the inter-layer insulation film 82, a 300-500 nm-thickness silicon oxide film, for example, is formed.

The inter-layer insulation film 82 is silicon oxide film here but is not limited to silicon oxide film. As the inter-layer insulation film 82, SiON film or silicon nitride film, for example, may be formed.

Figure 8Z:
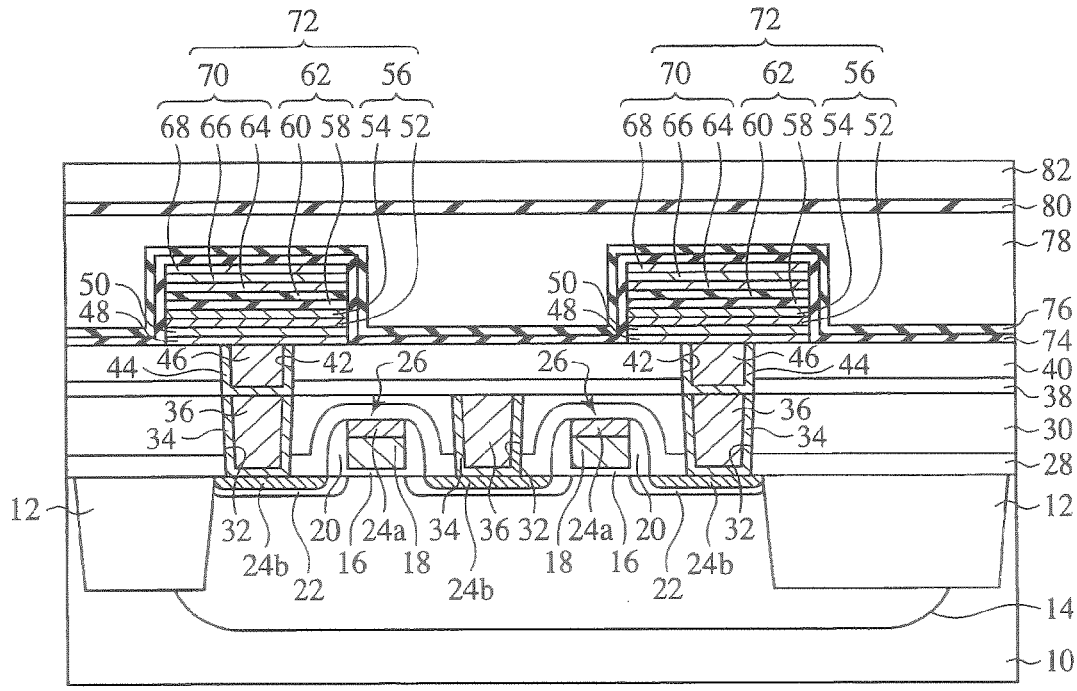
Figure 8A:
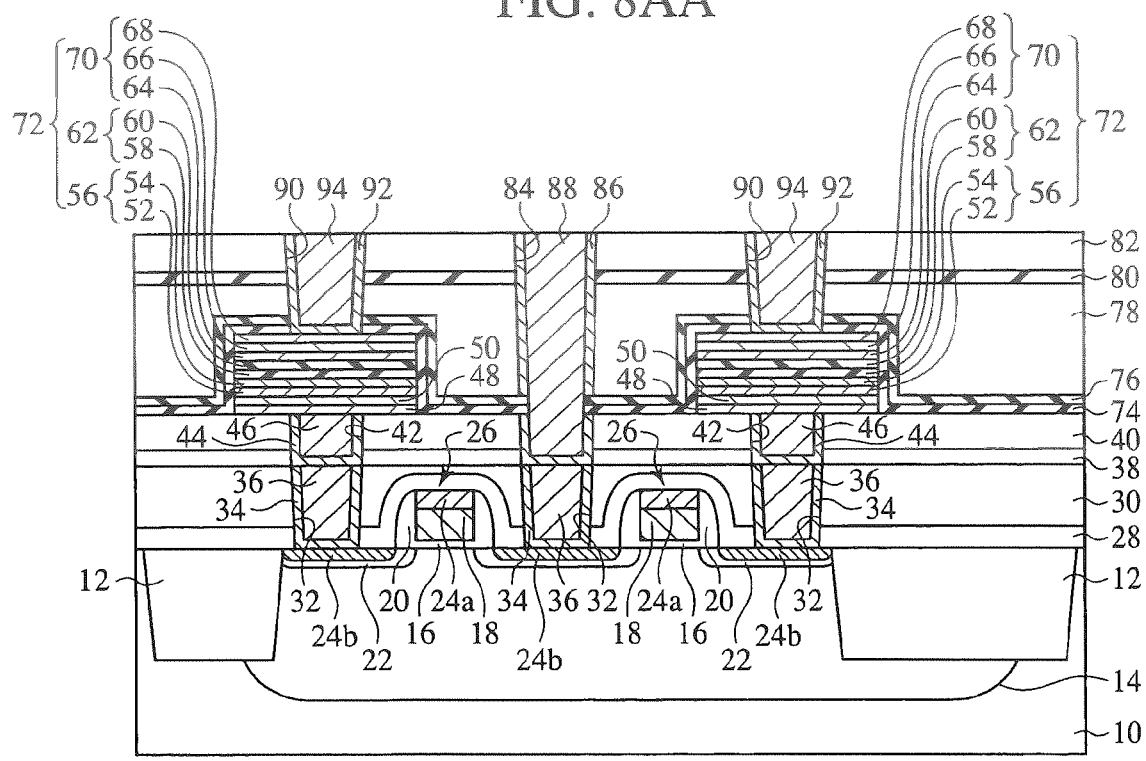
Figure 8A:
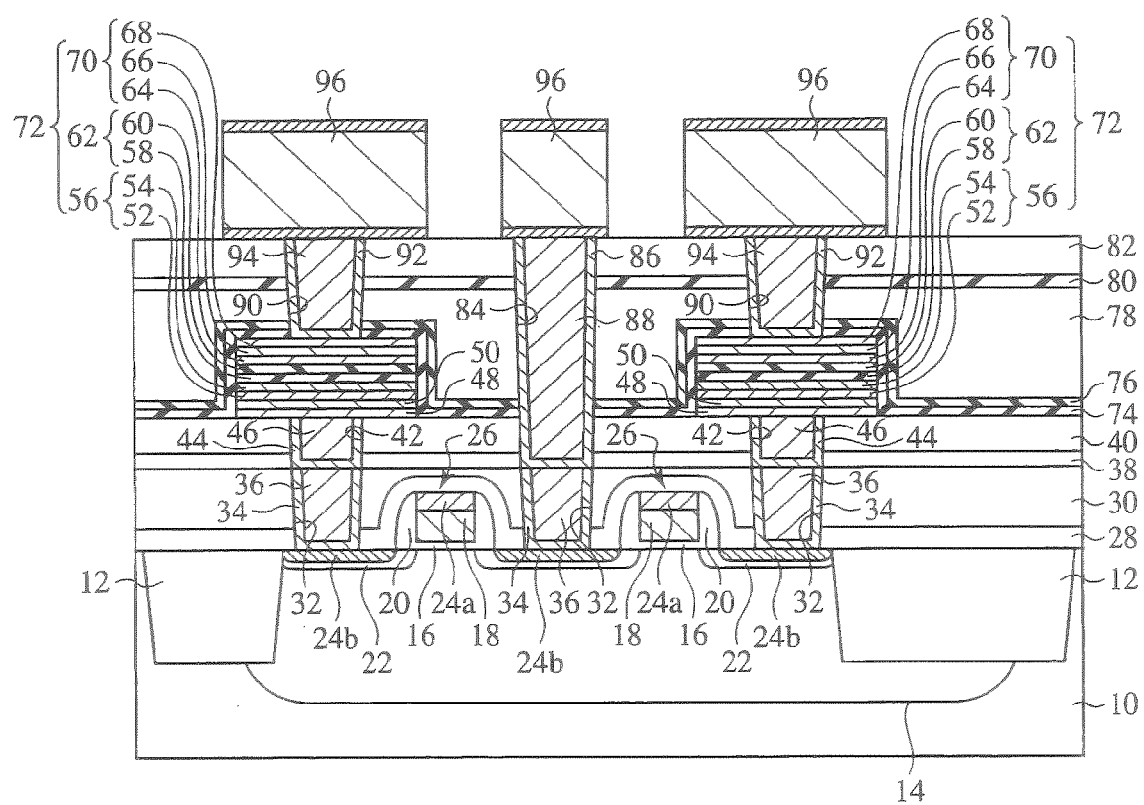

Next, the surface of the inter-layer insulation film 82 is planarized by, e.g., CMP (see FIG. 8Z).

Next, by photolithography, the contact holes 84 are formed down to the conductor plugs 36 in the inter-layer insulation film 82, the hydrogen barrier film 80, the inter-layer insulation film 78, the hydrogen barrier film 76, the hydrogen barrier film 74, the inter-layer insulation film 40 and the oxidation preventing film 38.

Then, a 125 nm-thickness TiN film 86 is formed on the entire surface by, e.g., sputtering. Thus, the adhesion layer 86 of the TiN film is formed.

Next, a 300 nm-thickness tungsten film 88 is formed o the entire surface by, e.g., CVD.

Next, the tungsten film 88, the adhesion layer 86 are polished by, e.g., CMP until the surface of the inter-layer insulation film 82 is exposed. Thus, the conductor plugs 88 of tungsten are buried in the contact holes 84.

Then, by photolithography, the contact holes 90 are formed down to the upper electrodes 70 of the capacitors 72 in the inter-layer insulation film 82, the hydrogen barrier film 80, the inter-layer insulation film 78, the hydrogen barrier film 76 and the hydrogen barrier film 74.

Then, thermal processing is made in an oxygen atmosphere. This thermal processing is for feeding oxygen to the capacitor dielectric film 62 and recovering the electric characteristics of the capacitors 72. The substrate temperature for the thermal processing is, e.g., 550° C.

Then, a 125 nm-thickness TiN film 92 is formed on the entire surface by, e.g., sputtering. Thus, the adhesion layer 92 of TiN film is formed.

Next, a 300 nm-thickness tungsten film 94 is formed on the entire surface by, e.g., CVD.

Next, the tungsten film 94 and the adhesion layer 92 are polished by, e.g., CMP until the surface of the inter-layer insulation film 82 is exposed. Thus, the conductor plugs 94 of tungsten are buried in the contact holes 90 (see FIG. 8AA).

Then, a 60 nm-thickness Ti film, a 30 nm-thickness TiN film, a 360 nm-thickness AlCu alloy film, a 5 nm-thickness Ti film and a 70 nm-thickness TiN film are sequentially formed by, e.g., sputtering. Thus, the layer film 96 of the Ti film, the TiN film, AlCu alloy film, the Ti film and TiN film is formed.

Next, the layer film 96 is patterned by photolithography. Thus, the interconnections (the first metal interconnection layer) 96 of the layer film are formed (see FIG. 8AB).

Then, on the inter-layer insulation film 82 with the interconnections 96 formed on, inter-layer insulation films (not illustrated), conductor plugs (not illustrated), interconnections (not illustrated), etc. are formed in a plurality of layers. A cover film (not illustrated) of a silicon oxide film ad an SiN film is formed on the top layer.

Thus, the semiconductor device according to the present embodiment is manufactured.

As described above, the semiconductor device according to the present embodiment is characterized mainly in that the lower electrodes 56 are formed of the first conduction film 52 of platinum oxide or palladium oxide, and the second conduction film 54 formed of Pt, Pt alloy, Pd or Pd alloy on the first conduction film 52. The first conduction film 52 of platinum oxide, etc. has the function of preventing the diffusion of Pb and Bi. Thus, according to the present embodiment, even when the Pb or Bi contained in the capacitor dielectric film 62 arrives at the lower electrodes 56, the arrival of the Pb or Bi at the interface between the lower electrodes 56 and the oxygen barrier film 50 can be prevented. Accordingly, the reaction of the Pb or Bi with the oxygen barrier film 50 can be prevented, and consequently, the release of the lower electrodes 56 from the oxygen barrier film 50 can be prevented. On the second conduction film 54 of Pt or others, the capacitor dielectric film 62 of good crystallinity can be formed. Thus, according to the present embodiment, the semiconductor device including capacitors 72 of good electric characteristics and high reliability can be provided.

(Evaluation Result)

Figure 9A:
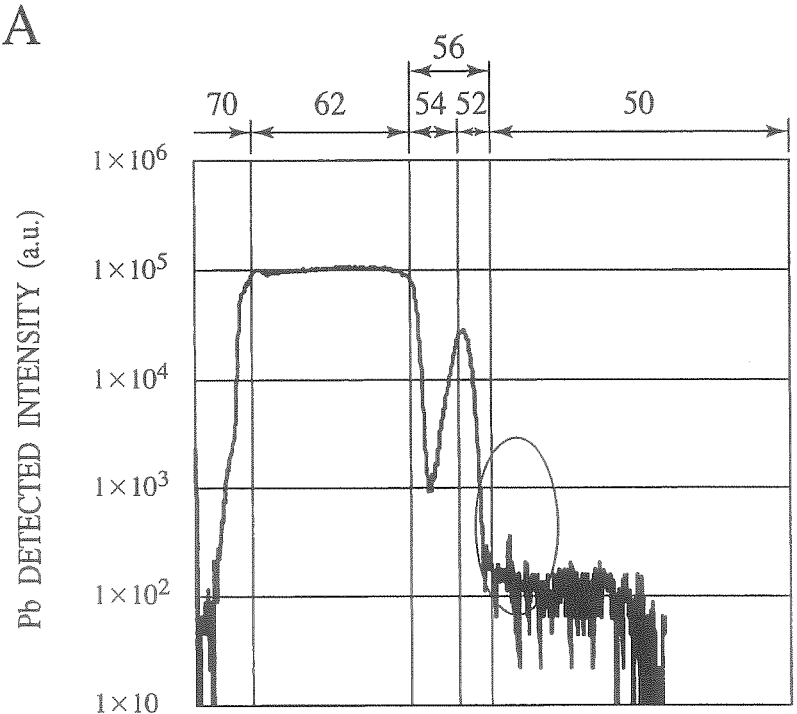
FIGS. 9A and 9B are graphs of Pb concentration distributions given by secondary ion mass spectroscopy.
Figure 9B:
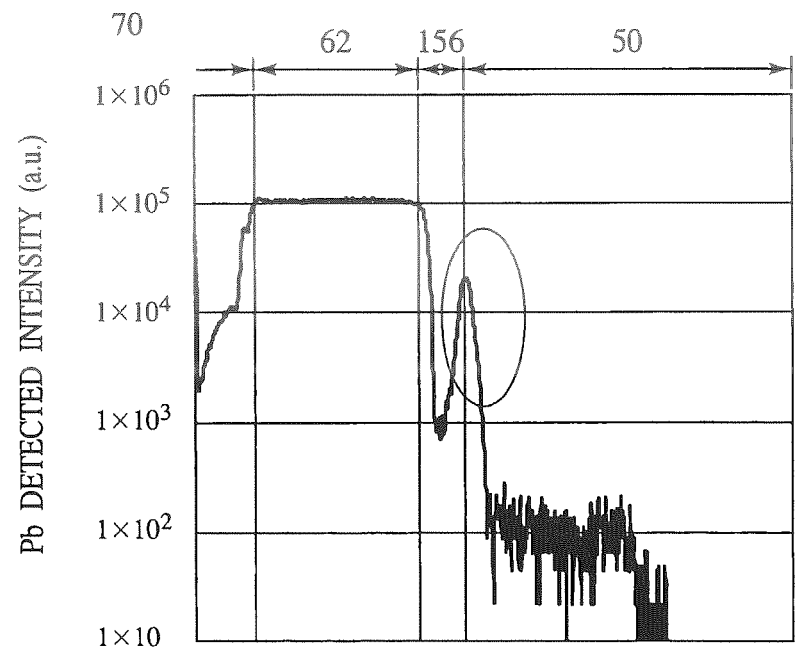

The evaluation result of the semiconductor device according to the present embodiment will be explained with reference to FIGS. 9A and 9B. FIGS. 9A and 9B are graphs of Pb concentration distributions given by secondary ion mass spectroscopy. The detected intensities of Pb ions given by the mass spectroscope are taken on the vertical axis.

FIG. 9A shows the Pb concentration distribution of the semiconductor device according to the present embodiment, in which the lower electrodes 56 of the first conduction film 52 of platinum oxide and the second conduction film 54 of Pt are formed on the oxygen barrier film 50, the capacitor dielectric film 62 containing Pb is formed on the lower electrodes 56, and the upper electrodes 70 are formed on the capacitor dielectric film 62.

On the other hand FIG. 9B shows the Pb concentration distribution of a control in which the lower electrodes 156 of Pt are formed on the oxygen barrier film 50, the capacitor dielectric film 62 containing Pb is formed on the lower electrodes 156, and the upper electrodes 70 are formed on the capacitor dielectric film 62.

As evident in FIG. 9B, in the control, the peak of the concentration of Pb diffused from the capacitor dielectric film 62 positions in the interface between the oxygen barrier film 50 and the lower electrodes 256.

In the semiconductor device according to the control, the lower electrodes 156 were released from the oxygen barrier film 50 after the capacitor dielectric film 62 was formed or after the upper electrodes 70 were formed.

In contrast to this, in the present embodiment, as evident in FIG. 9A, the concentration peak of Pb diffused from the capacitor dielectric film 62 positions inside the lower electrodes 56. To be more specific, the concentration peak of the Pb diffused from the capacitors 62 positions in the interface between the first conduction film 52 and the second conduction film 54 and is remote from the interface between the lower electrodes 56 and the oxygen barrier film 50. As evident in FIG. 9A, the concentration of Pb in the interface between the lower electrodes 56 and the oxygen barrier film 50 is $1/100$ or below of the concentration peak of Pb inside the lower electrodes 56.

In the semiconductor device according to the present embodiment, the lower electrodes 56 were never released from the oxygen barrier film 50.

As described above, according to the present embodiment, the arrival of Pb, etc. diffused from the capacitor dielectric film 62 at the interface between the lower electrodes 56 and the oxygen barrier film 50 can be prevented, and the reaction of the oxygen barrier film 50 with the Pb, etc. can be prevented. Thus, according to the present embodiment, the adhesion between the lower electrodes 56 and the oxygen barrier film 50 can be prevented from being impaired, and consequently, the release of the lower electrodes 56 from the oxygen barrier film 50 can be prevented.

[A Second Embodiment]

Figure 10:
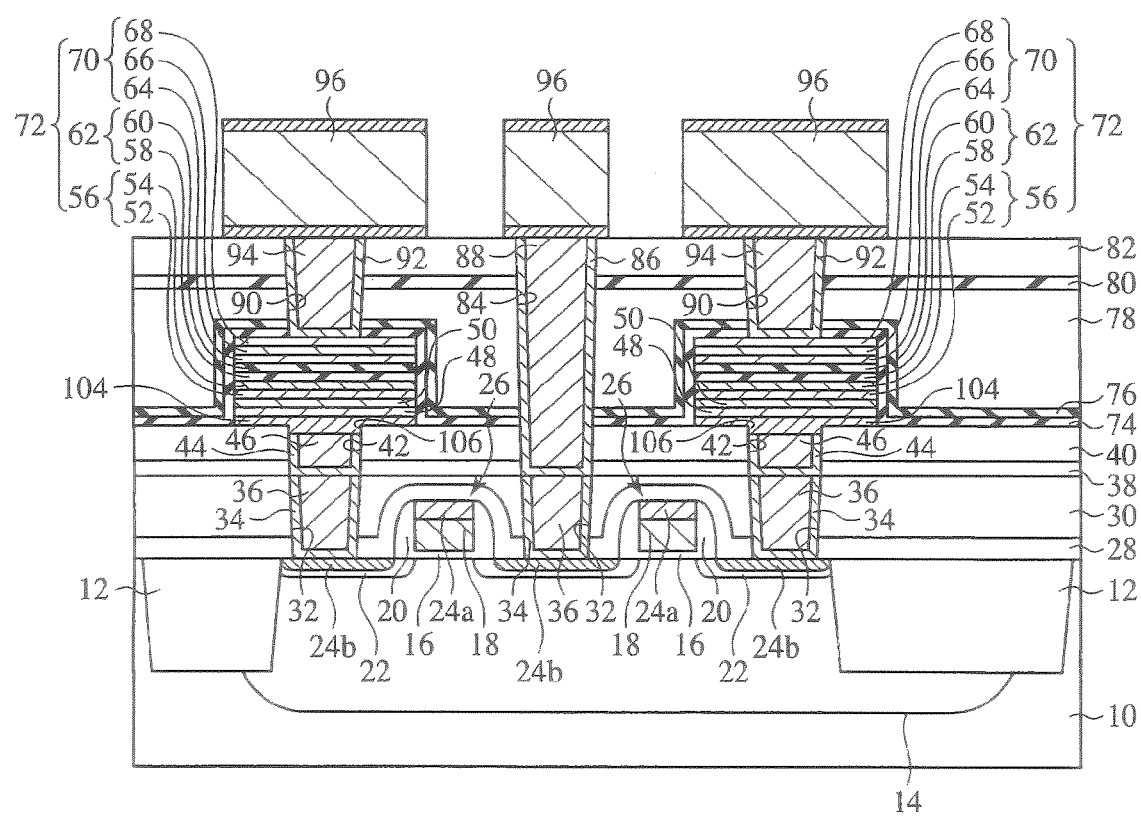
FIG. 10 is a cross-section diagram of the semiconductor device.

The semiconductor device according to a second embodiment of the present invention and the method for manufacturing the semiconductor device will be explained with reference to FIGS. 10 to 11H. FIG. 10 is a cross-section diagram of the semiconductor device. The same members of the present embodiment as those of the semiconductor device according to the first embodiment and the method for manufacturing the semiconductor device illustrated in FIGS. 7 to 9B are represented by the same reference numbers not to repeat or to simplify their explanation.

(The Semiconductor Device)

First, the semiconductor device according to the present embodiment will be explained with reference to FIG. 10.

The semiconductor device according to the present embodiment is characterized mainly in that a planarization layer (base layer) 104 is formed on conductor plugs 46 and an inter-layer insulation film 40, and an adhesion layer 48, an oxygen barrier film 50 and capacitors 72 are formed on the planarization layer 104.

When the conductor plugs 46 are buried in the inter-layer insulation film 40 by CMP, often the tops of the conductor plugs 46 are excessively polished, and the height of the upper surfaces of the conductor plugs 46 is lower than the height of the upper surface of the inter-layer insulation film 40. In such case, cavities 106 are formed at the places where the conductor plugs 46 are buried. The depth of such cavities is, e.g., 20-50 nm. When the adhesion layer 48 is formed on the conductor plugs 46 having such concavities 106 formed in and on the inter-layer insulation film 40, cavities reflecting the cavities 106 are formed also in the surface of the adhesion layer 48. When the oxygen barrier film 50 is formed on such adhesion layer 48, cavities reflecting such cavities are formed also in the surface of the oxygen barrier film 50. It is difficult to form lower electrodes 56, a capacitor dielectric film 62 and upper electrodes 70 of good orientation on the oxygen barrier film 50 having such cavities formed in.

In the present embodiment, as illustrated in FIG. 10, the base layer 104 is formed on the conductor plugs 46 and the inter-layer insulation film 40, filling the cavities 106. The surface of the base layer 104 is planarizaed by CMP.

On the base layer 104, an adhesion layer 48 is formed. Since the adhesion layer 48 is formed on the planarized base layer (planarization layer) 104, the surface of the adhesion layer 48 is flat.

The oxygen barrier film 50 is formed on the adhesion layer 48. Since the oxygen barrier film 50 is formed on the planarized adhesion layer 48, the surface of the oxygen barrier film 50 is flat.

Lower electrodes 56 are formed on the oxygen barrier film 50. Since the lower electrodes 56 is formed on the planarized oxygen barrier film 50, the lower electrodes 56 have good orientation.

A capacitor dielectric film 62 is formed on the lower electrodes 56. Since the capacitor dielectric film 62 is formed on the planarized lower electrodes 56, the capacitor dielectric film 62 has good orientation.

Upper electrodes 70 are formed on the capacitor dielectric film 62. Since the upper electrodes 70 is formed on the planarized capacitor dielectric film 62, the upper electrodes 70 have good orientation.

As described above, according to the present embodiment, the lower electrodes 56, the capacitor dielectric film 62 and the upper electrodes 70 are formed on the planarized base layer (planarization layer) 104, whereby the lower electrodes 56, the capacitor dielectric film 62 and the upper electrodes 70 of good orientation can be formed. Thus, the semiconductor device according to the present embodiment can include the capacitors 72 of good electric characteristics.

(The Method for Manufacturing the Semiconductor Device)

Next, the method for manufacturing the semiconductor device according to the present embodiment will be explained with reference to FIGS. 11A to 11H. FIGS. 11A to 11H are cross-section diagrams of the semiconductor device according to the present embodiment in the steps of the method for manufacturing the semiconductor device, which illustrate the method.

Figure 11A:
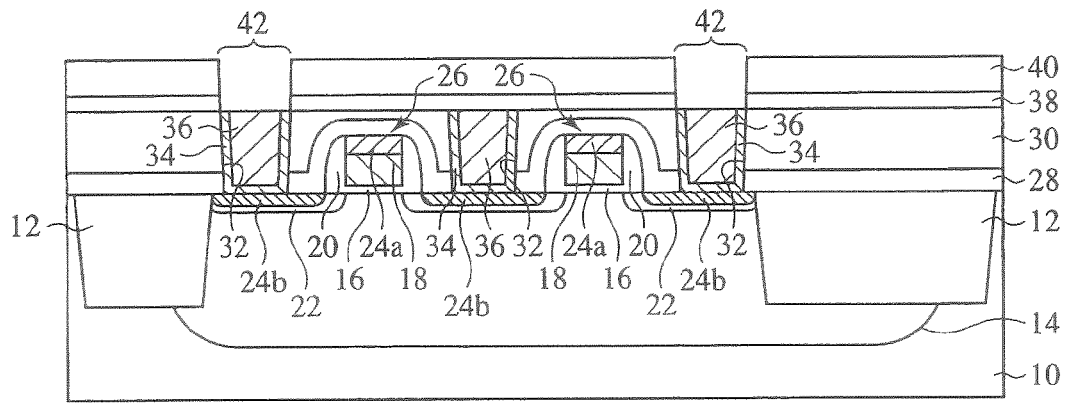
FIGS. 11A to 11H are cross-section diagrams of the semiconductor device according to the present embodiment in the steps of the method for manufacturing the semiconductor device, which illustrate the method.

First, the step of forming device isolation regions 12 in a semiconductor substrate 10 up to the step of forming the contact holes 42 down to the conductor plugs 36 including the step of contact holes 42 forming step are the same as those of the method for manufacturing the semiconductor device according to the first embodiment illustrated in FIGS. 8A to 8G, and their explanation will not be repeated (see FIG. 11A).

Next, a 30 nm-thickness Ti film, for example, is formed on the entire surface by, e.g., sputtering.

Next, a 20 nm-thickness TiN film, for example, is formed on the entire surface by, e.g., sputtering. The Ti film and the TiN film form the adhesion layer 44.

Next, a 300 nm-thickness tungsten film 46, for example, is formed on the entire surface by, e.g., CVD.

Figure 11B:
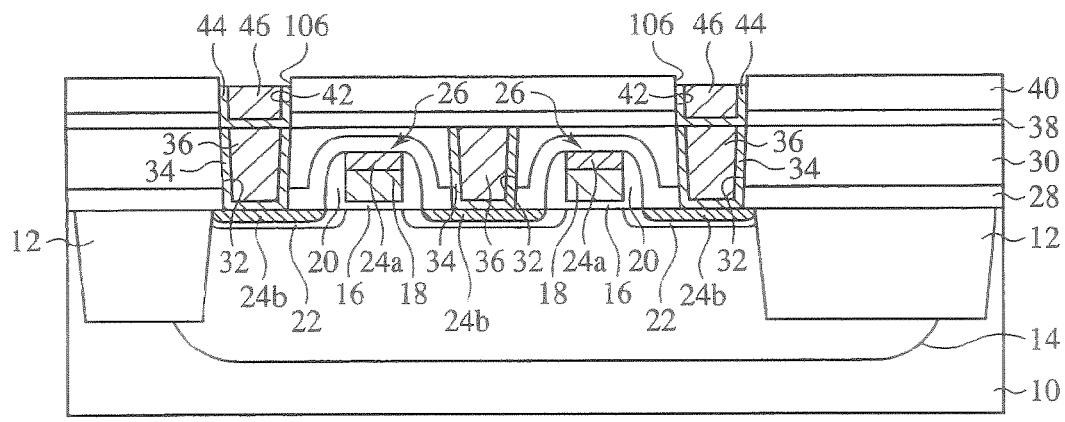

Then, the tungsten film 46 and the adhesion layer 44 are polished by, e.g., CMP until the surface of the inter-layer insulation film 40 is exposed. When the tungsten film 46 and the adhesion layer 44 are polished, it is often that the tungsten film 46 and the adhesion layer 44 are excessively polished, and as illustrated in FIG. 11B, the height of the upper surfaces of the conductor plugs 46 is lower than the height of the upper surface of the inter-layer insulation film 40. In such case, cavities 106 are formed in the places where the conductor plugs 46 are buried. The depth of such cavities 106 is, e.g., 20-50 nm.

Next, the surface of the inter-layer insulation film 40 is exposed to a plasma atmosphere generated by using $NH_3$ gas to process the surface of the inter-layer insulation film 40 (plasma processing). In the present embodiment, the surface of the inter-layer insulation film 40 is exposed to a plasma atmosphere generated by using $NH_3$, because oxygen atoms in the surface of the inter-layer insulation film 40 are bonded with NH groups to thereby prevent Ti atoms from being captured by oxygen atoms in the surface of the inter-layer insulation film 40 when a Ti film 103 is formed on the inter-layer insulation film 40 in a later step.

The conditions for the plasma processing are as follows. The plasma processing system is a parallel plate plasma processing system. The opposed electrodes are spaced from the semiconductor substrate 10 by, e.g., about 9 mm (350 mils). The pressure in the chamber for the plasma processing is, e.g., about 266 Pa (2 Torr). The substrate temperature is, e.g., 400° C. The flow rate of $NH_3$ gas to be fed into the chamber is, e.g., 350 sccm. The high-frequency electric power to be applied to the semiconductor substrate 10 is, e.g., 13.56 MHz, 100 W. The high-frequency electric power to be applied to the opposed electrodes is, e.g., 350 kHz, 55 W. The application period of time of the high-frequency electric power is, e.g., 60 seconds.

The surface of the inter-layer insulation film 40 is processed here by exposing the surface of the inter-layer insulation film 40 to a plasma atmosphere generated by using $NH_3$ gas, but the plasma atmosphere is not limited to the plasma atmosphere generated by using $NH_3$ gas. The surface of the inter-layer insulation film 40 may be exposed to a plasma atmosphere containing nitrogen. For example, the surface of the inter-layer insulation film 40 is exposed to the plasma atmosphere generated by using $N_2$ gas to process the surface of the inter-layer insulation film 40.

Figure 11C:
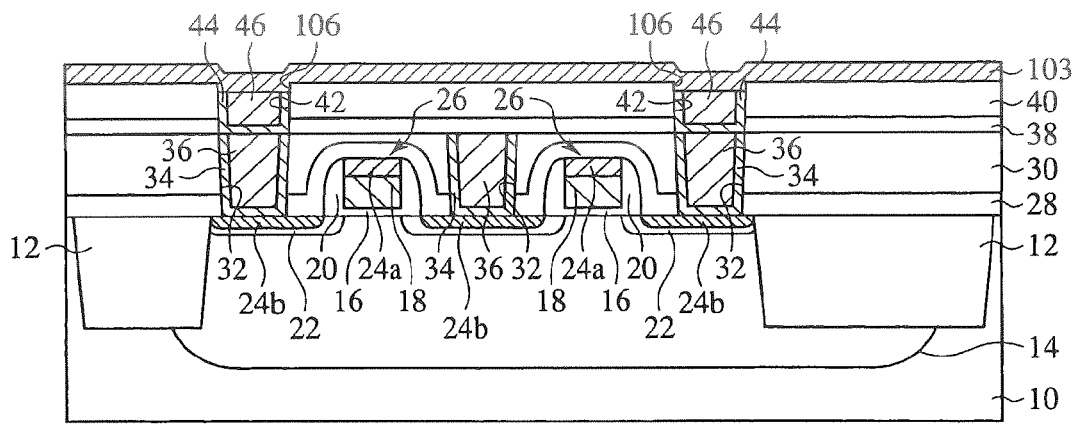

Then, as illustrated in FIG. 11C, a 100 nm-thickness Ti film 103 is formed on the entire surface by, e.g., sputtering. The Ti atoms deposited on the inter-layer insulation film 30, the surface of which has been processed as described above, can freely move in the surface of the inter-layer insulation film 40 without being captured by oxygen atoms. Accordingly, the Ti film 103 of good quality self-oriented in (002) direction is formed on the inter-layer insulation film 40.

The conditions for forming the Ti film 103 is as exemplified below. That is, the distance between the semiconductor substrate 10 and the target is, e.g., 60 mm. The pressure in the film forming chamber is 0.15 Pa. The atmosphere in the film forming chamber is, e.g., Ar atmosphere. The substrate temperature is, e.g., the room temperature. The DC power to be applied is, e.g., 2.6 kW. The period of time of supplying DC power is, e.g., 5 seconds.

Next, thermal processing is made in a nitrogen atmosphere by, e.g., RTA (Rapid Thermal Annealing). The thermal processing temperature is, e.g., 650° C. The thermal processing period of time is, e.g., 60 seconds. This thermal processing makes the above-described Ti film 103 a TiN film 104 (see FIG. 11D). Thus, the base layer 104 of a TiN film of (111) orientation is obtained.

The base layer 104 is formed of TiN film here but is not limited to TiN film. For example, the base layer 104 may be formed of tungsten, silicon, copper (Cu) or others.

Next, the surface of the base layer 104 is polished by CMP. Thus, the planarization layer 104 having the surface planarized is formed (see FIG. 11E). In the present embodiment, the surface of the base layer 104 is planarized, because, on the planarized base layer 104, the lower electrodes 56, the capacitor dielectric film 62 and the upper electrodes 70 of good orientation can be formed.

Then, the surface of the base layer (planarization layer) 104 is exposed to the plasma atmosphere generated by using $NH_3$ gas to process the surface of the base layer 104 (plasma processing).

In the present embodiment, the base layer 104 is subjected to the plasma processing for the following reason. That is, the base layer 104 which has been planarized by CMP has the crystals of the surface thereof strained by the polish. Above the base layer 104 whose surface has crystal strained, the lower electrodes 56 of good crystallinity cannot be formed, and consequently, the capacitor dielectric film 62 of good crystallinity cannot be formed. In contrast to this, by making the plasma processing on the base layer 104, strains of crystals of the surface of the base layer 104 does not influence the upper layer films. Then, on the base layer 104, the lower electrodes 56 and the capacitor dielectric film 62 of good crystallinity can be formed. For this reason, the plasma processing is made on the base layer 104 in the present embodiment.

Figure 11D:
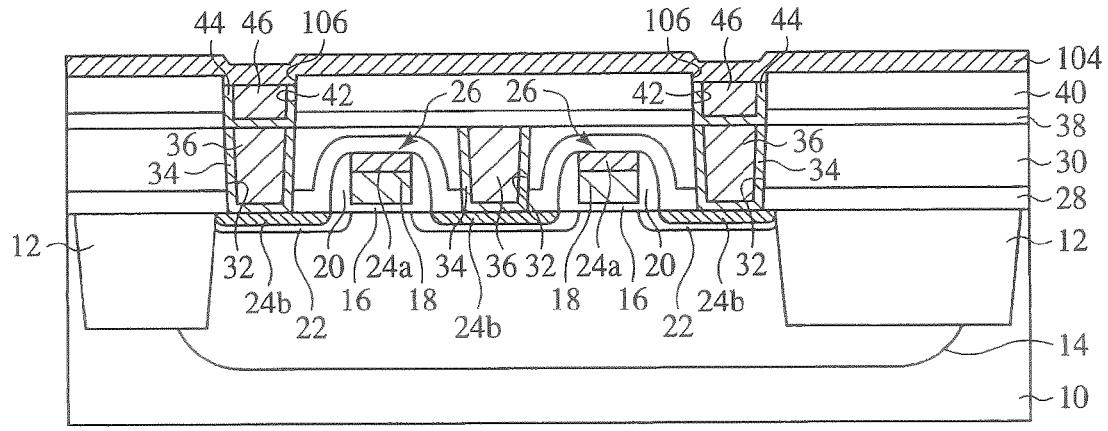
Figure 11E:
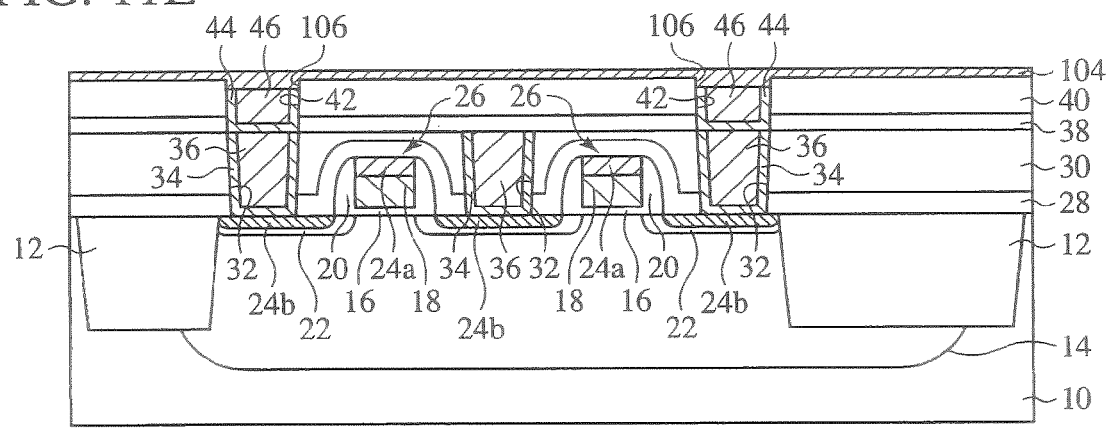
Figure 11F:
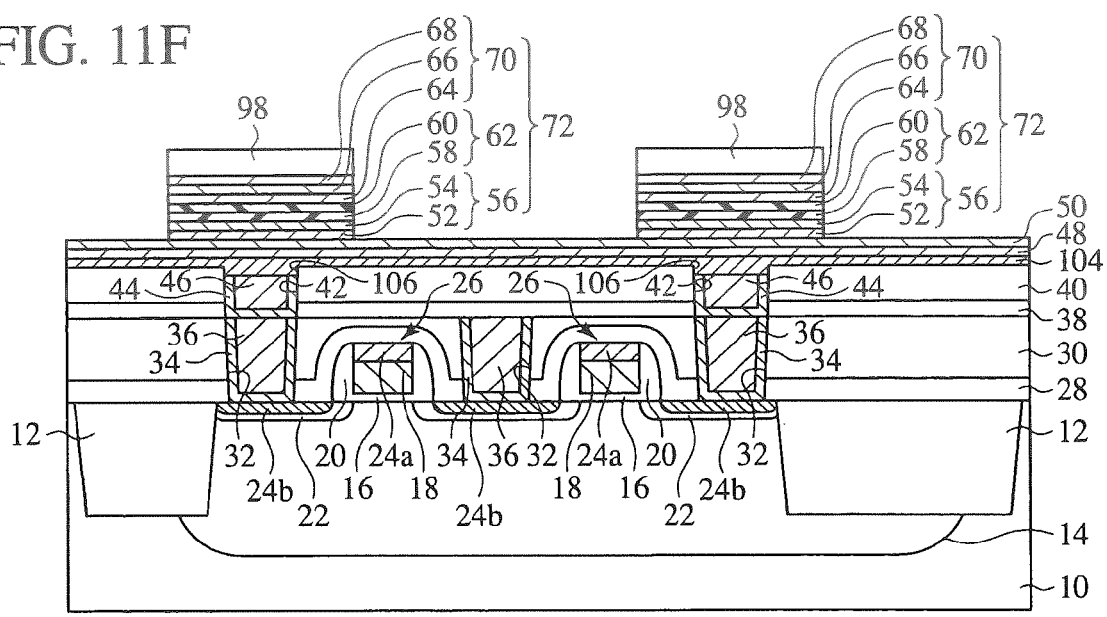
Figure 11G:
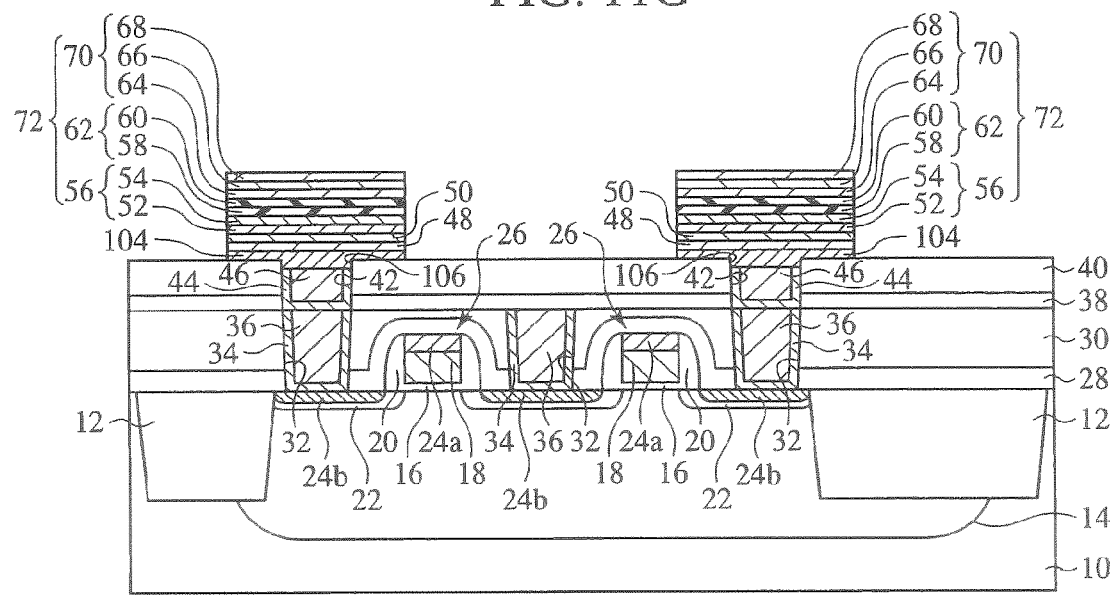

The following step of forming the adhesion layer 48 to the step of patterning the third conduction film, the second conduction film 66, the first conduction film 64, the second dielectric film 60, the first dielectric film 58, the second conduction film 54 and the first conduction film 52 are the same as those of the method for manufacturing the semiconductor device according to the first embodiment described above with reference to FIGS. 8J to 8T, and their explanation is not repeated (see FIG. 11F).

Then, with the TiN film 98 as the mask, the oxygen barrier film 50, the adhesion layer 42 and the planarization layer 104 are etched by dry etching. At this time, the TiN film 98 on the capacitors 72 is also etched off (see FIG. 11G).

The following process of the method for manufacturing the semiconductor device is the same as that of the method for manufacturing the semiconductor device according to the first embodiment illustrated in FIGS. 8V to 8AB, and its explanation is not repeated.

Figure 11H:
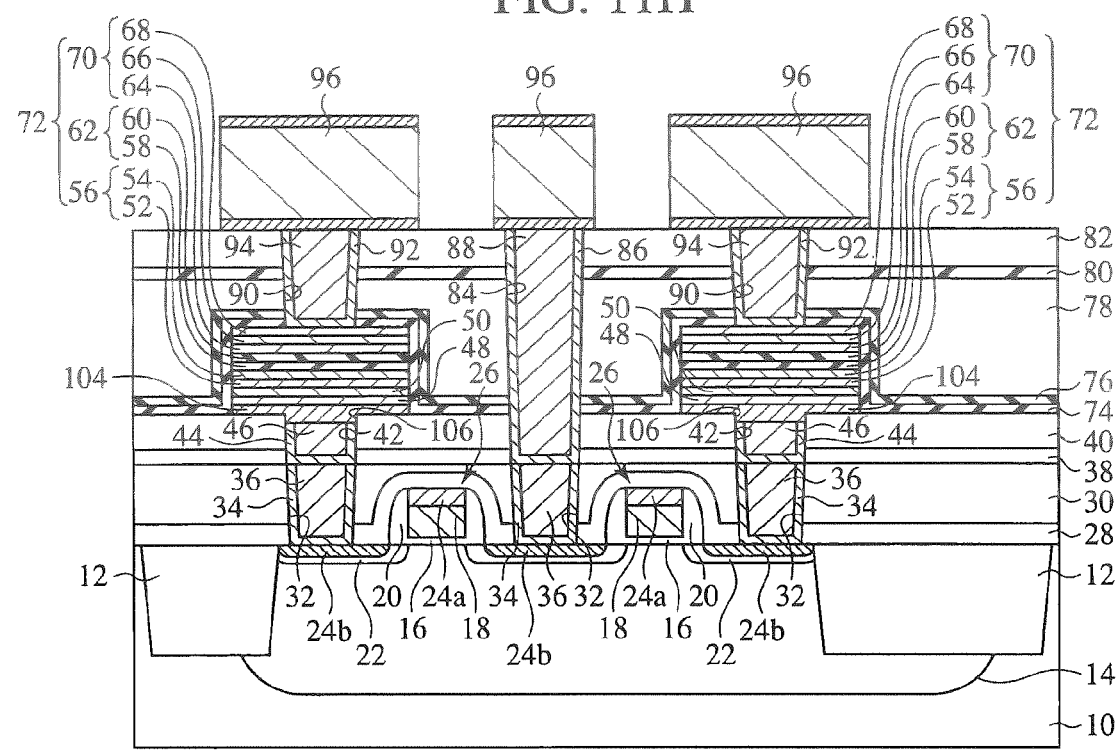

Thus, the semiconductor device according to the present embodiment is manufactured (see FIG. 11H).

Thus, according to the present embodiment, the flat base layer (planarization layer) 104 is formed on the conductor plugs 46 and the inter-layer insulation film 40, and on such planarization layer 104, the lower electrodes 56, the capacitor dielectric film 62 and the upper electrodes 70 are formed, whereby even when the tops of the conductor plugs 46 are excessively polished, the lower electrodes 56, the capacitor dielectric film 62 and the upper electrodes 70 of good orientation can be formed. Thus, according to the present embodiment, the semiconductor device including the capacitors 72 of better electric characteristics can be manufactured.

[A Third Embodiment]

Figure 12:
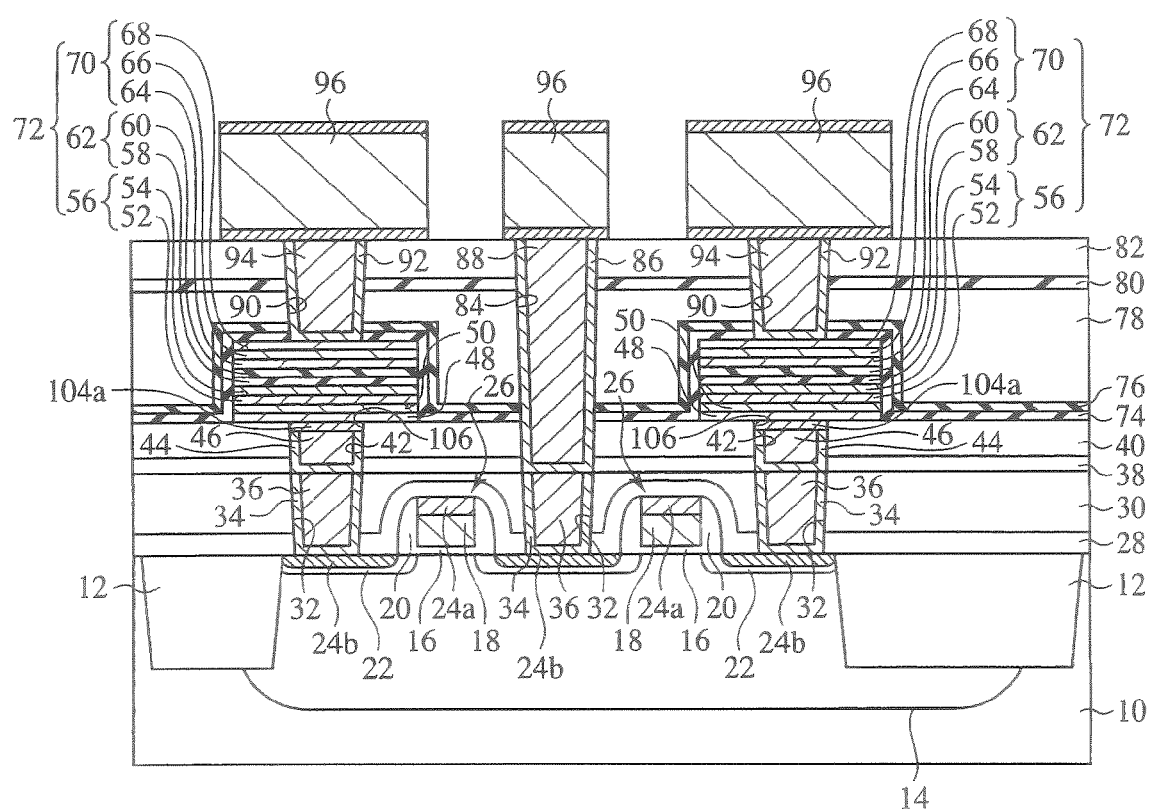
FIG. 12 is a cross-section diagram of the semiconductor device according to the present embodiment.

The semiconductor device according to a third embodiment of the present invention will be explained with reference to FIGS. 12 to 13E. FIG. 12 is a cross-section diagram of the semiconductor device according to the present embodiment. The same members of the present embodiment as those of the semiconductor device according to the first or the second embodiment and the method for manufacturing the semiconductor device illustrated in FIGS. 7 to 11H are represented by the same reference numbers not to repeat or to simplify their explanation.

(The Semiconductor Device)

First, the semiconductor device according to the present embodiment will be explained with reference to FIG. 12.

The semiconductor device according to the present embodiment is characterized mainly in that a planarization layer 104a is buried in cavities 106 formed by excessively polishing the tops of conductor plugs 46.

As illustrated in FIG. 12, the tops of the conductor plugs 46 are excessively polished, and the height of the tops of the conductor plugs 46 is lower than the height of the upper surface of an inter-layer insulation film 40. The cavities 106 are formed at the places where the conductor plugs 46 have been buried. The depth of such cavities 106 is, e.g., about 20-50 nm. As described above, when an adhesion layer 48 is formed on the conductor plugs 46 having such cavities 106 formed in and on the inter-layer insulation film 40, cavities reflecting the cavities 106 are formed in the surface of the adhesion layer 48. When an oxidation preventing film 50 is formed on such adhesion layer 48, cavities reflecting such cavities are formed also in the surface of the oxidation preventing film 50. It is difficult to form lower electrodes 56, a capacitor dielectric film 62 and upper electrodes 70 of good orientation on the oxygen barrier film 50 with such cavities formed in.

In the present embodiment, as illustrated in FIG. 12, the base layer 104a is buried in the cavities 106. The surfaces of the base layer 104a and the inter-layer insulation film 40 are planarized by CMP. The height of the upper surface of the base layer 104a and the height of the upper surface of the inter-layer insulation film 40 are even with each other.

An adhesion layer 48 is formed on the base layer 104a and the inter-layer insulation film 40. Since the adhesion layer 48 is formed on the planarized base, the surface of the adhesion layer 48 is planarized.

The oxygen barrier film 50 is formed on the adhesion layer 48. Since the oxygen barrier film 50 is formed on the planarized adhesion layer 48, the surface of the oxygen barrier film 50 is planarized.

Lower electrodes 56 are formed on the oxygen barrier film 50. Since the lower electrodes 56 is formed on the planarized oxygen barrier film 50, the lower electrodes 56 have good orientation.

The capacitor dielectric film 62 is formed on the lower electrodes 56. Since the capacitor dielectric film 62 is formed on the planarized lower electrodes 55, the capacitor dielectric film 62 has good orientation.

The upper electrodes 70 are formed on the capacitor dielectric film 62. Since the upper electrodes 70 is formed on the planarized capacitor dielectric film 62, the upper electrodes 70 have good orientation.

As described above, according to the present embodiment, the base layer (planarization layer) 104a is buried in the cavities 104 formed by excessively polishing the conductor plugs 46, which permit the lower electrodes 56, the capacitor dielectric film 62 and the upper electrodes 70 to be formed on the planarized base. Thus, according to the present embodiment, the lower electrodes 56, the capacitor dielectric film 62 and the upper electrodes 70 of good orientation can be formed. According to the present embodiment, the semiconductor device can include the capacitors 72 of better electric characteristics.

(The Method for Manufacturing the Semiconductor Device)

Next, the method for manufacturing the semiconductor device according to the present embodiment will be explained with reference to FIGS. 13A to 13E. FIGS. 13A to 13E are cross-section diagrams of the semiconductor device according to the present embodiment in the steps of the method for manufacturing the semiconductor device, which illustrate the method.

The step of forming device isolation regions 12 in a semiconductor substrate 10 to the step of forming contact holes 42 down to conductor plugs 36 including the conductor plugs 36 forming step are the same as those of the method for manufacturing the semiconductor device according to the first embodiment illustrated in FIGS. 8A to 8G, and their explanation will not be repeated.

Figure 13A:
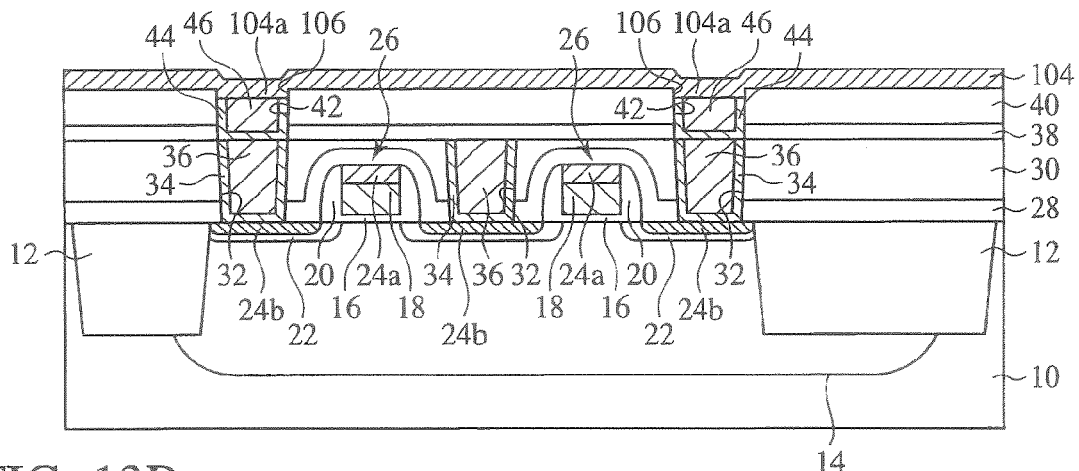
FIG. 13A to 13E are cross-section diagrams of the semiconductor device according to the present embodiment in the steps of the method for manufacturing the semiconductor device, which illustrate the method.
Figure 13B:
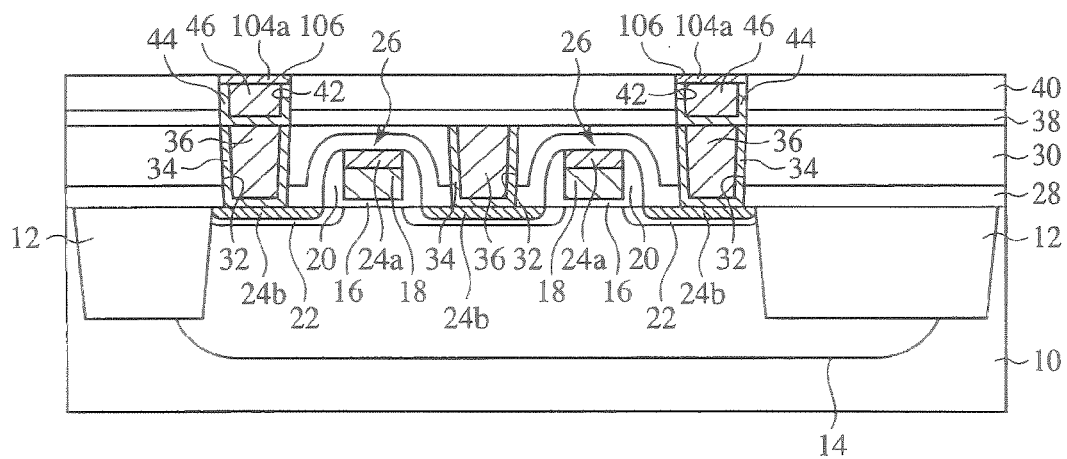

The following step of burying conductor plugs 46 in the contact holes 42 to the step of making a Ti film 103 a TiN film 104 by thermal processing including the step of making a Ti film 103 a TiN film 104 are the same as those of the method for manufacturing the semiconductor device according to the second embodiment illustrated in FIGS. 11B to 11D, and their explanation will not be repeated (FIG. 13A).

Then, a base layer 104 is polished by CMP until the surface of an inter-layer insulation film 40 is exposed. Thus, a planarization layer 104a is buried in cavities 106 (see FIG. 13B). The height of the upper surface of the planarization layer 104a is even with the height of the upper surface of the inter-layer insulation film 40.

Then, the surface of the inter-layer insulation film 40 is exposed to the plasma atmosphere generated by using $NH_3$ gas to process the surface of the inter-layer insulation film 40 (plasma processing). In the present embodiment, the surface of the inter-layer insulation film 40 is exposed to the plasma atmosphere generated by using $NH_3$ gas so that oxygen atoms in the surface of the inter-layer insulation film 40 are bonded with NH groups to thereby prevent Ti atoms from being captured by the oxygen atoms of the surface of the inter-layer insulation film 40 when a Ti film 47 is formed on the inter-layer insulation film 40 in a later step.

The conditions for the plasma processing are as follows. The plasma processing system is a parallel plate plasma processing system. The opposed electrodes are spaced from the semiconductor substrate by, e.g., about 9 mm (350 mils). The pressure in the chamber for the plasma processing is, e.g., about 266 Pa (2 Torr). The substrate temperature is, e.g., 400° C. The flow rate of $NH_3$ gas to be fed into the chamber is, e.g., 350 sccm. The high-frequency electric power to be applied to the semiconductor substrate 10 is, e.g., 13.56 MHz, 100 W. The high-frequency electric power to be applied to the opposed electrodes is, e.g., 350 kHz, 55 W. The application period of time of the high-frequency electric power is, e.g., 60 seconds.

The surface of the inter-layer insulation film 40 is processed here by exposing the surface of the inter-layer insulation film 40 to the plasma atmosphere generated by $NH_3$ gas, but the plasma atmosphere is not limited to the plasma atmosphere generated by using $NH_3$ gas. The surface of the inter-layer insulation film 40 may be exposed to a plasma atmosphere containing nitrogen. For example, the surface of the inter-layer insulation film 40 may be processed by exposing the surface of the inter-layer insulation film 40 to the plasma atmosphere generated by using $N_2$ gas.

Figure 13C:
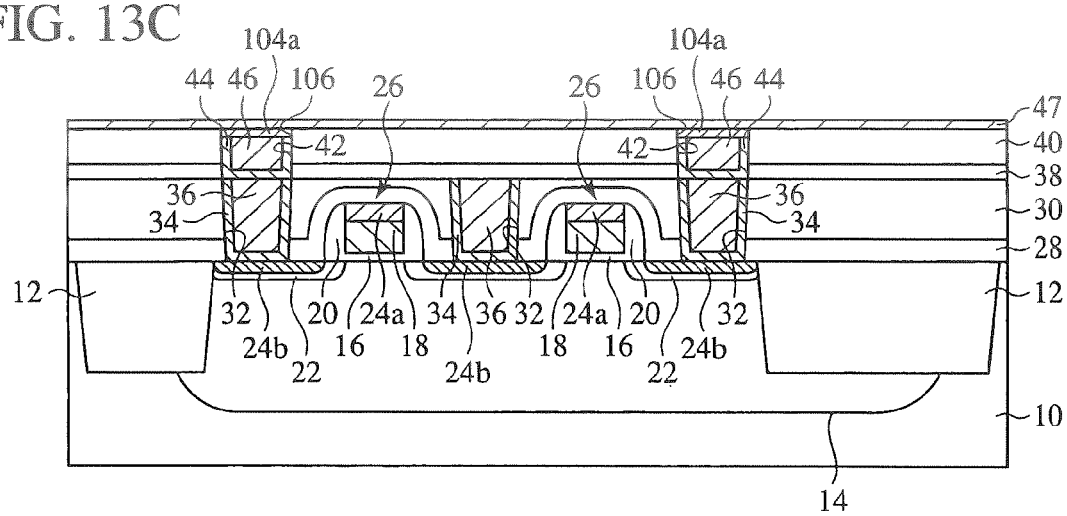
Figure 13D:
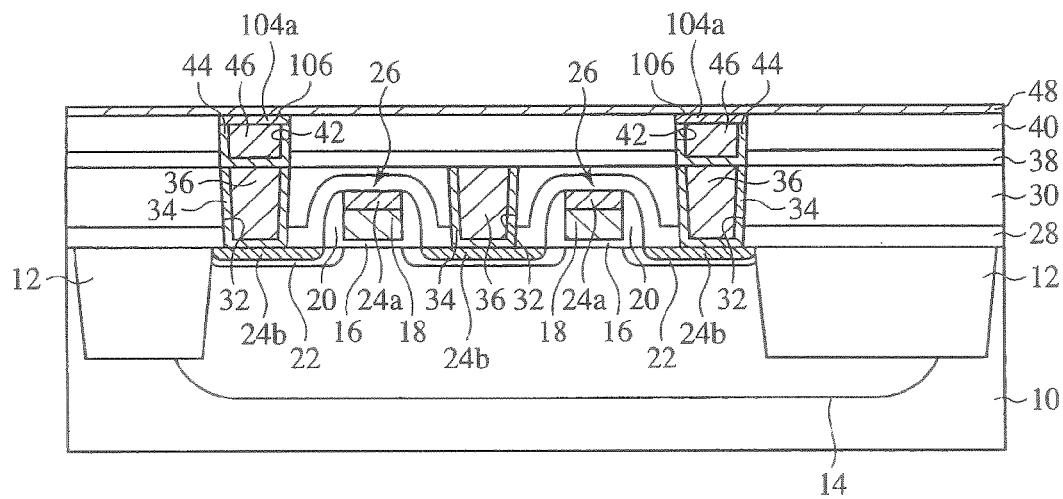

Then, as illustrated in FIG. 13C, a 20 nm-thickness Ti film 47 is formed on the entire surface by, e.g., sputtering. Ti atoms deposited on the inter-layer insulation film 40, the surface of which has been processed as described above, can freely move in the surface of the inter-layer insulation film 40 without being captured by oxygen atoms. Accordingly, the Ti film 47 of good quality self-oriented in (002) direction can be formed on the inter-layer insulation film 40.

The conditions for forming the Ti film 47 are as exemplified below. That is, the distance between the semiconductor substrate 10 and the target is, e.g., 60 nm. The pressure in the film forming chamber is 0.15 Pa. The atmosphere inside the film forming chamber is, e.g., Ar atmosphere. The substrate temperature is, e.g., the room temperature. The DC power to be applied is, e.g., 2.6 kW. The period of time of supplying the DC power is, e.g., 5 seconds.

Then, thermal processing is made in a nitrogen atmosphere by, e.g., RTA (Rapid Thermal Annealing). The thermal processing temperature is, e.g., 650° C. The thermal processing period of time is, e.g., 60 seconds. This thermal processing makes the above-described Ti film 47 the TiN film 48 (see FIG. 13D). Thus, the adhesion layer 48 of a TiN film of (111) orientation can be obtained. Such adhesion layer 48 is for improving the crystallinity of the oxygen barrier film 50 to be formed in a later step and improving the adhesion between the oxygen barrier film 50 and the inter-layer insulation film 40.

The adhesion layer 48 is formed of TiN film here but is not formed essentially of TiN film. The adhesion layer 48 may be formed suitably of a material which improves the crystallinity of the oxygen barrier film 50 and the adhesion between the oxygen barrier film 50 and the inter-layer insulation film 40. For example, the adhesion layer 48 may be formed of Ti, Ti alloy, Al, Al alloy, Pt, Pt alloy, Ir, Ir alloy, Re, Re alloy, Ru, Ru alloy, Pd, Pd alloy, Os, Os alloy, Rh, Rh alloy, platinum oxide, iridium oxide, ruthenium oxide, palladium oxide or others.

The following process of the method for manufacturing the semiconductor device is the same as that of the method for manufacturing the semiconductor device according to the first embodiment described above with reference to FIGS. 8K to 8AB, and its explanation will not be repeated.

Figure 13E:
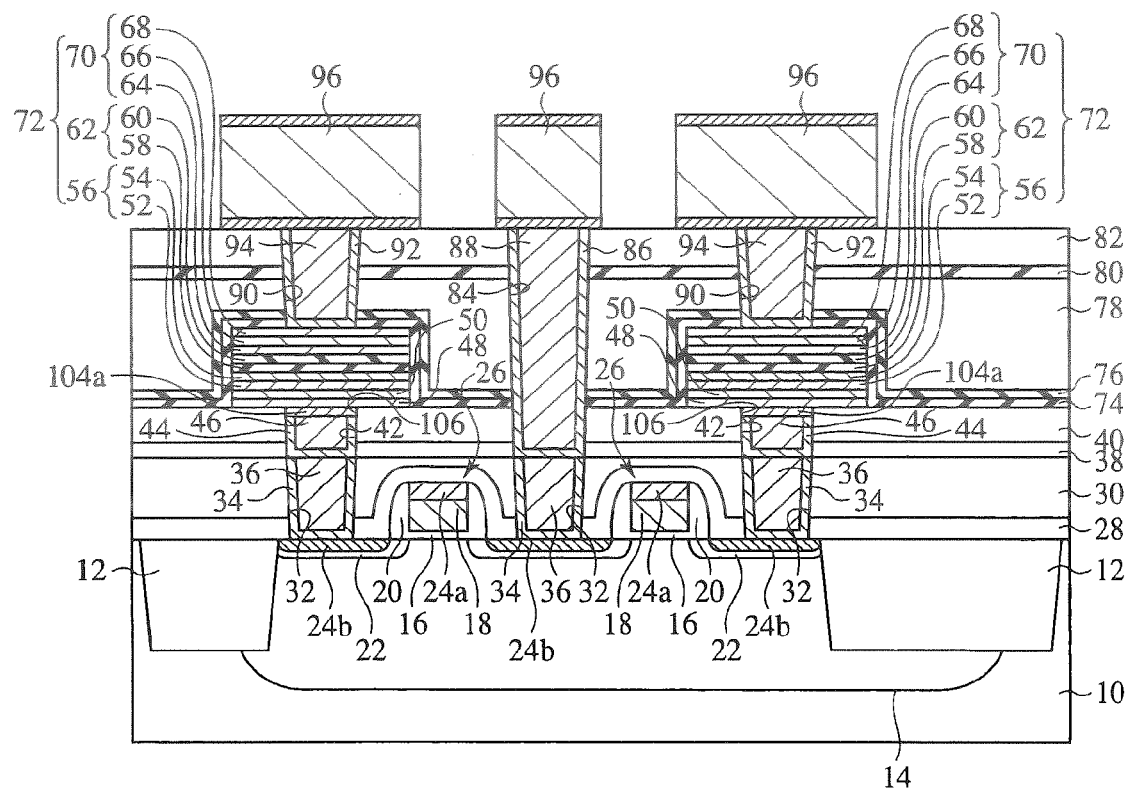

Thus, the semiconductor device according to the present embodiment is manufactured (see FIG. 13E).

As described above, according to the present embodiment, the base layer (planarization layer) 104a is buried in the cavities 104 generated by excessively polishing the conductor plugs 46, which permits the lower electrodes 56, the capacitor dielectric film 62 and the upper electrodes 70 to be formed on the planarized base. Thus, according to the present embodiment, the lower electrodes 56, the capacitor dielectric film 62 and the upper electrodes 70 of good orientation can be formed. According to the present embodiment, the semiconductor device including the capacitors 72 having better electric characteristics can be provided.

[A Fourth Embodiment]

Figure 14:
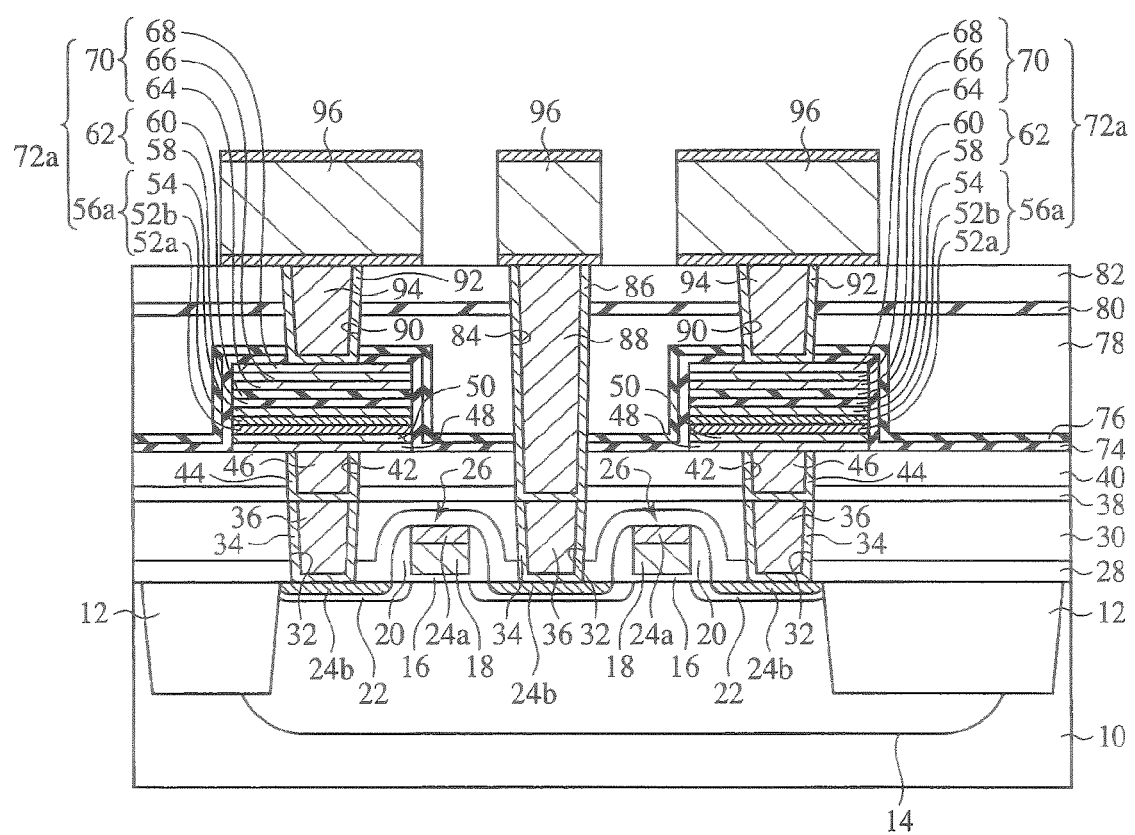
FIG. 14 is a cross-section diagram of the semiconductor device according to the present embodiment.

The semiconductor device according to a fourth embodiment of the present invention and the method for manufacturing the semiconductor device will be explained with reference to FIGS. 14 to 15G. FIG. 14 is a cross-section diagram of the semiconductor device according to the present embodiment. The same members of the present embodiment as those of the semiconductor device according to the first to the third embodiments and the method for manufacturing the semiconductor device illustrated in FIGS. 7 to 13E are represented by the same reference numbers not to repeat or to simplify their explanation.

(The Semiconductor Device)

First, the semiconductor device according to the present embodiment will be explained with reference to FIG. 14.

The semiconductor device according to the present embodiment is characterized mainly in that lower electrodes 56 are formed of the first conduction film 52a of iridium oxide or ruthenium oxide, the second conduction film 52b of iridium oxide or ruthenium oxide formed on the first conduction film 52a and the third conduction film 54 of Pt, Pt alloy, Pd or Pd alloy formed on the second conduction film 52b.

As illustrated in FIG. 14, the lower electrodes 56a of capacitors 72a are formed on an oxygen barrier film 50. The lower electrodes 56a are formed of the first conduction film 52a of iridium oxide or ruthenium oxide, the second conduction film 52b of iridium oxide or ruthenium oxide formed on the first conduction film 52a, and the third conduction film 54 of Pt, Pt alloy, Pd or Pd alloy formed on the second conduction film 52 which are sequentially laid. The film thickness of the first conduction film 52a is, e.g., 50 nm. The film thickness of the second conduction film 52b is, e.g., 30 nm. The film thickness of the third conduction film 54 is, e.g., 100 nm.

In the present embodiment, the lamination layer of the first conduction film 52a and the second conduction film 52b is formed below the third conduction film 54, because the layer film of the first conduction film 52a of iridium oxide or ruthenium oxide and the second conduction film 52b of iridium oxide or ruthenium oxide has the function for preventing the diffusion of Pb and Bi.

The function of the single layer of iridium oxide film and the single layer of ruthenium oxide film for preventing the diffusion of Pb and Bi is poor.

However, the lamination layer of iridium oxide film or ruthenium oxide film has the function for preventing the diffusion of Pb and Bi.

That is, the layer film of iridium oxide film 52a and iridium oxide film 52b sequentially laid can stop the diffusion of Pb and Bi in the interface between the iridium oxide film 52a and the iridium oxide film 52b. In the layer film of iridium oxide film 52a and the iridium oxide film 52b sequentially laid, the concentration peak of Pb or Bi diffused from the capacitor dielectric film 62 positions in the interface between the iridium oxide film 52a and the iridium oxide film 52b.

That is, the layer film of iridium oxide film 52a and ruthenium oxide film 52b sequentially laid can stop the diffusion of Pb and Bi in the interface between the iridium oxide film 52a and the ruthenium oxide film 52b. In the layer film of the iridium oxide film 52a and the ruthenium oxide film 52b sequentially laid, the concentration peak of Pb or Bi diffused from the capacitor dielectric film 62 positions in the interface between the iridium oxide film 52a and the ruthenium oxide film 52b.

The layer film of the ruthenium oxide film 52a and the iridium oxide film 52b sequentially laid can stop the diffusion of Pb and Bi in the interface between the ruthenium oxide film 52a and the iridium oxide film 52b. In the layer film of the ruthenium oxide film 52a and the iridium oxide film 52b sequentially laid, the concentration peak of the Pb or Bi diffused from the capacitor dielectric film 62 positions in the interface between the ruthenium oxide film 52a and the iridium oxide film 52b.

The layer film of the ruthenium oxide film 52a and the ruthenium oxide film 52b sequentially laid can stop the diffusion of Pb and Bi in the interface between the ruthenium oxide film 52a and ruthenium oxide film 52b. In the layer film of the ruthenium oxide film 52a and the ruthenium oxide film 52b sequentially laid, Pb or Bi diffused from the capacitor dielectric film 62 positions in the interface between the ruthenium oxide film 52a and the ruthenium oxide film 52b.

As described above, the layer film of the first conduction film 52a of iridium oxide or ruthenium oxide, and the second conduction film 52b of iridium oxide or ruthenium oxide has the function of preventing the diffusion of Pb and Bi.

According to the present embodiment, the lower electrodes 56a include the layer film of the first conduction film 52a of iridium oxide or ruthenium oxide, and the second conduction film 52b of iridium oxide or ruthenium oxide, whereby the arrival of Pb or Bi contained in the capacitor dielectric film 62 at the interface between the lower electrodes 56a and the oxygen barrier film 50 can be prevented and the reaction of the oxygen barrier film 50 with the Pb or Bi can be prevented. Thus according to the present embodiment, the adhesion between the lower electrode 56a an the oxygen barrier film 50 can be prevented from being impaired, and consequently, the release of the lower electrode 56a from the oxygen barrier film 50 can be prevented.

In the present embodiment, the third conduction film forming the lower electrodes 56 is formed of Pt, Pt alloy, Pd or Pd alloy so that the capacitor dielectric film 62 of good crystallinity can be formed on the third conduction film 54 of Pt, Pt alloy, Pd or Pd alloy.

Often, the lower electrodes 56a are partially reduced by thermal processing made after the lower electrodes 56a have been formed. That is, often, the iridium oxide or the ruthenium oxide forming the second conduction film 52b of the lower electrodes 56a is reduced by thermal processing made after the lower electrodes 56a have been formed. Often, the iridium oxide or ruthenium oxide forming the first conduction film 52a of the lower electrodes 56a is reduced by thermal processing made after the lower electrodes 56a have been formed. Even when the first conduction film 52a has been reduced, oxygen remains to some extent in the first conduction film 52a. When the first conduction film 52a is iridium oxide film, the iridium oxide film 52a becomes iridium film containing oxygen. When the first conduction film 52a is ruthenium oxide film, the ruthenium oxide film 52a becomes ruthenium film containing oxygen. When the second conduction film 52b is reduced as well, oxygen remains to some extent in the second conduction film 52b. When the second conduction film 52b is iridium oxide film, the iridium oxide film 52b becomes iridium film containing oxygen. When the second conduction film 52b is ruthenium oxide film, the ruthenium oxide film 52b becomes ruthenium film containing oxygen. When both the first conduction film 52a and the second conduction film 52b are reduced, oxygen remains in the first conduction film 52a and in the second conduction film 52b, and the oxygen concentration of the lower electrodes 56a on the side of the oxygen barrier film 50 is higher than the oxygen concentration of the lower electrodes 56a on the side of the capacitor dielectric film 62.

A trace of Pb or Bi may arrive at the interface between the lower electrodes 56a and the oxygen barrier film 50, because when a trace of Pb or Bi arrives at the interface between the lower electrodes 56a and the oxygen barrier film 50, the adhesion in the interface between the oxygen barrier film 50 and the lower electrodes 56a is not substantially impaired, and the lower electrodes 56a are never released from the oxygen barrier film 50. When the capacitor dielectric film 62 is formed of a ferroelectric or a high dielectric containing Pb, the adhesion between the oxygen barrier film 50 and the lower electrodes 56a is sufficiently ensured, and the lower electrodes 56a are never released from the oxygen barrier film 50 when the Pb concentration of the interface between the lower electrodes 56a and the oxygen barrier film 50 is $\frac{1}{50}$ or below of the peak value of the Pb in the lower electrodes 56a. When the capacitor dielectric film 62 is formed of a ferroelectric or high dielectric containing Bi, the adhesion between the oxygen barrier film 50 and the lower electrodes 56a is sufficiently ensured, and the lower electrodes 56a are never released from the oxygen barrier film 50 when the concentration of Bi of the interface between the lower electrodes 56a and the oxygen barrier film 50 is $\frac{1}{50}$ or below of the peak value of the Bi in the lower electrodes 56a. In view of ensuring very high adhesion between the lower electrodes 56a and the oxygen barrier film 50, it is preferable that no Pb or Bi is present in the interface between the lower electrodes 56a and the oxygen barrier film 50.

On the lower electrodes 56a, the capacitor dielectric film 62 is formed. The capacitor dielectric film 62 is formed of the first dielectric film 58 formed by sputtering or sol-gel process, and the second dielectric film 60 formed by MOCVD.

The capacitor dielectric film 62 of the two-layer structure is formed here by, e.g., forming the first conduction film 58 by sputtering or sol-gel process, and forming the second dielectric film 60 by MOCVD. However, the capacitor dielectric film 62 may not essentially have the two-layer structure and may have a single-layer structure. That is, the capacitor dielectric film 62 of a single-layer structure may be formed by sputtering or sol-gel process.

On the capacitor dielectric film 62, the upper electrodes 70 of the capacitors 72 are formed. The upper electrodes 70 are formed of the first conduction film 64 of, e.g., a 50 nm-thickness $IrO_X$ film, the second conduction film 66 of, e.g., a 100-300 nm-thickness $IrO_Y$ film and the third conduction film 68 of, e.g., a 50-150 nm-thickness Ir film which are sequentially laid.

Thus, the capacitors 72a including the lower electrodes 56a, the capacitor dielectric film 62 and the upper electrodes 70 are constituted.

As described above, the semiconductor device according to the present embodiment is characterized mainly in that the lower electrodes 56 are formed of the first conduction film 52a of iridium oxide or ruthenium oxide, the second conduction film 52b of iridium oxide or ruthenium oxide formed on the first conduction film 52a, and the third conduction film 54 of Pt, Pt alloy, Pd or Pd alloy formed on the second conduction film 52b.

According to the present embodiment, the lower electrodes 56a is formed of the layer film of the first conduction film 52a of iridium oxide or ruthenium oxide and the second conduction film 52b of iridium oxide or ruthenium oxide, whereby the arrival of Pb or Bi contained in the capacitor dielectric film 62 at the interface between the lower electrodes 56a and the oxygen barrier film 50, and the reaction of the oxygen barrier film 50 with the Pb or Bi can be prevented. Thus, the present embodiment also can prevent the impairment of the adhesion strength of the interface between the lower electrodes 56a and the oxygen barrier film 50 in the interface, and the release of the lower electrodes 56a from the oxygen barrier film 50 can be prevented. On the third conduction film 54 of Pt, Pt alloy, Pd or Pd alloy, the capacitor dielectric film 62 of good crystallinity can be formed. To be more specific, on the second conduction film 54 of Pt, etc., the capacitor dielectric film 62 of in-plane homogeneous crystallinity can be formed. The capacitor dielectric film 62 of good surface morphology can be formed. Thus, according to the present embodiment, the semiconductor device have include the capacitors 72a of good electric characteristics and high reliability.

(The Method for Manufacturing the Semiconductor Device)

Next, the method for manufacturing the semiconductor device according to the present embodiment will be explained with reference to FIGS. 15A to 15G. FIGS. 15A to 15G are cross-section diagrams of the semiconductor device according to the present embodiment in the steps of the method for manufacturing the semiconductor device.

Figure 15A:
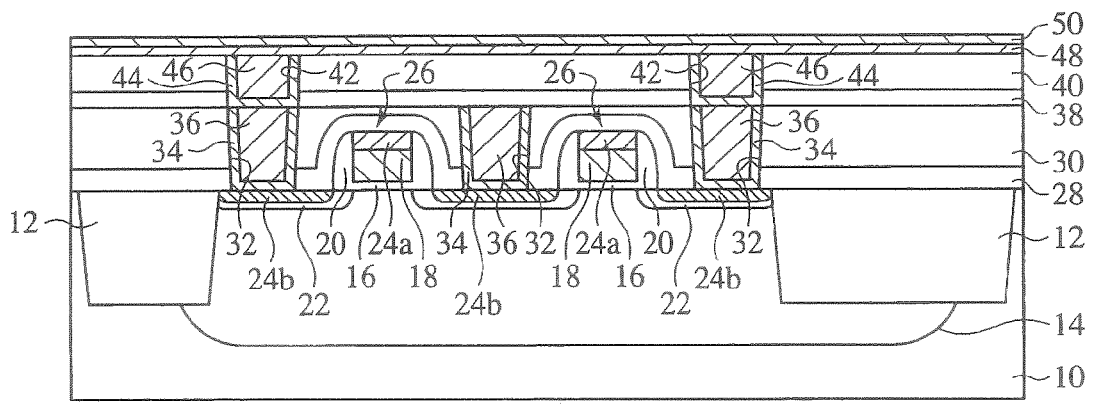
FIG. 15A to 15G are cross-section diagrams of the semiconductor device according to the present embodiment in the steps of the method for manufacturing the semiconductor device.

First, the step of forming the device isolation regions 12 in the semiconductor substrate 10 to the step of forming the oxygen barrier film 50 including the oxygen barrier film 50 forming step are the same as those of the method for manufacturing the semiconductor device according to the first embodiment illustrated in FIGS. 8A to 8K, and their explanation will not be repeated (see FIG. 15A).

Figure 15B:
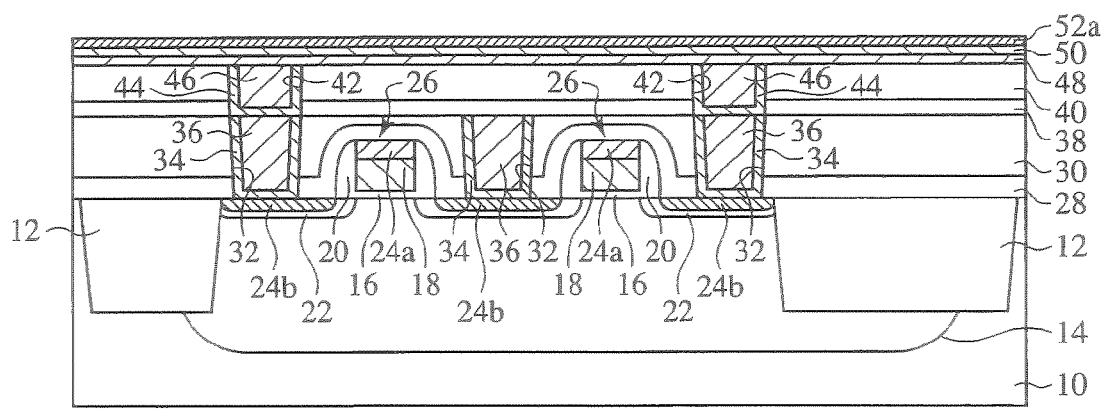

Then, as illustrated in FIG. 15B, the first conduction film 52a of crystalline iridium oxide or crystalline ruthenium oxide is formed on the entire surface by, e.g., sputtering. The film thickness of the first conduction film 52a is, e.g., 50-100 nm. The conditions for forming the first conduction film 52a are as follows. The flow rate of Ar gas to be fed into the chamber is 100 sccm. The flow rate of $O_2$ gas to be fed into the chamber is 100 sccm. The sputtering power is, e.g., 2 kW. The substrate temperature is, e.g., 300° C.

The first conduction film 52a is here iridium oxide film or ruthenium oxide film but is not limited to iridium oxide film or ruthenium oxide film. The first conduction film 52a may be crystalline Ir film or $RuO_2$ film.

Figure 15C:
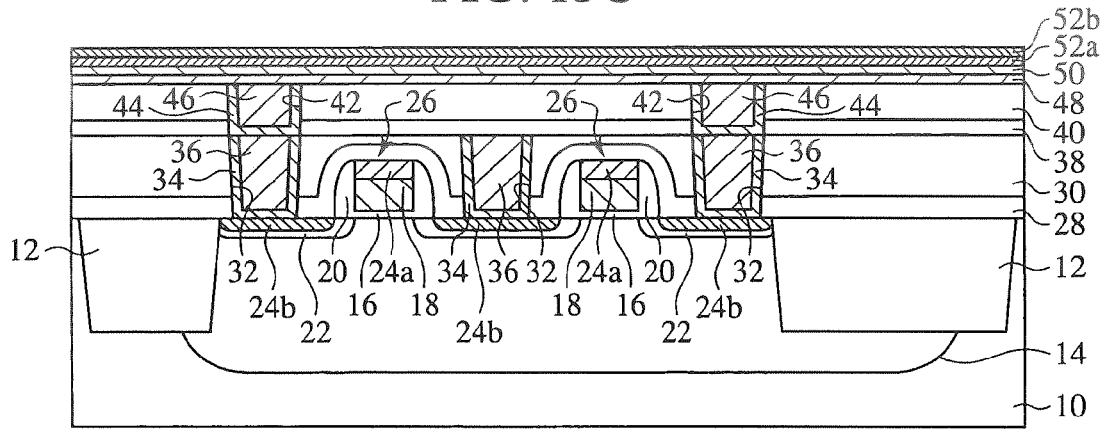

Next, as illustrated in FIG. 15C, the second conduction film 52b of amorphous iridium oxide or amorphous ruthenium is formed on the entire surface by, e.g., sputtering. The film thickness of the second conduction film 52b is, e.g., 30 nm. The second conduction film 52b is an amorphous iridium oxide film or an amorphous ruthenium oxide film, because it is difficult to form Pt film, Pt alloy film, Pd film or Pd alloy film of good crystallinity on crystalline iridium oxide film or crystalline ruthenium oxide film. In the present embodiment, in which the third conduction film 54 of Pt, Pt alloy, Pd or Pd alloy is formed on the amorphous iridium oxide film 52b or the amorphous ruthenium oxide film 52b, the third conduction film 54 of good crystallinity can be formed.

Figure 15D:
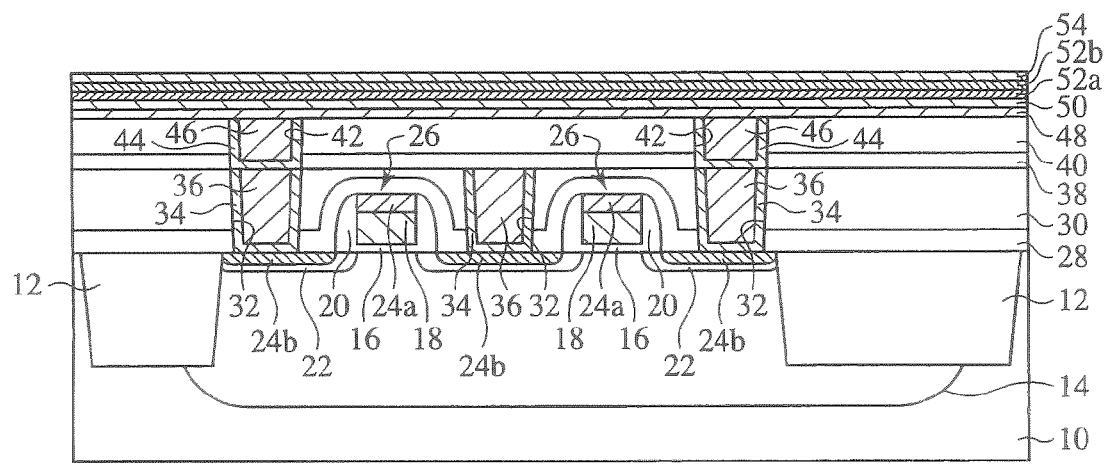

Then, as illustrated in FIG. 15D, the third conduction film 54 of Pt, Pt alloy, Pd, Pd alloy is formed on the entire surface by, e.g., sputtering. The film thickness of the third conduction film 54 is, e.g., 100 nm. The conditions for forming the third conduction film 54 are as follows. The flow rate of Ar gas to be fed into the chamber is, e.g., 199 sccm. The sputtering power is, e.g., 0.3 kW. The substrate temperature is, e.g., 400° C.

Then, thermal processing is made in an atmosphere of an inert gas. The inert gas is Ar gas, $N_2$ gas or $N_2O$ gas. The thermal processing temperature is, e.g., 650-750° C. The thermal processing period of time is, e.g., about 60-120 seconds. This thermal porocessing is for improving the adhesion between the respective layers and improving the crystallinity of the lower electrodes 56a. This thermal processing partially reduces the iridium oxide or ruthenium film forming the first conduction film 54a and the second conduction film 54b and improves the crystallinity of the lower electrodes 56a.

Figure 15E:
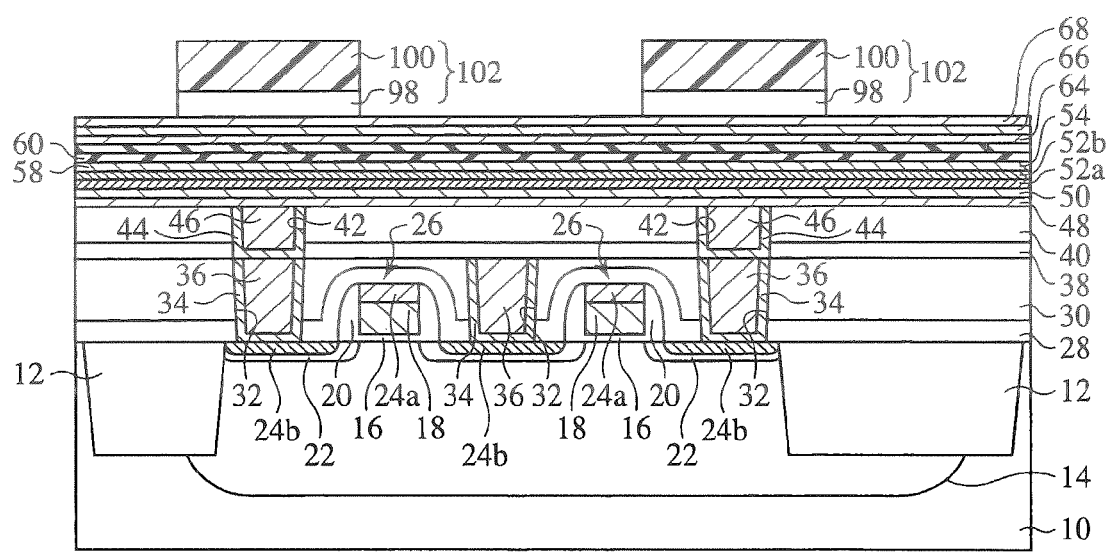
Figure 15F:
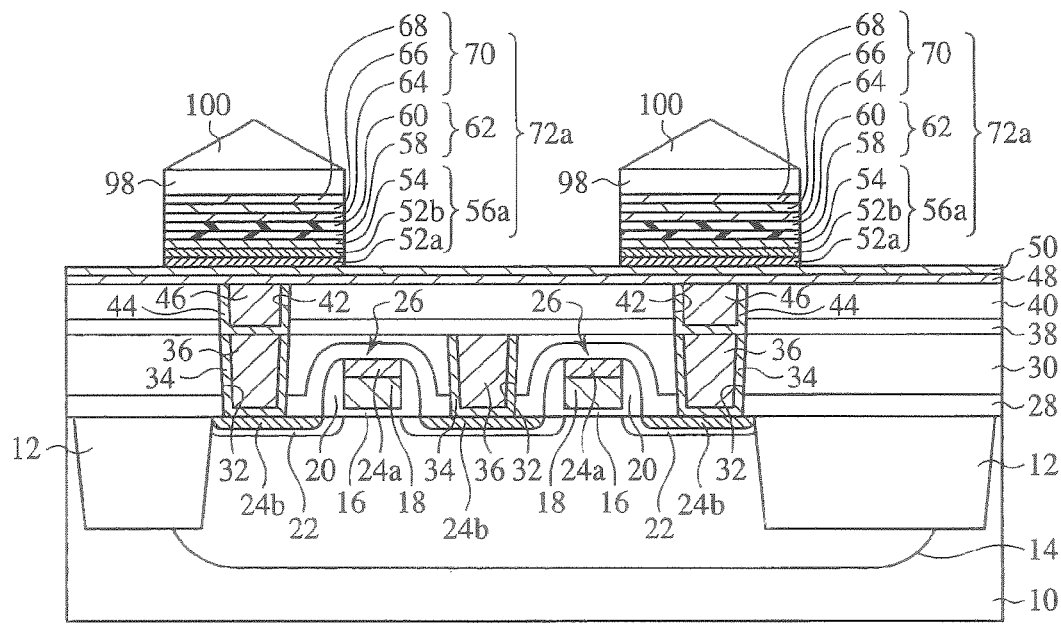

The following step of forming the first dielectric film 58 to the step of forming the hard mask 102 including the hard mask 102 forming step are the same as those of the method for manufacturing the semiconductor device described above with reference to FIGS. 8N to 8R, and their explanation will not be repeated (see FIG. 15E).

Then, with the hard mask 102 as the mask and by plasma etching, the third conduction film 68, the second conduction film 66, the first conduction film 64, the second dielectric film 60, the first dielectric film 58, the third conduction film 54, the second conduction film 52b and the first conduction film 52a are patterned. Thus, the lower electrodes 56a of the first conduction film 52a, the second conduction film 52b and the third conduction film 54 are formed. The capacitor dielectric film 62 of the first dielectric film 58 and the second dielectric film 60 is formed. The upper electrodes 70 of the first conduction film 64 and the second conduction film 66 and the third conduction film 68 are formed. The lower electrodes 56a, the capacitor dielectric film 62 and the upper electrodes 70 form the capacitors 72a (see FIG. 15F).

The following process of the method for manufacturing the semiconductor device is the same as that of the method for manufacturing the semiconductor device according to the first embodiment described above with reference to FIGS. 8T to 8AB, and its explanation will not be repeated.

Figure 15G:
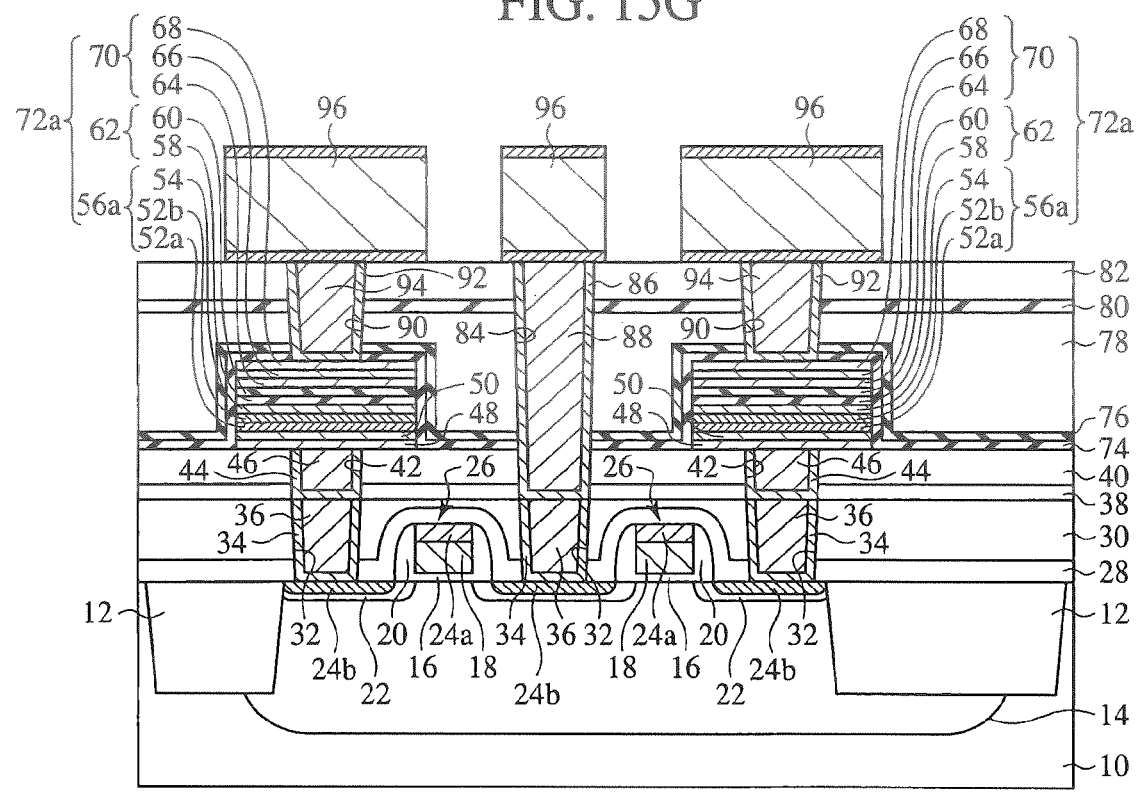

Thus, the semiconductor device according to the present embodiment is manufactured (see FIG. 15G).

[Modified Embodiments]

The present invention is not limited to the above-described embodiments and can cover other various modifications.

For example, in the fourth embodiment, the adhesion layer 48, the oxygen barrier film 50 and the capacitors 72a are formed on the conductor plugs 46 and the inter-layer insulation film 40 without forming the planarization layer 104 below the adhesion layer 48 (see FIG. 10). However, it is possible that the planarization layer 104 is formed on the conductor plugs 46 and on the inter-layer insulation film 40, and the adhesion layer 48, the oxygen barrier film 50 and the capacitor s 72a are formed on such planarization layer 104.

In the fourth embodiment, the adhesion layer 48, the oxygen barrier film 50 and the capacitors 72a are formed on the conductor plugs 46 and on the inter-layer insulation film 40 without forming the planarization layer 104a below the adhesion layer 48 (see FIG. 12). However, it is possible that the planarization layer 104a is buried in the cavities 106 on the conductor plugs 46, and the adhesion layer 48, the oxygen barrier film 50 and the capacitors 72a are formed on such planarization layer 104a and the inter-layer insulation film 40.

In the above-described embodiments, the conductor plugs 46 are further formed on the conductor plugs 36, and the capacitors 72, 72a are formed on the conductor plugs 46.

However, it is possible that the capacitors 72, 72a are formed on the conductor plugs 36 without forming the conductor plugs 46.

In the first to the third embodiments, the lower electrodes 56 are formed of the layer film of the first conduction film 52 and the second conduction film 54, but iridium oxide film may be formed between the first conduction film 52 and the second conduction film 54. That is, the lower electrodes 56 may be formed of the layer film of the first conduction film 52, an iridium oxide film and the second conduction film 54 sequentially laid. In this case, the concentration peak of Pb or Bi diffused from the capacitor dielectric film 62 positions in the interface between the first conduction film 52 and the iridium oxide film. In this case as well, the arrival of Pb or Bi contained in the capacitor dielectric film 62 at the interface between the lower electrodes 56 and the oxygen barrier film 50 can be prevented, and the reaction of the oxygen barrier film 50 with the Pb or Bi can be prevented. Thus, the impairment of the adhesion strength of the interface between the lower electrodes 56 and the oxygen barrier film 50 can be prevented, and the release of the lower electrodes 56 form the oxygen barrier film 50 can be prevented.

In the first to the third embodiments, the lower electrodes 56 are formed of the layer film of the first conduction film 52 and the second conduction film 54, but a ruthenium oxide film maybe formed between the first conduction film 52 and the second conduction film 54. That is, the lower electrodes 56 may be formed of the first conduction film 52, a ruthenium oxide film and the second conduction film 54 sequentially laid. In this case, the concentration peak of Pb or Bi diffused form the capacitor dielectric film 62 positions in the interface between the first conduction film 52 and the ruthenium oxide film. In this case as well, the arrival of Pb or Bi contained in the capacitor dielectric film 62 at the interface between the lower electrodes 56 and the oxygen barrier film 50 can be prevented, and the reaction of the oxygen barrier film 50 with the Pb or Bi can be prevented. Thus, the impairment of the adhesion strength of the interface between the lower electrodes 56 and the oxygen barrier film 50 can be prevented, and the release of the lower electrodes 56 from the oxygen barrier film 50 can be prevented.

As detailed above, characteristics of the present invention are summarized as follows.

(Appendix 1) A semiconductor device comprising:

a transistor formed over a semiconductor substrate;

an insulation layer covering the semiconductor substrate and the transistor;

a conductor plug buried in the insulation layer and electrically connected to a source/drain diffused layer of the transistor; and a capacitor formed above the insulation layer and the conductor plug and including a lower electrode formed of a first conduction film, a second conduction film formed of Pt, Pt alloy, Pd or Pd alloy formed over the first conduction film; a capacitor dielectric film of a ferroelectric or a high dielectric formed over the lower electrode; and an upper electrode formed over the capacitor dielectric film;

the capacitor dielectric film containing a first element of Pb or Bi, and a concentration peak of the first element diffused from the capacitor dielectric film in the lower electrode positioned in the interface between the first conduction film and the second conduction film.

(Appendix 2) A semiconductor device according to appendix 1, wherein the first conduction film is a platinum oxide film, a palladium oxide film, a platinum film containing oxygen or a palladium film containing oxygen.

(Appendix 3) A semiconductor device comprising:

a transistor formed over a semiconductor substrate;

an insulation layer covering the semiconductor substrate and the transistor;

a conductor plug buried in the insulation layer and electrically connected to a source/drain diffused layer of the transistor; and a capacitor formed above the insulation layer and the conductor plug, and including a lower electrode formed of a first conduction film, a second conduction film formed over the first conduction film and the third conduction film formed of Pt, Pt alloy, Pd or Pd alloy formed over the second conduction film; a capacitor dielectric film of a ferroelectric or a high dielectric formed over the lower electrode; and an upper electrode formed over the capacitor dielectric film, the capacitor dielectric film containing a first element of Pb or Bi, and a concentration peak of the first element diffused from the capacitor dielectric film in the lower electrode positioned in the interface between the first conduction film and the second conduction film.

(Appendix 4) A semiconductor device according to appendix 3, wherein the first conduction film is an iridium oxide film, a ruthenium oxide film, an iridium film containing oxygen or a ruthenium film containing oxygen, and the second conduction film is an iridium oxide film, a ruthenium oxide film, an iridium film containing oxygen or a ruthenium film containing oxygen.

(Appendix 5) A semiconductor device according to any one of appendixes 1 to 4, further comprising:

a conducting oxygen barrier film formed between the conductor plug and the first conduction film, for preventing the oxidation of the surfaces of the conductor plug, and the oxygen barrier film is formed of TiAlN, TiAlON, TaAlN or TaAlON.

(Appendix 6) A semiconductor device according to appendix 5, further comprising a conducting adhesion layer formed between the insulation layer and the oxygen barrier film, for improving the crystallinity of the oxygen barrier film and improving the adhesion between the oxygen barrier film and the insulation layer.

(Appendix 7) A semiconductor device according to appendix 6, wherein the adhesion layer is formed of TiN, Ti, Ti alloy, Al, Al alloy, Pt, Pt alloy, Ir, Ir alloy, Re, Re alloy, Ru, Ru alloy, Pd, Pd alloy, Os, Os alloy, Rh, Rh alloy, platinum oxide, iridium oxide, ruthenium oxide or palladium oxide.

(Appendix 8) A method for manufacturing a semiconductor device comprising a capacitor including a lower electrode, a capacitor dielectric film of a ferroelectric or a high dielectric formed over the lower electrode and an upper electrode formed over the capacitor dielectric film, comprising the steps of:

forming a transistor over a semiconductor substrate;

forming an insulation layer over the semiconductor substrate and over the transistor;

burying in the insulation layer conductor plug electrically connected to a source/drain diffused layer of the transistor;

forming above the insulation layer and the conductor plug the lower electrode including the first conduction film of platinum oxide or palladium oxide, and the second conduction film Pt, Pt alloy, Pd or Pd alloy formed over the first conduction film;

forming the capacitor dielectric film including Pb or Bi over the lower electrode; and forming the upper electrode over the capacitor dielectric film.

(Appendix 9) A method for manufacturing a semiconductor device according to appendix 8, wherein a film thickness of the first conduction film is 20-100 nm.

(Appendix 10) A method for manufacturing a semiconductor device comprising a capacitor including a lower electrode, a capacitor dielectric film of a ferroelectric or a high dielectric formed over the lower electrode and an upper electrode formed over the capacitor dielectric film, comprising the steps of:

forming a transistor over a semiconductor substrate;

forming an insulation layer over the semiconductor substrate and over the transistor;

burying in the insulation layer conductor plug electrically connected to a source/drain diffused layer of the transistor;

forming above the insulation layer and the conductor plug the lower electrode including a first conduction film of ruthenium oxide or iridium oxide, a second conduction film of ruthenium oxide or iridium oxide formed over the first conduction film, and the third conduction film of Pt, Pt alloy, Pd or Pd alloy formed over the second conduction film;

forming the capacitor dielectric film including Pb or Bi over the lower electrode; and forming the upper electrode over the capacitor dielectric film.

(Appendix 11) A method for manufacturing a semiconductor device according to any one of appendixes 8 to 10, further comprising, after the step of forming a lower electrode and before the step of forming a capacitor dielectric film, the step of making thermal processing in an atmosphere of an inert gas to partially reduce the lower electrode.

(Appendix 12) A method for manufacturing a semiconductor device according to appendix 11, wherein the inter gas is Ar gas, $N_2$ gas or $N_2O$ gas.

(Appendix 13) A method for manufacturing a semiconductor device according to any one of appendixes 8 to 12, wherein in the step of forming a capacitor dielectric film, the capacitor dielectric film is formed by sputtering or sol-gel process.

(Appendix 14) A method for manufacturing a semiconductor device according to any one of appendixes 8 to 12, wherein the step of forming a capacitor dielectric film includes the step of forming the first dielectric film over the lower electrode by sputtering or sol-gel process and the step of forming the second dielectric film over the first dielectric film by metal organic chemical vapor deposition.

(Appendix 15) A method for manufacturing a semiconductor device according to any one of appendixes 8 to 14, further comprising, after the step of burying conductor plug and before the step of forming the first conduction film, the step of forming a conducting oxygen barrier film for preventing the oxidation of the surfaces of the conduction plug, the oxygen barrier film is formed of TiAlN, TiAlON, TaAlN or TaAlON.

(Appendix 16) A method for manufacturing a semiconductor device according to appendix 15, further comprising, after the step of burying conductor plug and before the step of forming an oxygen barrier film, the step of forming a conducting adhesion layer for improving the crystallinity of the oxygen barrier film and improving the adhesion between the oxygen barrier film and the insulation layer.

(Appendix 17) A method for manufacturing a semiconductor device according to appendix 16, further comprising, after the step of burying conductor plug and before the step of forming an adhesion layer, the step of exposing a surface of the insulation layer and a surfaces of the conduction plug to a plasma containing nitrogen.

(Appendix 18) A method for manufacturing a semiconductor device according to appendix 17, wherein the plasma containing nitrogen is $NH_3$ plasma or $N_2$ plasma.

(Appendix 19) A method for manufacturing a semiconductor device according to appendix 15, after the step of burying conductor plug and before the step of forming an oxygen barrier film, the steps of:

forming a base layer; and polishing a surface of the base layer to planarize the surface of the base layer.

(Appendix 20) A method for manufacturing a semiconductor device according to appendix 15, further comprising, after the step of burying conductor plug and before the step of forming an oxygen barrier film, the step of burying a base layer in a cavity formed in a part where the conductor plug has been buried.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide* v. *DIRECTV*, 358 F3d 870, 69 USPQ2d 1865 (Fed. Cir. 2004).

The invention claimed is:

1. A method for manufacturing a semiconductor device comprising a capacitor including a lower electrode, a capacitor dielectric film of a ferroelectric or a high dielectric formed over the lower electrode and an upper electrode formed over the capacitor dielectric film, comprising:

forming a transistor over a semiconductor substrate;

forming an insulation layer over the semiconductor substrate and over the transistor;

burying a conductor plug in the insulation layer so that the conductor plug is electrically coupled to the transistor;

forming over the insulation layer and the conductor plug, the lower electrode including a first conduction film and a second conduction film formed over the first conduction film;

forming the capacitor dielectric film over the lower electrode, the capacitor dielectric film containing a first element of Pb or Bi, and forming the upper electrode over the capacitor dielectric film wherein the lower electrode prevents the diffusion of the first element at an interface between the first conduction film and the second conduction film, the method further comprising, after the burying the conductor plug and before forming the first conduction film, forming a conducting oxygen barrier film for preventing oxidation of the conduction plug, wherein a concentration profile of the first element across the lower electrode along a direction perpendicular to the interface has a concentration peak in the interface between the first conduction film and the second conduction film.

2. The method for manufacturing a semiconductor device according to claim 1, wherein the first conduction film is formed of a platinum oxide or a palladium oxide; and the second conduction film is Pt, a Pt alloy, Pd or a Pd alloy.

3. The method for manufacturing a semiconductor device according to claim 1, wherein the lower electrode further comprises:

forming a third conduction film of Pt, a Pt alloy, Pd or a Pd alloy formed over the second conduction film.

4. The method for manufacturing a semiconductor device according to claim 1, further comprising, after forming the lower electrode and before forming the capacitor dielectric film:

performing thermal processing in an atmosphere of an inert gas to partially reduce the lower electrode.

5. The method for manufacturing a semiconductor device according to claim 1, wherein forming the capacitor dielectric film includes forming a first dielectric film over the lower electrode by sputtering or a sol-gel process and forming a second dielectric film over the first dielectric film by metal organic chemical vapor deposition.

6. The method for manufacturing a semiconductor device according to claim 1, wherein the oxygen barrier film is formed of TiAlN, TiAlON, TaAlN or TaAlON.

7. The method for manufacturing a semiconductor device according to claim 6, further comprising, after burying the conductor plug and before forming the oxygen barrier film:

forming a conducting adhesion layer for improving crystallinity of the oxygen barrier film and for improving adhesion between the oxygen barrier film and the insulation layer.

8. The method for manufacturing a semiconductor device according to claim 7, further comprising, after burying the conductor plug and before forming the adhesion layer:

exposing a surface of the insulation layer and a surface of the conduction plug to a plasma containing nitrogen.

9. The method for manufacturing a semiconductor device according to claim 8, wherein the plasma containing nitrogen is $NH_3$ plasma or $N_2$ plasma.

10. The method for manufacturing a semiconductor device according to claim 6, further comprising, after burying the conductor plug and before forming the oxygen barrier film:

forming a base layer; and polishing a surface of the base layer to planarize the surface of the base layer.

11. The method for manufacturing a semiconductor device according to claim 6, further comprising, after burying the conductor plug and before forming the oxygen barrier film:

burying a base layer in a cavity formed in a part of the conductor plug where the conductor plug has been buried.

* * * * *